(12) United States Patent
Mangold et al.

(10) Patent No.: US 12,071,574 B2
(45) Date of Patent: *Aug. 27, 2024

(54) PHOTOSTABLE CYANO-SUBSTITUTED BORON-DIPYRROMETHENE DYE AS GREEN EMITTER FOR DISPLAY AND ILLUMINATION APPLICATIONS

(71) Applicant: BASF SE, Ludwigshafen am Rhein (DE)

(72) Inventors: Hannah Stephanie Mangold, Ludwigshafen (DE); Martin Koenemann, Ludwigshafen (DE); Maximilian Frank Halbauer, Brandis (DE); Sorin Ivanovici, Ludwigshafen (DE)

(73) Assignee: BASF SE (DE)

( * ) Notice: Subject to any disclaimer, the term of this patent is extended or adjusted under 35 U.S.C. 154(b) by 759 days.

This patent is subject to a terminal disclaimer.

(21) Appl. No.: 17/253,000

(22) PCT Filed: Jun. 18, 2019

(86) PCT No.: PCT/EP2019/065939
§ 371 (c)(1),
(2) Date: Dec. 16, 2020

(87) PCT Pub. No.: WO2019/243286
PCT Pub. Date: Dec. 26, 2019

(65) Prior Publication Data
US 2021/0115282 A1 Apr. 22, 2021

(30) Foreign Application Priority Data
Jun. 22, 2018 (EP) ..................................... 18179281

(51) Int. Cl.
*C09K 11/06* (2006.01)
*C09B 57/00* (2006.01)
(Continued)

(52) U.S. Cl.
CPC .............. *C09K 11/06* (2013.01); *C09B 57/00* (2013.01); *C09K 11/02* (2013.01);
(Continued)

(58) Field of Classification Search
CPC ... H01L 33/502; H01L 2933/009; F21V 9/30; F21V 9/38; G02F 1/133614;
(Continued)

(56) References Cited

U.S. PATENT DOCUMENTS

| | | | |
|---|---|---|---|
| 2,551,731 A | 5/1951 | Drewitt et al. |
| 4,379,934 A | 4/1983 | Graser et al. |
| 4,446,324 A | 5/1984 | Graser |
| 4,845,223 A | 7/1989 | Seybold et al. |
| 5,998,925 A | 12/1999 | Shimizu et al. |

(Continued)

FOREIGN PATENT DOCUMENTS

| | | |
|---|---|---|
| EP | 3 072 887 A1 | 9/2016 |
| TW | 201736369 A | 10/2017 |

(Continued)

OTHER PUBLICATIONS

International Search Report issued Sep. 12, 2019 in PCT/EP2019/065939 filed Jun. 18, 2019.
International Preliminary Report on Patentability issued Mar. 25, 2020 in PCT/EP2019/065939 filed Jun. 18, 2019.

*Primary Examiner* — C Melissa Koslow
(74) *Attorney, Agent, or Firm* — Faegre Drinker Biddle & Reath LLP

(57) ABSTRACT

A color converter may include a polymeric matrix material and at least one organic fluorescent colorant of formula I.a, I.b, and/or I.c

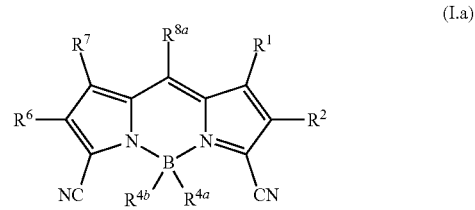
(I.a)

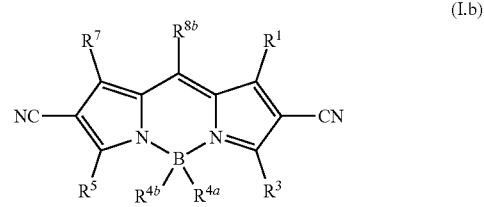

(I.b)

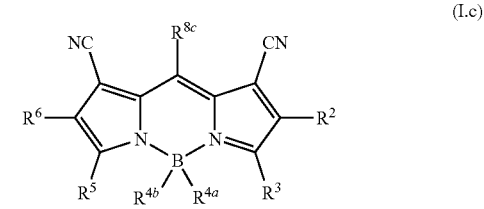

(I.c)

wherein $R^1$, $R^2$, $R^3$, $R^5$, $R^6$, $R^7$ are H, $C_1$-$C_{20}$-alkyl or $C_6$-$C_{14}$-aryl-$C_1$-$C_{10}$-alkylene; $R^{4a}$, $R^{4b}$ are fluorine, chlorine, cyano or $OR^{10}$, $R^{8a}$, $R^{8b}$ are $C_1$-$C_{20}$-alkyl; $R^{8c}$ is $C_1$-$C_{20}$-alkyl, $C_6$-$C_{10}$-aryl or $C_6$-$C_{10}$-aryl-$C_1$-$C_{10}$-alkylene, wherein the aryl moieties being optionally substituted by k substituents $R^9$; k is 1, 2, 3, 4, 5 or 6; $R^9$ is $C_1$-$C_{10}$-alkyl, $C_1$-$C_{10}$-alkoxy, CN, halogen, phenyl or phenoxy; and $R^{10}$ is $C_1$-$C_{10}$-alkyl or hydroxy-$C_1$-$C_{10}$-alkyl. Backlight units for liquid crystal displays; liquid crystal display devices, and a self-emissive display devices may include this color converter and such colorant.

19 Claims, No Drawings

(51) Int. Cl.
*C09K 11/02* (2006.01)
*F21V 9/30* (2018.01)
*F21V 9/38* (2018.01)
*G02F 1/1335* (2006.01)
*H01L 33/50* (2010.01)

(52) U.S. Cl.
CPC ...... *G02F 1/133614* (2021.01); *H01L 33/502* (2013.01); *C09K 2211/1441* (2013.01); *F21V 9/30* (2018.02); *F21V 9/38* (2018.02); *G02F 2202/046* (2013.01); *H01L 2933/0091* (2013.01)

(58) Field of Classification Search
CPC ......... G02F 1/133514; G02F 2202/046; C09D 11/50; C09K 11/06; C09K 11/02; C09K 2211/1441
See application file for complete search history.

(56) References Cited

U.S. PATENT DOCUMENTS

| | | | |
|---|---|---|---|
| 6,245,259 B1 | 6/2001 | Hohn et al. |
| 6,429,583 B1 | 8/2002 | Levinson et al. |
| 6,576,930 B2 | 6/2003 | Reeh et al. |
| 6,669,866 B1 | 12/2003 | Kummer et al. |
| 6,765,237 B1 | 7/2004 | Doxsee et al. |
| 6,809,347 B2 | 10/2004 | Tasch et al. |
| 6,812,500 B2 | 11/2004 | Reeh et al. |
| 6,943,380 B2 | 9/2005 | Ota et al. |
| 7,267,787 B2 | 9/2007 | Dong et al. |
| 7,311,858 B2 | 12/2007 | Wang et al. |
| 2011/0282020 A1 | 11/2011 | Sipos |
| 2014/0125222 A1 | 5/2014 | Hikmet et al. |
| 2014/0336349 A1 | 11/2014 | Sipos et al. |
| 2015/0183955 A1 | 7/2015 | Deno et al. |
| 2016/0223162 A1 | 8/2016 | Shin et al. |
| 2016/0230960 A1 | 8/2016 | Seo et al. |
| 2016/0272884 A1* | 9/2016 | Kim .................. C09K 11/06 |
| 2017/0247610 A1 | 8/2017 | Kim et al. |
| 2017/0267921 A1 | 9/2017 | Shin et al. |
| 2018/0134952 A1 | 5/2018 | Ichihashi et al. |
| 2018/0134953 A1 | 5/2018 | Shin et al. |
| 2018/0208838 A1 | 7/2018 | Sakaino et al. |
| 2018/0274753 A1 | 9/2018 | Sakaino et al. |
| 2019/0023905 A1 | 1/2019 | Koenemann et al. |
| 2019/0062348 A1 | 2/2019 | Sung et al. |
| 2019/0093008 A1 | 3/2019 | Shin et al. |
| 2019/0241801 A1 | 8/2019 | Li et al. |

FOREIGN PATENT DOCUMENTS

| | | |
|---|---|---|
| TW | 201809212 A | 3/2018 |
| WO | WO 2008/101841 A1 | 8/2008 |
| WO | WO 2017/183854 A1 | 10/2017 |

\* cited by examiner

PHOTOSTABLE CYANO-SUBSTITUTED BORON-DIPYRROMETHENE DYE AS GREEN EMITTER FOR DISPLAY AND ILLUMINATION APPLICATIONS

The present invention relates to a color converter comprising a polymeric matrix material and at least one cyano-substituted BODIPY (boron-dipyrromethene) dye, a backlight unit for a liquid crystal display, a self-emissive and non-emissive display and a device comprising the same, the use of said color converter, an ink formulation comprising at least one cyano-substituted BODIPY dye and the use of said ink formulation.

BACKGROUND OF THE INVENTION

Nowadays, white light emitting diodes (WLEDs) have been replacing conventional light sources such as incandescent lamps and fluorescent lamps to an ever increasing extent. WLEDs can be used for many applications, such as general lighting or display applications. White light is typically created by using a blue light emitting diode (LED) in combination with one or more wavelength-conversion materials, commonly known as phosphor material. The phosphor material absorbs light emitted from the blue LED light source and emits light having a wavelength different from the absorbed light. The phosphor material usually adds yellow, red and/or green components, so that the light emitted by the phosphor, in combination with the remaining blue light from the blue LED, results in light which is perceived as white. The phosphor material is usually applied directly on the LED chip, and a configuration in which the phosphor is applied directly and without intervening space to the LED chip is also referred to as "phosphor on chip" configuration.

A typical commercial available, very efficient WLED is composed of a blue light-emitting InGaN LED chip coated with a yellow light-emitting down-converting yttrium aluminum garnet based (YAG-phosphor). The phosphor ordinarily is cerium-doped yttrium aluminum garnet (Ce:YAG) dispersed in a polymeric matrix material. The blue light from the LED excites the Ce:YAG phosphor to emit yellow light, which is subsequently mixed with the blue light to generate white light. In WLEDs having phosphor on chip configuration, the phosphor material used to date has generally been an inorganic one due to its high thermal and radiation stability. WLEDs with phosphor on chip configuration often provide light with high correlated color temperature of greater than 6000 K and poor color rendering index (CRI) of less than 80 due to their green and red spectral deficiencies. Known inorganic red-light emitting phosphors which could improve the red contribution, however, have relatively poor efficiency and often are expensive rare-earth metal compounds.

Another approach for phosphor-based white LEDs are a blue LED and a color converter, which generally comprises a carrier and a polymer layer in a remote phosphor configuration, i.e. the phosphor material is arranged at a certain distance from the LED chip. The polymer layer comprises one or more organic phosphors (hereinafter referred to as organic fluorescent dyes). The color converter often comprises a mixture of a yellow-light emitting organic fluorescent dye and a red light-emitting organic fluorescent dye. Efficient organic yellow-light emitting fluorescent dyes and organic red-light emitting fluorescent dyes are known in the art.

Still another approach for phosphor-based white LEDs has been a WLED consisting of a blue LED coated with a yellow phosphor in a phosphor on chip configuration (arrangement) and coupled with a color converter in a remote phosphor configuration (arrangement). The color converter typically comprises at least one a red light-emitting organic fluorescent dye.

Currently, organic fluorescent dyes are being considered for replacing inorganic phosphors in LED-based light sources where white light output is desired. Their use offers various advantages. Firstly, organic fluorescent dyes are distinguished by a high mass-specific absorption, which means that considerably less material is required for efficient radiation conversion than in the case of inorganic phosphors. Secondly, they allow to tailor the hue of the light and thus allow to create a warm-white LED light. Thirdly, they do not require any materials comprising rare earths, which have to be mined and provided in a costly and inconvenient manner and are available only to a limited degree. Furthermore, they usually are solution processible.

For the purpose of general illumination, the choice of the wavelength conversion material is critical for achieving WLEDs with high color rendering properties. Good color rendering requires emission over a large part of the visible spectrum range from 420 to 780 nm. The spectrum of the majority of the commercially available WLEDs, however, is rich in a blue component (blue light emission from the LED) and a yellow component (yellow light emission from Ce:YAG) but has green and red deficiencies. Thus, there is an ongoing need for green-emitting organic fluorescent dyes with high photostability emitting at longer emission wavelengths than the blue LED emission wavelengths but at shorter wavelengths than the yellow phosphor material emission wavelengths, in particular high photostability in combination with high fluorescence quantum yield.

Nowadays, there is also a great need for organic phosphors for color converters, which can combine illumination with data transmission. A new technology, which utilizes white LEDs for both illumination and data transmission, is known as visible-light communication (VLC). VLC is a rapid growing technological field that aims to implement fast and safe wireless communication to replace or complement existing wireless technologies. Organic phosphor that can be used inter alia as color converters in remote phosphor LEDs offer many potential advantages for VLC due to their visible band gaps, short radiative lifetime, and high fluorescence quantum yield. LiFi (Light Fidelity) is the term established for the transmission of data through illumination using LED lighting that varies in its intensity for high speed wireless communication. Together with the widespread use of LED lighting in offices, streetlights and homes, LiFi is an added benefit to the existing lighting infrastructure. Thus, for the purpose of high rates of data transmission in the range of a few nanoseconds and preferably even lower, there is an ongoing need for green-light emitting fluorescent dyes with high photostability and short fluorescence lifetimes, in particular in combination with a high fluorescence quantum yield.

Color converters comprising green and red organic fluorescent dyes are also often used in modern display devices. Nowadays, the trend of display devices is towards larger color gamut which allows more natural, vivid and lifelike colors. In particular, a full color display needs saturated red, green, and blue pixels. The size of the color gamut is strongly dependent on the choice of the organic fluorescent dyes used in the color converter. Especially the organic fluorescent dye should have a narrow emission spectrum, i.e.

narrow full width at half maximum (FWHM). Prior art organic fluorescent dyes with narrow-band emission in the green spectral region (490-560 nm) often lack longterm photostability under the irradiation conditions. Thus, there is an ongoing need for fluorescent dyes with narrow-band emission in the green spectral region which have high longterm photostability. Preferably the dyes should be efficiently excited by blue light (400 to less than 490 nm) and should have a high fluorescence quantum yield.

As is well known, boron-dipyrromethene compounds (BODIPYs) often show narrow absorption and emission bandwidths at visible to near infrared wavelengths, high fluorescence quantum yield, short fluorescence lifetime and good thermal stability. It is also well known that nitro-substituted BODIPYs are usually characterized by low fluorescence quantum yield or even show no fluorescence.

M. T. Sajjad et al. describe in Adv. Optical Mater. 2015, 3, 536-540 fluorescent red-emitting BODIPY-oligofluorene star-shaped molecules as a frequency converter material for VLC.

Naoya Ieda, Yuji Hotta, Naoki Miyata, Kazunori Kimura and Hidehiko Nakagawa describe in J. Am. Chem. Soc 2014, 136, 7085-7091, a blue-light controllable nitric oxide releaser of the formula NOBL-1. The compound of formula (A) was used as reference compound.

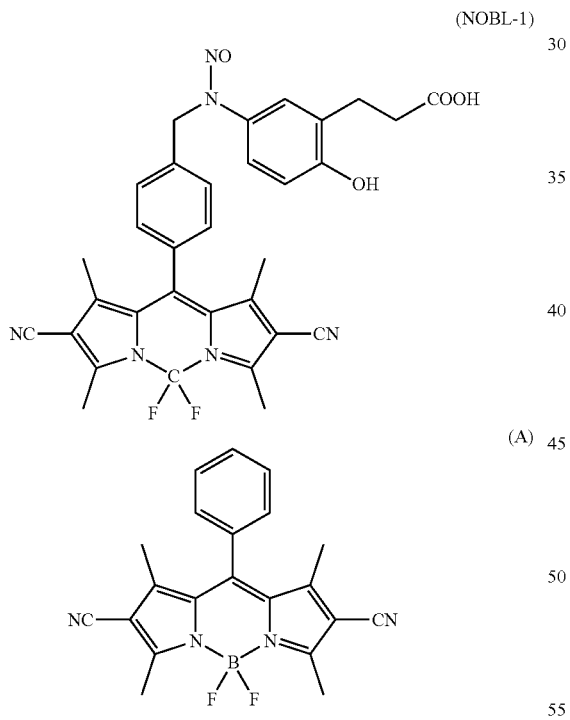

WO 2014/025435 describes organic photosensitive optoelectronic devices such as solar cells, photodectors, photosensors and photoconductors comprising a 4,4-difluoro-4-bora-3a,4a-diaza-s-indacene (BODIPY) compound which may carry cyano groups.

US 2014/0125222 describes a light-emitting device comprising a LED and a wavelength converting element which may comprise any organic phosphor compound as for example perylene derived compounds, difluoride boron dipyrromethene derivates, fluorene derivatives, coumarin dyes etc.

WO 2017/155297, US 2016/0223162, US 2016/0230960, US 2017/0247610, US 2017/267921, US 2018/0134952, US 2018/0134953, US 2018/0274753, US 2018/0208838 and US 2019/093008 describe a color converter comprising a BODIPY dye, which may be inter alia a cyano-substituted BODIPY dye, in a resin matrix, a backlight unit comprising the same and its use in a display device.

US 2016/0272884 describes a compensation film including organic dots for use in displays. The organic dot may be a perylene compound and/or a modified BODIPY compound such as cyano-substituted BODIPY compound.

US 2019/0062348 relates to red fluorescent BODIPY compounds which may carry cyano groups at the 2-, 6-positions of the carbon core skeleton and their use in a color conversion film. The color converter comprises these compounds dispersed into a resin matrix.

WO 2018/021866 describes a color converter comprising a green fluorescent BODIPY compound in a resin matrix, a backlight unit and display device containing the same. The BODIPY compound of WO 2018/021866 can be monosubstituted by cyano at 2-position or 6-position. For reference purposes a color converter is described comprising a BODIPY compound of the formula A depicted below.

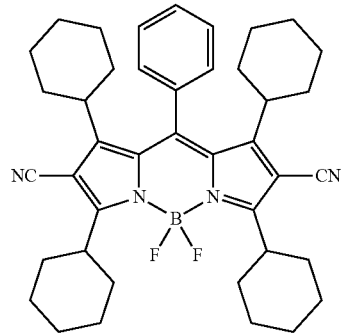

WO 2018/068299 describe a light emitting device comprising a blue backlight unit and a color conversion array comprising a green color conversion layer and a red color conversion layer, comprising surface-modified particles that emit green or red light respectively, the surface-modified particles comprising sol-gel nanoparticles and a plurality of lumiphores such as BODIPY dyes attached to the surface of the sol-gel nanoparticles.

The organic green fluorescent BODIPY dyes of the prior art often suffer from insufficient photostability. However, for the application in lighting devices and displays, beside high fluorescence quantum yield and small FWHM, high photostability under longterm irradiation is needed.

Accordingly, it is an object of the present invention to provide organic green fluorescent BODIPY dyes with high photostability. The green fluorescent BODIPY dye should be excited by the light emitted from the light source and should show an efficient emission with a narrow FWHM in the spectral range from 490 to 560 nm which enables high color saturation of the green primary color necessary for display applications.

Preferably, the organic fluorescent dye should also have one or more of the following characteristics:
short fluorescent lifetimes in the order of a few nanoseconds;
high heat stability under blue light and/or white light irradiation conditions;

high chemical stability with respect to moisture and oxygen;
good processability, preferably good solution processability.

These and further objectives are achieved by the use of the compounds of formulae (I.a), (I.b), (I.c) and mixtures thereof defined below.

SUMMARY OF THE INVENTION

In a first aspect the present invention relates to a color converter comprising a polymeric matrix material and at least one organic fluorescent dye selected from a compound of formulae (I.a), (I.b), (I.c) or mixtures thereof

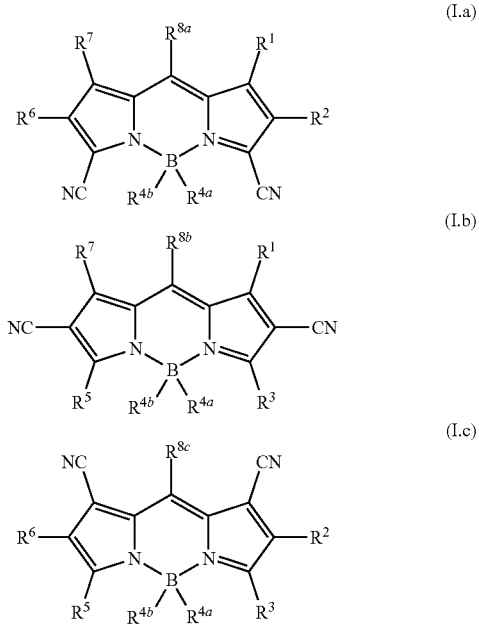

wherein
$R^1$, $R^2$, $R^3$, $R^5$, $R^6$ and $R^7$, if present, in formulae (I.a), (I.b) and (I.c) independently of each other are selected from hydrogen, $C_1$-$C_{20}$-alkyl or $C_6$-$C_{14}$-aryl-$C_1$-$C_{10}$-alkylene, wherein the aryl moiety in $C_6$-$C_{14}$-aryl-$C_1$-$C_{10}$-alkylene is unsubstituted or substituted by k identical or different substituents $R^9$;
$R^{4a}$, $R^{4b}$, in formulae (I.a), (I.b) and (I.c), independently of each other, are selected from fluorine, chlorine, cyano or $OR^{10}$,
$R^{8a}$ in formula (I.a) is $C_1$-$C_{20}$-alkyl;
$R^{8b}$ in formula (I.b) is $C_1$-$C_{20}$-alkyl; and
$R^{8c}$ in formula (I.c) is $C_1$-$C_{20}$-alkyl, $C_6$-$C_{10}$-aryl or $C_6$-$C_{10}$-aryl-$C_1$-$C_{10}$-alkylene, wherein the aryl moieties in the two aforementioned radicals are unsubstituted or substituted by k identical or different substituents $R^9$;
wherein
k is 1, 2, 3, 4, 5 or 6;
$R^9$ is $C_1$-$C_{10}$-alkyl, $C_1$-$C_{10}$-alkoxy, CN, halogen, phenyl or phenoxy; and
$R^{10}$ is $C_1$-$C_{10}$-alkyl or hydroxy-$C_1$-$C_{10}$-alkyl.

The present inventors found that the two cyano groups attached at the BODIPY core equip the compounds of formulae (I.a), (I.b) and (I.c) with a high longterm photostability. The use of compounds of formulae (I.a), (I.b), (I.c) or mixtures thereof according to the invention is advantageous in view of high photostability, high fluorescence quantum yield, emission spectrum in the wavelength range from 490-560 nm with a narrow FWHM of less than 60 nm. Further advantages are that the compound of formulae (I.a), (I.b) and (I.c) can be excited with the light of the light-emitting element (light source), typically a blue LED, a white LED, a blue organic LED or a white organic LED. A further advantage is that the compounds of formulae (I.a), (I.b) and (I.c) are solution processable.

In a further aspect, the present invention relates to the use of these color converters. The color converters of the present invention are particularly useful for display applications. The color converters of the present invention are also particularly useful for conversion of light generated by a blue LED with a center wavelength of emission between 400 nm and 480 nm to provide white light, for conversion of light generated by a white LED having a correlated color temperature between 3 000 K and 20 000 K to provide white light having a lower correlated color temperature, or in a transmitter for transmitting data and for emitting electromagnetic radiation in the visible spectral range.

In a further aspect, the present invention also relates to a an illumination device comprising at least one color converter as defined above and at least one light source, wherein the at least one color converter and the at least one light source are in a remote phosphor arrangement.

In a further aspect, the present invention also relates to a backlight unit for liquid crystal displays, comprising (i) at least one of light source, preferably a white LED having a correlated color temperature between 6000 and 12000 K or a blue light emitting diode with a center wavelength of emission from 400 nm to 480 nm and (ii) at least one color converter as defined above, wherein the at least one color converter and the at least one light source are in a remote phosphor arrangement.

In a further aspect, the present invention also relates to a liquid crystal display device comprising (i) a liquid crystal panel comprising a thin film transistor (TFT) array, a liquid crystal layer, and a color filter array comprising red, green and blue color filters; (ii) at least one of light source; and at least one color converter as defined above.

In a further aspect, the present invention also relates to a self-emissive display device comprising (i) at least one light source selected from a white organic light emitting diode, a blue organic light emitting diode, a mini-LED or a micro-LED; (ii) at least one color converter as defined above; and (iii) optional a color filter array comprising red, green and blue color filters.

In a further aspect, the present invention also relates to a television device comprising the display device as defined above.

In a still further aspect, the present invention also relates to an ink formulation comprising (i) at least one organic fluorescent dye selected from a compound of formulae (I.a), (I.b), (I.c) or mixtures thereof as defined above; (ii) at least one photo-curable or thermally curable binder; (iii) optionally at least one component selected from a photoinitiator, a photoacid-generator, a reactive monomer, a thermal radical initiator or mixtures thereof; and (iv) optionally at least one additive selected from an organic fluorescent colorant different from a compound of formulae (I.a), (I.b), (I.c), an organic solvent, a dispersant, a surfactant, a light scattering agent, or a mixture thereof.

In a still further aspect, the present invention also relates to the use of said ink formulation in the manufacture of a liquid crystal display device or a self-emissive device.

DESCRIPTION OF THE INVENTION

The term "conversion material" refers to a material that is excited by a photon of a first wavelength and emits photons of a second (longer), different wavelength.

In the context of the present invention, the term "blue light" is light having a wavelength in the range from 400 to less than 490 nm.

In the context of the present invention, the term "green light" is light having a wavelength in the range from 490 to 560 nm.

In the context of the present invention, the term "yellow light" is light having a wavelength in the range from more than 560 to less than 600 nm.

In the context of the present invention, the term "red light" refers to light having a wavelength in the range from 600 to 780 nm, preferably 610 to 660 nm.

In the context of the present invention, the term "green light-emitting organic fluorescent dye" may in embodiments also relate to a plurality of green light-emitting organic fluorescent dyes.

In the context of the present invention, the term "yellow light-emitting organic fluorescent dye" may in embodiments also relate to a plurality of yellow light-emitting organic fluorescent dyes.

In the context of the present invention, the term "red light-emitting organic fluorescent dye" may in embodiments also relate to a plurality of red light-emitting organic fluorescent dyes.

A quantum dot is a nanocrystal made of semiconductor materials that is small enough to exhibit quantum mechanical properties. Quantum dots are showing narrow emission spectra, i.e. with very small FWHM (full width at half maximum). The color output of the dots can be tuned by controlling the size of the crystals. With a smaller size in quantum dots, the quantum dots emit light of a shorter wavelength.

In the context of the present invention, the terms "polymeric matrix material" and the term "polymeric matrix" refer to a polymer in which the conversion material, i.e. the at least one organic fluorescent dye according to the invention is dispersed or molecularly dissolved.

In the context of the present invention the term "solution processable" means capable of being dissolved, dispersed, or transported in and/or deposited from a liquid medium, either in solution or suspension form.

In the context of the present invention, the terms "color converter" and "frequency converter", which are also referred to simply as "converter", are understood to mean all physical devices capable of absorbing light of particular wavelengths and converting it to light of a second wavelength. Color converters are, for example, part of lighting devices, especially those lighting devices which utilize UV light or LEDs or OLEDs as a light source, of backlight units, of self-emissive displays, or of fluorescence conversion solar cells.

In the context of the present invention, the term "center wavelength" of a given spectral distribution $F(\lambda)$ is defined as the following average: $\lambda_c = \int \lambda \cdot F(\lambda) \, d\lambda / \int F(\lambda) \, d\lambda$.

In the context of the present invention, the term "full width at half maximum (FWHM)" means the width of a line shape at half of its maximum amplitude.

In the context of the present invention, the term "fluorescence quantum yield (QY)" is defined as ratio of the number of photons emitted to the number of photons absorbed.

There are two kinds of light emitting diodes. One is based on inorganic materials (LED), while the other one is based on organic materials (OLED). Accordingly, the term "LED" as used herein, refers to an inorganic light-emitting diode, whereas the term "organic LED (OLED)" as used herein, refers to an organic light-emitting diode. Both kinds of light emitting diodes essentially work on similar principles wherein positive and negative charge carriers are injected into a semiconducting material and light emission occurs when the charge carriers recombine in the light emission zone of the device stack. OLEDs have emissive materials that emit light either from singlet states (fluorescence) or from triplet states (phosphorescence).

In the context of the present invention, a "blue LED" is understood to mean an LED which emits light in the blue range of the electromagnetic spectrum with a center wavelength of emission in the range of 400 to 480 nm, preferably 420 to 480, more preferably 440 to 470 nm, most preferably at 440 to 460 nm. Suitable semiconductor materials are silicon carbide, zinc selenide and nitrides such as aluminum nitride (AlN), gallium nitride (GaN), indium nitride (InN) and indium gallium nitride (InGaN). LEDs typically have a narrow wavelength distribution that is tightly centered about their peak wavelength. Standard InGaN-based blue LEDs are fabricated on a sapphire substrate and peak emission wavelength is usually centered at 445 to 455 nm.

In the context of the present invention, a "micro-LED" is understood to mean a LED that primarily emits blue light. It is formed of a semiconductor material such as gallium nitride (GaN) or zinc selenide (ZnSe). The micro-LED (µ-LED) usually has a maximum width of 1 to 100 µm.

In the context of the present invention, a "mini-LED" is understood to mean a LED that primarily emits blue light. The chip size is usually between 100 and 200 µm.

In the context of the present invention, a "white LED" (also referred to as WLED) is understood to mean an LED that emits light which is perceived as white by a human eye. Examples are multi-LEDs (also called RGB LED system) consisting of a red, a green and a blue LED whose light emissions are mixed to form white light. Further examples are blue LEDs whose emitted light passes through phosphor material. Preferred are blue LEDs coated with an inorganic phosphor material, especially a yellow phosphor material such as YAG or red, green, or any other color or combination of phosphors, in particular a yellow phosphor. Further examples are also blue LEDs coated with an inorganic phosphor material, especially a yellow phosphor such as YAG or red, green or any other color or combination of phosphors, and with an additional remote phosphor layer comprising at least one organic fluorescent dye.

In the context of the present invention, a "white organic light emitting diode" (also referred to as white OLED or WOLED) is understood to mean an organic light emitting diode that emits light which is perceived as white by a human eye.

In the context of the present invention, the term "white light" relates to light having usually a correlated color temperature (CCT) between 2 000 to 20 000 K, especially 2 500 to 20 000 K. A commercially available white LED often has a correlated color temperature of 3 000 K or above, for example in the range of 3 000 to 20 000 K or 4 000 to 20 000 K.

In the context of the present invention, an electromagnetic radiation comprising the visible spectral range from 420 to 780 nm is also designated as visible light.

LEDs are not blackbody or incandescent sources and thus have a correlated color temperature (CCT). CCT is the temperature of a blackbody radiator that is perceived by the human eye to emit the same white light as the LED. Thus, CCT describes the color appearance of white light emitted from electric light sources and is measured in Kelvin. It is determined according to the CIE international standard. White light having a high CCT contains relatively higher intensity in the short wavelength region (blue) and relatively lower intensity in the longer wavelength region (red) compared to white light with low CCT. Accordingly, higher CCTs generally indicate white light having a more significant blue component or a cool tone while lower CCTs generally indicate light having a more significant red tint or a warm tone. White light having a CCT in the range from 6 000-20 000 K has a relatively high blue component. The CCT of a white phosphor-converted LED is determined by the phosphor(s) used.

Color rendering (CRI) is a measure how a light source makes the color of an object appear to the human eye and how well subtle variations in color shade are revealed. In general, CRI is considered to be a more important lighting quality than color temperature. According to CIE 17.4, International Lighting Vocabulary, color rendering (CRI) is defined as "the effect of an illuminant on the color appearance of objects by conscious or unconscious comparison with the color appearance under a reference illuminant". The average or general color rendering index Ra is calculated from the differences in the chromaticities of the eight pastel CIE standard (reference) color samples R1 to R8 (CIE 13.3-1995).

In the context of the present invention, the term "luminous efficacy" quantifies the efficacy of an output spectrum at generating lumens of light relative to input power measured in Watts. The unit of luminous efficacy is lumens/watt (lm/W).

In the context of the present invention, the term "color gamut" defines the range of colors that a display can produce. A common method to express the color gamut of displays is the xy chromaticity diagram of the XYZ color system established by the International Commission on Illumination (CIE). The color gamut is defined by the triangle on the xy chromaticity diagram. Additionally or alternatively, the u'v' diagram established by the International Commission on Illumination is used to evaluate the color gamut.

In the context of the present invention, the term "RGB color space" is defined by the chromaticities of the three primary colors red, green and blue, where red, green and blue light are added together to produce a color.

As used in this specification and the claims, the singular form "a", "an" and "the" includes plural references unless the content clearly dictates otherwise.

The term "at least" is meant to define one or more than one, for example one, two, three or four, preferably one, two or three, especially one or two.

The term "optionally substituted" means, that the radical to which it refers is either unsubstituted or substituted.

The term "essentially" in the context of the present invention encompasses the words "completely", "wholly" and "all". The word encompasses a proportion of 90% or more, such as 95% or more, especially 99% or 100%.

The term "(meth)acrylate" in the context of the present application is meant to refer to the acrylate as well as to the corresponding methacrylate.

The definitions of the variables specified in the above formulae use collective terms which are generally representative of the respective substituents. The definition $C_n$-$C_m$ gives the number of carbon atoms possible in each case in the respective substituent or substituent moiety.

The term "BODIPY" refers to a compound having a boron-dipyrromethene core (also referred to as 4-bora-3a, 4a-diaza-s-indacene core). The numbering of the BODIPY core as used herein is depicted below.

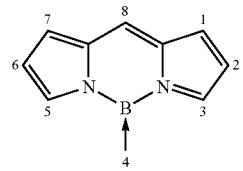

The expression "halogen" denotes in each case fluorine, bromine, chlorine or iodine, particularly chlorine, bromide or iodine.

In the context of the invention, the expression "in each case unsubstituted or substituted alkyl, cycloalkyl and aryl" represents unsubstituted or substituted alkyl, unsubstituted or substituted cycloalkyl and unsubstituted or substituted aryl.

Likewise, in the context of the invention, the expression "in each case unsubstituted or substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkyloxy, $C_6$-$C_{24}$-aryl and $C_6$-$C_{24}$-aryloxy" represents unsubstituted or substituted $C_1$-$C_{30}$-alkyl, unsubstituted or substituted polyalkyleneoxy, unsubstituted or substituted $C_1$-$C_{30}$-alkoxy, unsubstituted or substituted $C_1$-$C_{30}$-alkylthio, unsubstituted or substituted $C_3$-$C_{20}$-cycloalkyl, unsubstituted or substituted $C_3$-$C_{20}$-cycloalkyloxy, unsubstituted or substituted $C_6$-$C_{24}$-aryl and unsubstituted or substituted $C_6$-$C_{24}$-aryloxy.

For the purpose of the present invention, the term "aliphatic radical" refers to an acyclic saturated or unsaturated, straight-chain or branched hydrocarbon radical. Usually the aliphatic radical has 1 to 100 carbon atoms and 2 to 100 carbon atoms (in case of unsaturated, straight-chain or branched hydrocarbon radicals). Examples for an aliphatic radical are alkyl, alkenyl and alkynyl.

For the purpose of the present invention, the term "cycloaliphatic radical" refers to a cyclic, non-aromatic saturated or unsaturated hydrocarbon radical having usually 3 to 20 ring carbon atoms. Examples are cycloalkanes, cycloalkenes, and cycloalkynes. The cycloaliphatic radical may also comprise heteroatoms or heteroatom groups selected from N, O, S or $SO_2$.

The term "alkyl" as used herein and in the alkyl moieties of alkoxy, alkylthio, alkylsulfinyl, alkylsulfonyl, alkylamino, dialkylamino, alkylcarbonyl, alkoxycarbonyl and the like refers to saturated straight-chain or branched hydrocarbon radicals having usually 1 to 100 ("$C_1$-$C_{100}$-alkyl"), 1 to 30 ("$C_1$-$C_{30}$-alkyl"), 1 to 18 ("$C_1$-$C_{18}$-alkyl"), 1 to 10 ("$C_1$-$C_{10}$-alkyl"), 1 to 8 ("$C_1$-$C_8$-alkyl") or 1 to 6 ("$C_1$-$C_6$-alkyl") or 1 to 4 ("$C_1$-$C_4$-alkyl") carbon atoms. Alkyl is preferably $C_1$-$C_{30}$-alkyl, more preferably $C_1$-$C_{20}$-alkyl. Examples of $C_1$-$C_4$-alkyl are methyl, ethyl, n-propyl, isopropyl, n-butyl, 2-butyl (=sec-butyl), isobutyl and tert-butyl. Examples for $C_1$-$C_6$-alkyl are, apart those mentioned for $C_1$-$C_4$-alkyl, n-pentyl, 1-methylbutyl, 2-methylbutyl, 3-methylbutyl, 2,2-dimethylpropyl, 1-ethylpropyl, n-hexyl, 1,1-dimethylpropyl, 1,2-dimethylpropyl, 1-methylpentyl, 2-methylpentyl, 3-methylpentyl, 4-methylpentyl, 1,1-dimethylbutyl, 1,2-dimethylbutyl, 1,3-dimethylbutyl, 2,2-dimethylbutyl, 2,3-dimethylbutyl, 3,3-dimethylbutyl, 1-ethylbutyl, 2-ethylbutyl, 1,1,2-trimethylpropyl, 1,2,2-trimethylpropyl, 1-ethyl-1-methylpropyl and 1-ethyl-2-methylpropyl. Examples for $C_1$-$C_{10}$-alkyl are, apart those mentioned for $C_1$-$C_6$-alkyl, n-heptyl, 1-methylhexyl, 2-methylhexyl, 3-methylhexyl, 4-methylhexyl, 5-methylhexyl, 1-ethylpentyl, 2-ethylpentyl, 3-ethylpentyl, n-octyl, 1-methyloctyl, 2-methylheptyl, 1-ethylhexyl, 2-ethylhexyl, 1,2-dimethylhexyl, 1-propylpentyl, 2-propylpentyl, nonyl, decyl, 2-propylheptyl and 3-propylheptyl.

Substituted alkyl groups, depending on the length of the alkyl chain, have one or more (e.g. 1, 2, 3, 4, 5 or more than 5) substituents. These are preferably each independently of each other selected from unsubstituted or substituted cycloalkyl, unsubstituted or substituted cycloalkyloxy, unsubstituted or substituted cycloalkylthio, unsubstituted or substituted heterocycloalkyl, unsubstituted or substituted aryl, unsubstituted or substituted aryloxy, unsubstituted or substituted arylthio, unsubstituted or substituted hetaryl, fluorine, chlorine, bromine, iodine, hydroxyl, mercapto, unsubstituted or substituted alkoxy, unsubstituted or substituted polyalkyleneoxy, unsubstituted or substituted alkylthio, unsubstituted or substituted cycloalkyloxy, unsubstituted or substituted aryloxy, unsubstituted or substituted arylthio, cyano, nitro, unsubstituted or substituted alkylcarbonyloxy, formyl, acyl, COOH, carboxylate, —$COOR^{Ar1}$, $NE^1E^2$, —$NR^{Ar1}COR^{Ar2}$, —$CONR^{Ar1}R^{Ar2}$, —$SO_2NR^{Ar1}R^{Ar2}$ and —$SO_3R^{Ar2}$, where $E^1$ and $E^2$ are hydrogen, unsubstituted or substituted $C_1$-$C_{18}$-alkyl, unsubstituted or substituted $C_2$-$C_{18}$-alkenyl, unsubstituted or substituted $C_2$-$C_1$-alkynyl, unsubstituted or substituted $C_3$-$C_{20}$-cycloalkyl or unsubstituted or substituted $C_6$-$C_{10}$-aryl, and $R^{Ar1}$ and $R^{Ar2}$, independently of each other, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl. In particular, substituted alkyl groups have one or more, for example 1, 2 or 3 substituent(s) selected from unsubstituted or substituted cycloalkyl, unsubstituted or substituted aryl, fluorine, chlorine, bromine, hydroxyl, alkoxy, polyalkyleneoxy, mercapto, alkylthio, cyano, nitro, $NE^1E^2$, —$NR^{Ar1}COR^{Ar2}$, —$CONR^{Ar1}R^{Ar2}$, —$SO_2NR^{Ar1}R^{Ar2}$, and —$SO_3R^{Ar2}$, where $E^1$, $E^2$, independently of each other, are hydrogen, unsubstituted or substituted $C_1$-$C_{18}$-alkyl, unsubstituted or substituted $C_2$-$C_1$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl, and $R^{Ar1}$ and $R^{Ar2}$, each independently of each, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl.

The term "alkylene" (or alkanediyl) as used herein in each case denotes an alkyl radical as defined above, wherein one hydrogen atom at any position of the carbon backbone is replaced by one further binding site, thus forming a bivalent moiety Special embodiments of substituted alkyl groups are alkyl groups, wherein one hydrogen atom has been replaced by an aryl radical ("aralkyl", also referred to hereinafter as arylalkyl or arylalkylene), in particular a phenyl radical. Thus, arylalkyl refers to aryl bound to the remainder of the molecule via an alkyl group. The aryl radical in turn may be unsubstituted or substituted, suitable substituents are the substituents mentioned below for aryl. Particular examples of arylalkyl include phenyl-$C_1$-$C_4$-alkyl such as benzyl, 1-phenylethyl, 2-phenylethyl (phenethyl), 1-phenylpropyl, 2-phenylpropyl, 3-phenyl-1-propyl, 2-phenyl-2-propyl and napthyl-$C_1$-$C_4$-alkyl such as 1-naphthylmethyl, 1-naphthylethyl, 2-naphthylmethyl, 2-naphthylethyl.

The term "hydroxy-$C_1$-$C_{10}$-alkyl" refers to alkyl groups, wherein one or two hydrogen atoms have been replaced by a hydroxy (OH) group. Preferably, hydroxy-$C_1$-$C_{10}$-alkyl is a monohydroxy-$C_4$-$C_{10}$-alkyl group.

Further special embodiments of substituted alkyl groups are alkyl groups where some or all of the hydrogen atoms in these groups may be replaced by halogen atom(s) as mentioned above, for example $C_1$-$C_4$-haloalkyl.

The term "alkoxy" as used herein refers in each case to a straight-chain or branched alkyl group bound through an oxygen atom, that is, an "alkoxy" group may be represented as —O-alkyl where alkyl is as defined above. $C_1$-$C_2$-Alkoxy is methoxy or ethoxy. $C_1$-$C_4$-Alkoxy is additionally, for example, n-propoxy, 1-methylethoxy (isopropoxy), butoxy, 1-methylpropoxy (sec-butoxy), 2-methylpropoxy (isobutoxy) or 1,1-dimethylethoxy (tert-butoxy). $C_1$-$C_6$-Alkoxy is additionally, for example, pentoxy, 1-methylbutoxy, 2-methylbutoxy, 3-methylbutoxy, 1,1-dimethylpropoxy, 1,2-dimethylpropoxy, 2,2-dimethylpropoxy, 1-ethylpropoxy, hexoxy, 1-methylpentoxy, 2-methylpentoxy, 3-methylpentoxy, 4-methylpentoxy, 1,1-dimethylbutoxy, 1,2-dimethylbutoxy, 1,3-dimethylbutoxy, 2,2-dimethylbutoxy, 2,3-dimethylbutoxy, 3,3-dimethylbutoxy, 1-ethylbutoxy, 2-ethylbutoxy, 1,1,2-trimethylpropoxy, 1,2,2-trimethylpropoxy, 1-ethyl-1-methylpropoxy or 1-ethyl-2-methylpropoxy. $C_1$-$C_8$-Alkoxy is additionally, for example, heptyloxy, octyloxy, 2-ethylhexyloxy and positional isomers thereof.

Accordingly, the term "unsubstituted or substituted alkoxy" as used herein refers to —O-alkyl where alkyl is unsubstituted or substituted as defined above.

The term "polyoxyalkylene" as used herein refers to an alkyl group bound through an oxygen atom to the remainder of the molecule, where alkyl is interrupted by one or more non-adjacent oxygen atoms and alkyl is as defined above.

Accordingly, the term "unsubstituted or substituted polyalkyleneoxy" as used herein refers to —O-alkyl where alkyl is interrupted by one or more non-adjacent oxygen atoms and alkyl is unsubstituted or substituted as defined above.

The term "alkylthio" as used herein refers to an alkyl group bound through a sulfur atom, that is, an "alkylthio" group may be represented as —S-alkyl where alkyl is as defined above. $C_1$-$C_2$-Alkylthio is methylthio or ethylthio. $C_1$-$C_4$-Alkylthio is, for example, methylthio, ethylthio, n-propylthio, 1-methylethylthio (isopropylthio), butylthio, 1-methylpropylthio (sec-butylthio), 2-methylpropylthio (isobutylthio) or 1,1-dimethylethylthio (tert-butylthio).

Accordingly, the term "unsubstituted or substituted alkylthio" as used herein refers to —S-alkyl where alkyl is unsubstituted or substituted as defined above.

The term "alkenyl" as used herein refers to straight-chain or branched hydrocarbon groups having usually 2 to 100 ("$C_2$-$C_{100}$-alkenyl"), 2 to 18 ("$C_2$-$C_{18}$-alkenyl"), 2 to 10 ("$C_2$-$C_{10}$-alkenyl"), 2 to 8 ("$C_2$-$C_8$-alkenyl"), or 2 to 6 ("$C_2$-$C_6$-alkenyl") carbon atoms and one or more, e.g. 2 or 3, double bonds in any position. Substituted alkenyl groups, depending on the length of the alkenyl chain, have one or more (e.g. 1, 2, 3, 4, 5 or more than 5) substituents. These are preferably each independently of each other selected from unsubstituted or substituted cycloalkyl, unsubstituted or substituted cycloalkyloxy, unsubstituted or substituted cycloalkylthio, unsubstituted or substituted heterocycloalkyl, unsubstituted or substituted aryl, unsubstituted or substituted aryloxy, unsubstituted or substituted arylthio, unsubstituted or substituted hetaryl, fluorine, chlorine, bromine, iodine, hydroxyl, mercapto, unsubstituted or substituted alkoxy, unsubstituted or substituted polyalkyleneoxy, unsubstituted or substituted alkylthio, unsubstituted or substituted cycloalkyloxy, unsubstituted or substituted aryloxy, unsubstituted or substituted arylthio, cyano, nitro, unsubstituted or substituted alkylcarbonyloxy, formyl, acyl, COOH, carboxylate, —COOR$^{Ar1}$, NE$^1$E$^2$, —NR$^{Ar1}$COR$^{Ar2}$, —CONR$^{Ar1}$R$^{Ar2}$, —SO$_2$NR$^{Ar1}$R$^{Ar2}$ and —SO$_3$R$^{Ar2}$, where E$^1$ and E$^2$ are hydrogen, unsubstituted or substituted C$_1$-C$_{18}$-alkyl, unsubstituted or substituted C$_2$-C$_{18}$-alkenyl, unsubstituted or substituted C$_2$-C$_{18}$-alkynyl, unsubstituted or substituted C$_3$-C$_{20}$-cycloalkyl or unsubstituted or substituted C$_6$-C$_{10}$-aryl, and R$^{Ar1}$ and R$^{Ar2}$, independently of each other, are hydrogen, unsubstituted or substituted C$_1$-C$_{18}$-alkyl, unsubstituted or substituted C$_3$-C$_{20}$-cycloalkyl, unsubstituted or substituted heterocyclyl, unsubstituted or substituted C$_6$-C$_{20}$-aryl or unsubstituted or substituted heteroaryl. In particular, substituted alkenyl groups have one or more, for example 1, 2 or 3 substituent(s) selected from unsubstituted or substituted cycloalkyl, unsubstituted or substituted aryl, fluorine, chlorine, bromine, hydroxyl, alkoxy, polyalkyleneoxy, mercapto, alkylthio, cyano, nitro, NE$^1$E$^2$, —NR$^{Ar1}$COR$^{Ar2}$, —CONR$^{Ar1}$R$^{Ar2}$, —SO$_2$NR$^{Ar1}$R$^{Ar2}$, and —SO$_3$R$^{Ar2}$, where E$^1$, E$^2$, independently of each other, are hydrogen, unsubstituted or substituted C$_1$-C$_1$-alkyl, unsubstituted or substituted C$_2$-C$_{18}$-alkenyl, unsubstituted or substituted C$_2$-C$_{18}$-alkynyl, unsubstituted or substituted C$_3$-C$_{20}$-cycloalkyl or unsubstituted or substituted C$_6$-C$_{10}$-aryl, and R$^{Ar1}$ and R$^{Ar2}$, each independently of each, are hydrogen, unsubstituted or substituted C$_1$-C$_{18}$-alkyl, unsubstituted or substituted C$_3$-C$_{20}$-cycloalkyl, unsubstituted or substituted heterocyclyl, unsubstituted or substituted C$_6$-C$_{20}$-aryl or unsubstituted or substituted heteroaryl.

The term "alkynyl" as used herein (also referred to as alkyl whose carbon chain may comprise one or more triple bonds) refers to straight-chain or branched hydrocarbon groups having usually 2 to 100 ("C$_2$-C$_{100}$-alkynyl"), 2 to 18 ("C$_2$-C$_{18}$-alkynyl"), 2 to 10 ("C$_2$-C$_{10}$-alkynyl"), 2 to 8 ("C$_2$-C$_8$-alkynyl"), or 2 to 6 ("C$_2$-C$_6$-alkynyl") carbon atoms and one or more, e.g. 2 or 3, triple bonds in any position. Substituted alkynyl groups, depending on the length of the alkynyl chain, have one or more (e.g. 1, 2, 3, 4, 5 or more than 5) substituents. These are preferably each independently of each other selected from unsubstituted or substituted cycloalkyl, unsubstituted or substituted cycloalkyloxy, unsubstituted or substituted cycloalkylthio, unsubstituted or substituted heterocycloalkyl, unsubstituted or substituted aryl, unsubstituted or substituted aryloxy, unsubstituted or substituted arylthio, unsubstituted or substituted hetaryl, fluorine, chlorine, bromine, iodine, hydroxyl, mercapto, unsubstituted or substituted alkoxy, unsubstituted or substituted polyalkyleneoxy, unsubstituted or substituted alkylthio, unsubstituted or substituted cycloalkyloxy, unsubstituted or substituted aryloxy, unsubstituted or substituted arylthio, cyano, nitro, alkylcarbonyloxy, formyl, acyl, COOH, carboxylate, —COOR$^{Ar1}$, NE$^1$E$^2$, —NR$^{Ar1}$COR$^{Ar2}$, —CONR$^{Ar1}$R$^{Ar2}$, —SO$_2$NR$^{Ar1}$R$^{Ar2}$ and —SO$_3$R$^{Ar2}$, where E$^1$ and E$^2$ are hydrogen, unsubstituted or substituted C$_1$-C$_{18}$-alkyl, unsubstituted or substituted C$_2$-C$_{18}$-alkenyl, unsubstituted or substituted C$_2$-C$_1$-alkynyl, unsubstituted or substituted C$_3$-C$_{20}$-cycloalkyl or unsubstituted or substituted C$_6$-C$_{10}$-aryl, and R$^{Ar1}$ and R$^{Ar2}$, independently of each other, are hydrogen, unsubstituted or substituted C$_1$-C$_{18}$-alkyl, unsubstituted or substituted C$_3$-C$_{20}$-cycloalkyl, unsubstituted or substituted heterocyclyl, unsubstituted or substituted C$_6$-C$_{20}$-aryl or unsubstituted or substituted heteroaryl. In particular, substituted alkynyl groups have one or more, for example 1, 2 or 3 substituent(s) selected from unsubstituted or substituted cycloalkyl, unsubstituted or substituted aryl, fluorine, chlorine, bromine, hydroxyl, alkoxy, polyalkyleneoxy, mercapto, alkylthio, cyano, nitro, NE$^1$E$^2$, —NR$^{Ar1}$COR$^{Ar2}$, —CONR$^{Ar1}$R$^{Ar2}$, —SO$_2$NR$^{Ar1}$R$^{Ar2}$, and —SO$_3$R$^{Ar2}$, where E$^1$, E$^2$, independently of each other, are hydrogen, unsubstituted or substituted C$_1$-C$_{18}$-alkyl, unsubstituted or substituted C$_2$-C$_{18}$-alkenyl, unsubstituted or substituted C$_2$-C$_1$-alkynyl, unsubstituted or substituted C$_3$-C$_{20}$-cycloalkyl or unsubstituted or substituted C$_6$-C$_{10}$-aryl, and R$^{Ar1}$ and R$^{Ar2}$, each independently of each, are hydrogen, unsubstituted or substituted C$_1$-C$_{18}$-alkyl, unsubstituted or substituted C$_3$-C$_{20}$-cycloalkyl, unsubstituted or substituted heterocyclyl, unsubstituted or substituted C$_6$-C$_{20}$-aryl or unsubstituted or substituted heteroaryl.

The term "cycloalkyl" as used herein denotes in each case a mono- or bi- or polycyclic saturated hydrocarbon radicals having usually from 3 to 24 (C$_3$-C$_{24}$-cycloalkyl), 3 to 20 ("C$_3$-C$_{20}$-cycloalkyl") atoms, preferably 3 to 8 ("C$_3$-C$_8$-cycloalkyl") or 3 to 6 carbon atoms ("C$_3$-C$_6$-cycloalkyl"). Examples of monocyclic radicals having 3 to 6 carbon atoms comprise cyclopropyl, cyclobutyl, cyclopentyl and cyclohexyl. Examples of monocyclic radicals having 3 to 8 carbon atoms comprise cyclopropyl, cyclobutyl, cyclopentyl, cyclohexyl, cycloheptyl and cyclooctyl. Examples of bicyclic radicals having 7 to 12 carbon atoms comprise bicyclo[2.2.1]heptyl, bicyclo[3.1.1]heptyl, bicyclo[2.2.2]octyl, bicyclo[3.3.0]octyl, bicyclo[3.2.1]octyl, bicyclo[3.3.1]nonyl, bicyclo[4.2.1]nonyl, bicyclo[4.3.1]decyl, bicyclo[3.3.2]decyl, bicyclo[4.4.0]decyl, bicyclo[4.2.2]decyl, bicyclo[4.3.2]undecyl, bicyclo[3.3.3]undecyl, bicyclo[4.3.3]dodecyl, and perhydronaphthyl. Examples of polycyclic rings are perhydroanthracyl, perhydrofluorenyl, perhydrochrysenyl, perhydropicenyl, and adamantyl.

Substituted cycloalkyl groups may, depending on the ring size, have one or more (e.g. 1, 2, 3, 4, 5 or more than 5) substituents. These are preferably each independently of each other selected from unsubstituted or substituted alkyl, unsubstituted or substituted alkenyl, unsubstituted or substituted alkynyl, unsubstituted or substituted cycloalkyl, unsubstituted or substituted cycloalkyloxy, unsubstituted or substituted cycloalkylthio, unsubstituted or substituted heterocycloalkyl, unsubstituted or substituted aryl, unsubstituted or substituted aryloxy, unsubstituted or substituted arylthio, unsubstituted or substituted hetaryl, fluorine, chlorine, bromine, iodine, hydroxyl, mercapto, unsubstituted or substituted alkoxy, unsubstituted or substituted polyalkyleneoxy, unsubstituted or substituted alkylthio, unsubstituted or substituted cycloalkyloxy, unsubstituted or substituted aryloxy, unsubstituted or substituted arylthio, cyano, nitro, unsubstituted or substituted alkylcarbonyloxy, formyl, acyl, COOH, carboxylate, —COOR$^{Ar1}$, —NE$^1$E$^2$, —NR$^{Ar1}$COR$^{Ar2}$, —CONR$^{Ar1}$R$^{Ar2}$, —SO$_2$NR$^{Ar1}$R$^{Ar2}$ and —SO$_3$R$^{Ar2}$, where E$^1$ and E$^2$ are hydrogen, unsubstituted or substituted C$_1$-C$_{18}$-alkyl, unsubstituted or substituted C$_2$-C$_{18}$-alkenyl, unsubstituted or substituted C$_2$-C$_1$-alkynyl, unsubstituted or substituted C$_3$-C$_{20}$-cycloalkyl or unsubstituted or substituted C$_6$-C$_{10}$-aryl, and R$^{Ar1}$ and R$^{Ar2}$, independently of each other, are hydrogen, unsubstituted or substituted C$_1$-C$_1$-alkyl, unsubstituted or substituted C$_3$-C$_{20}$-cycloalkyl, unsubstituted or substituted heterocyclyl, unsubstituted or substituted C$_6$-C$_{20}$-aryl or unsubstituted or substituted heteroaryl. In particular, substituted cycloalkyl groups have one or more, for example 1, 2 or 3 substituent(s) selected from unsubstituted or substituted alkyl, unsubstituted or substituted cycloalkyl, unsubstituted or substituted aryl, fluorine, chlorine, bromine, hydroxyl, alkoxy, polyalkyleneoxy, mercapto, alkylthio, cyano, nitro, $NE^1E^2$, $-NR^{Ar1}COR^{Ar2}$, $-CONR^{Ar1}R^{Ar2}$, $-SO_2NR^{Ar1}R^{Ar2}$, and $-SO_3R^{Ar2}$, where $E^1$, $E^2$, independently of each other, are hydrogen, unsubstituted or substituted $C_1$-$C_{18}$-alkyl, unsubstituted or substituted $C_2$-$C_{18}$-alkenyl, unsubstituted or substituted $C_2$-$C_1$-alkynyl, unsubstituted or substituted $C_3$-$C_{20}$-cycloalkyl or unsubstituted or substituted $C_6$-$C_{10}$-aryl, and $R^{Ar1}$ and $R^{Ar2}$, each independently of each, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl.

The term "cycloalkyloxy" as used herein refers to a cycloalkyl group bound through an oxygen atom, that is, a "cycloalkyloxy" group may be represented as —O-cycloalkyl where cycloalkyl is as defined above.

Accordingly, the term "unsubstituted or substituted cycloalkyloxy" as used herein refers to —O-cycloalkyl where cycloalkyl is unsubstituted or substituted as defined above.

The term "cycloalkylthio" as used herein refers to a cycloalkyl group bound through a sulfur atom, that is, a "cycloalkylthio" group may be represented as —S-cycloalkyl where cycloalkyl is as defined above.

Accordingly, the term "unsubstituted or substituted cycloalkylthio" as used herein refers to —S-cycloalkyl where cycloalkyl is unsubstituted or substituted as defined above.

The term "heterocycloalkyl" refers to nonaromatic, partially unsaturated or fully saturated, heterocyclic rings having generally 5 to 8 ring members, preferably 5 or 6 ring members, comprising besides carbon atoms as ring members, one, two, three or four heteroatoms or heteroatom-containing groups selected from O, N, $NR^{cc}$, S, SO and $S(O)_2$ as ring members, wherein $R^{cc}$ is hydrogen, $C_1$-$C_{20}$-alkyl, $C_3$-$C_{24}$-cycloalkyl, heterocycloalkyl, $C_6$-$C_{24}$-aryl or heteroaryl. Examples of heterocycloalkyl groups are especially pyrrolidinyl, piperidinyl, imidazolidinyl, pyrazolidinyl, oxazolidinyl, morpholinyl, thiazolidinyl, isothiazolidinyl, isoxazolidinyl, piperazinyl, tetrahydrothiophenyl, dihydrothien-2-yl, tetrahydrofuranyl, dihydrofuran-2-yl, tetrahydropyranyl, 2-oxazolinyl, 3-oxazolinyl, 4-oxazolinyl and dioxanyl.

Substituted heterocycloalkyl groups may, depending on the ring size, have one or more (e.g. 1, 2, 3, 4, 5 or more than 5) substituents. These are preferably each independently of each other selected from unsubstituted or substituted alkyl, unsubstituted or substituted alkenyl, unsubstituted or substituted alkynyl, unsubstituted or substituted cycloalkyl, unsubstituted or substituted cycloalkyloxy, unsubstituted or substituted cycloalkylthio, unsubstituted or substituted heterocycloalkyl, unsubstituted or substituted aryl, unsubstituted or substituted aryloxy, unsubstituted or substituted arylthio, unsubstituted or substituted hetaryl, fluorine, chlorine, bromine, iodine, hydroxyl, mercapto, unsubstituted or substituted alkoxy, unsubstituted or substituted polyalkyleneoxy, unsubstituted or substituted alkylthio, unsubstituted or substituted cycloalkyloxy, unsubstituted or substituted aryloxy, unsubstituted or substituted arylthio, cyano, nitro, unsubstituted or substituted alkylcarbonyloxy, formyl, acyl, COOH, carboxylate, $-COOR^{Ar1}$, $-NE^1E^2$, $-NR^{Ar1}COR^{Ar2}$, $-CONR^{Ar1}R^{Ar2}$, $-SO_2NR^{Ar1}R^{Ar2}$ and $-SO_3R^{Ar2}$, where $E^1$ and $E^2$ are hydrogen or substituted $C_1$-$C_{18}$-alkyl, unsubstituted or substituted $C_2$-$C_{18}$-alkenyl, unsubstituted or substituted $C_2$-$C_1$-alkynyl, unsubstituted or substituted $C_3$-$C_{20}$-cycloalkyl or unsubstituted or substituted $C_6$-$C_{10}$-aryl, and $R^{Ar1}$ and $R^{Ar2}$, independently of each other, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl. In particular, substituted heterocycloalkyl groups have one or more, for example 1, 2 or 3 substituent(s) selected from unsubstituted or substituted alkyl, unsubstituted or substituted cycloalkyl, unsubstituted or substituted aryl, fluorine, chlorine, bromine, hydroxyl, alkoxy, polyalkyleneoxy, mercapto, alkylthio, cyano, nitro, $NE^1E^2$, $-NR^{Ar1}COR^{Ar2}$, $-CONR^{Ar1}R^{Ar2}$, $-SO_2NR^{Ar1}R^{Ar2}$, and $-SO_3R^{Ar2}$, where $E^1$, $E^2$, independently of each other, are hydrogen, unsubstituted or substituted $C_1$-$C_{18}$-alkyl, unsubstituted or substituted $C_2$-$C_{18}$-alkenyl, unsubstituted or substituted $C_2$-$C_1$-alkynyl, unsubstituted or substituted $C_3$-$C_{20}$-cycloalkyl or unsubstituted or substituted $C_6$-$C_{10}$-aryl, and $R^{Ar1}$ and $R^{Ar2}$, each independently of each, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl.

For the purpose of the present invention, the term "aryl" refers to a monocyclic aromatic hydrocarbon radical (i.e. phenyl) or fused bi-, tri- or polycyclic aromatic hydrocarbon radical having at least one fused phenyl ring. The number of carbon ring atoms in an aryl group can vary and is ordinarily 6 to 24. If aryl is not a monocyclic aromatic hydrocarbon radical, i.e. phenyl, the term includes for the fused ring(s) the saturated form (perhydro form), the partly unsaturated form (for example the dihydro form or tetrahydro form) or the aromatic form. The term "aryl" includes, for example bicyclic aromatic radicals in which both rings are aromatic and bicyclic aromatic radicals in which only one ring is aromatic. Examples of bi- or tricyclic aromatic carbocycles include naphthyl, 1,2-dihydronaphthyl, 1,4-dihydronaphthyl, 1,2,3,4-tetrahydronaphthyl, indanyl, indenyl, anthracenyl, fluorenyl etc. Preferably, the term "aryl" denotes phenyl and naphthyl ($C_6$-$C_{10}$-aryl).

Substituted aryls may, depending on the number and size of their ring systems, have one or more (e.g. 1, 2, 3, 4, 5 or more than 5) substituents. These are preferably each independently of each other selected from unsubstituted or substituted alkyl, unsubstituted or substituted alkenyl, unsubstituted or substituted alkynyl, unsubstituted or substituted cycloalkyl, unsubstituted or substituted cycloalkyloxy, unsubstituted or substituted cycloalkylthio, unsubstituted or substituted heterocycloalkyl, unsubstituted or substituted aryl, unsubstituted or substituted aryloxy, unsubstituted or substituted arylthio, unsubstituted or substituted hetaryl, fluorine, chlorine, bromine, iodine, hydroxyl, mercapto, unsubstituted or substituted alkoxy, unsubstituted or substituted polyalkyleneoxy, unsubstituted or substituted alkylthio, unsubstituted or substituted cycloalkyloxy, unsubstituted or substituted aryloxy, unsubstituted or substituted arylthio, cyano, nitro, unsubstituted or substituted alkylcarbonyloxy, formyl, acyl, COOH, carboxylate, $-COOR^{Ar1}$, $-NE^1E^2$, $-NR^{Ar1}COR^{Ar2}$, $-CONR^{Ar1}R^{Ar2}$, $-SO_2NR^{Ar1}R^{Ar2}$ and $-SO_3R^{Ar2}$, where $E^1$ and $E^2$ are hydrogen, unsubstituted or substituted $C_1$-$C_{18}$-alkyl, unsubstituted or substituted $C_2$-$C_{18}$-alkenyl, unsubstituted or substituted $C_2$-$C_1$-alkynyl, unsubstituted or substituted $C_3$-$C_{20}$-cycloalkyl or unsubstituted or substituted $C_6$-$C_{10}$-aryl, and $R^{Ar1}$ and $R^{Ar2}$, independently of each other, are hydrogen, unsubstituted or substituted $C_1$-$C_1$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl. In particular, substituted aryl groups have one or more, for example 1, 2 or 3 substituent(s) selected from unsubstituted or substituted alkyl, unsubstituted or substituted cycloalkyl, unsubstituted or substituted aryl, fluorine, chlorine, bromine, hydroxyl, alkoxy, polyalkyleneoxy, mercapto, alkylthio, cyano, nitro, $NE^1E^2$, —$NR^{Ar1}COR^{Ar2}$, —$CONR^{Ar1}R^{Ar2}$, —$SO_2NR^{Ar1}R^{Ar2}$, and —$SO_3R^{Ar2}$, where $E^1$, $E^2$, independently of each other, are hydrogen, unsubstituted or substituted $C_1$-$C_{18}$-alkyl, unsubstituted or substituted $C_2$-$C_{18}$-alkenyl, unsubstituted or substituted $C_2$-$C_1$-alkynyl, unsubstituted or substituted $C_3$-$C_{20}$-cycloalkyl or unsubstituted or substituted $C_6$-$C_{10}$-aryl, and $R^{Ar1}$ and $R^{Ar2}$, each independently of each, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl.

Substituted aryl is preferably aryl substituted by at least one alkyl group ("alkaryl", also referred to hereinafter as alkylaryl). Alkaryl groups may, depending on the size of the aromatic ring system, have one or more (e.g. 1, 2, 3, 4, 5, 6, 7, 8, 9 or more than 9) alkyl substituents. The alkyl substituents may be unsubstituted or substituted. In this regard, reference is made to the above statements regarding unsubstituted and substituted alkyl. A special embodiment relates to alkaryl groups, wherein alkyl is unsubstituted. Alkaryl is preferably phenyl which bears 1, 2, 3, 4 or 5, preferably 1, 2 or 3, more preferably 1 or 2 alkyl substituents. Aryl which bears one or more alkyl radicals, is, for example, 2-, 3- and 4-methylphenyl, 2,4-, 2,5-, 3,5- and 2,6-dimethylphenyl, 2,4,6-trimethylphenyl, 2-, 3- and 4-ethylphenyl, 2,4-, 2,5-, 3,5- and 2,6-diethylphenyl, 2,4,6-triethylphenyl, 2-, 3- and 4-n-propylphenyl, 2-, 3- and 4-isopropylphenyl, 2,4-, 2,5-, 3,5- and 2,6-di-n-propylphenyl, 2,4,6-tripropylphenyl, 2-, 3- and 4-isopropylphenyl, 2,4-, 2,5-, 3,5- and 2,6-diisopropylphenyl, 2,4,6-triisopropylphenyl, 2-, 3- and 4-butylphenyl, 2,4-, 2,5-, 3,5- and 2,6-dibutylphenyl, 2,4,6-tributylphenyl, 2-, 3- and 4-isobutylphenyl, 2,4-, 2,5-, 3,5- and 2,6-diisobutylphenyl, 2,4,6-triisobutylphenyl, 2-, 3- and 4-sec-butylphenyl, 2,4-, 2,5-, 3,5- and 2,6-di-sec-butylphenyl, 2,4,6-tri-sec-butylphenyl, 2-, 3- and 4-tert-butylphenyl, 2,4-, 2,5-, 3,5- and 2,6-di-tert-butylphenyl and 2,4,6-tri-tert-butylphenyl.

$C_6$-$C_{24}$-aryloxy: $C_6$-$C_{24}$-aryl as defined above, which is bonded to the skeleton via an oxygen atom (—O—). Preference is given to phenoxy and naphthyloxy.

Accordingly, the term "unsubstituted or substituted aryloxy" as used herein refers to —O-aryl where aryl is unsubstituted or substituted as defined above.

$C_6$-$C_{24}$-arylthio: $C_6$-$C_{24}$-aryl as defined above, which is bonded to the skeleton via a sulfur atom (—S—). Preference is given to phenylthio and naphthylthio.

Accordingly, the term "unsubstituted or substituted arylthio" as used herein refers to —S-aryl where aryl is unsubstituted or substituted as defined above.

In the context of the present invention, the expression "hetaryl" (also referred to as heteroaryl) comprises heteroaromatic, mono- or polycyclic groups. In addition to the ring carbon atoms, these have 1, 2, 3, 4 or more than 4 heteroatoms as ring members. The heteroatoms are preferably selected from oxygen, nitrogen, selenium and sulfur. The hetaryl groups have preferably 5 to 18, e.g. 5, 6, 8, 9, 10, 11, 12, 13 or 14, ring atoms.

Monocyclic hetaryl groups are preferably 5- or 6-membered hetaryl groups, such as 2-furyl (furan-2-yl), 3-furyl (furan-3-yl), 2-thienyl (thiophen-2-yl), 3-thienyl (thiophen-3-yl), 1H-pyrrol-2-yl, 1H-pyrrol-3-yl, pyrrol-1-yl, imidazol-2-yl, imidazol-1-yl, imidazol-4-yl, pyrazol-1-yl, pyrazol-3-yl, pyrazol-4-yl, pyrazol-5-yl, 3-isoxazolyl, 4-isoxazolyl, 5-isoxazolyl, 3-isothiazolyl, 4-isothiazolyl, 5-isothiazolyl, 2-oxazolyl, 4-oxazolyl, 5-oxazolyl, 2-thiazolyl, 4-thiazolyl, 5-thiazolyl, 1,2,4-oxadiazol-3-yl, 1,2,4-oxadiazol-5-yl, 1,3,4-oxadiazol-2-yl, 1,2,4-thiadiazol-3-yl, 1,2,4-thiadiazol-5-yl, 1,3,4-thiadiazol-2-yl, 4H-[1,2,4]-triazol-3-yl, 1,3,4-triazol-2-yl, 1,2,3-triazol-1-yl, 1,2,4-triazol-1-yl, pyridin-2-yl, pyridin-3-yl, pyridin-4-yl, 3-pyridazinyl, 4-pyridazinyl, 2-pyrimidinyl, 4-pyrimidinyl, 5-pyrimidinyl, 2-pyrazinyl, 1,3,5-triazin-2-yl and 1,2,4-triazin-3-yl.

Polycyclic hetaryl groups have 2, 3, 4 or more than 4 fused rings. The fused-on rings may be aromatic, saturated or partly unsaturated. Examples of polycyclic hetaryl groups are quinolinyl, isoquinolinyl, indolyl, isoindolyl, indolizinyl, benzofuranyl, isobenzofuranyl, benzothiophenyl, benzoxazolyl, benzisoxazolyl, benzthiazolyl, benzoxadiazolyl, benzothiadiazolyl, benzoxazinyl, benzopyrazolyl, benzimidazolyl, benzotriazolyl, benzotriazinyl, benzoselenophenyl, thienothiophenyl, thienopyrimidyl, thiazolothiazolyl, dibenzopyrrolyl (carbazolyl), dibenzofuranyl, dibenzothiophenyl, naphtho[2,3-b]thiophenyl, naphtha[2,3-b]furyl, dihydroindolyl, dihydroindolizinyl, dihydroisoindolyl, dihydroquinolinyl and dihydroisoquinolinyl.

Substituted hetaryl groups may, depending on the number and size of their ring systems, have one or more (e.g. 1, 2, 3, 4, 5 or more than 5) substituents. These are preferably each independently of each other selected from unsubstituted or substituted alkyl, unsubstituted or substituted alkenyl, unsubstituted or substituted alkynyl, unsubstituted or substituted cycloalkyl, unsubstituted or substituted cycloalkyloxy, unsubstituted or substituted cycloalkylthio, unsubstituted or substituted heterocycloalkyl, unsubstituted or substituted aryl, unsubstituted or substituted aryloxy, unsubstituted or substituted arylthio, unsubstituted or substituted hetaryl, fluorine, chlorine, bromine, iodine, hydroxyl, mercapto, unsubstituted or substituted alkoxy, unsubstituted or substituted polyalkyleneoxy, unsubstituted or substituted alkylthio, unsubstituted or substituted cycloalkyloxy, unsubstituted or substituted aryloxy, unsubstituted or substituted arylthio, cyano, nitro, unsubstituted or substituted alkylcarbonyloxy, formyl, acyl, COOH, carboxylate, —$COOR^{Ar1}$, —$NE^1E^2$, —$NR^{Ar1}COR^{Ar2}$, —$CONR^{Ar1}R^{Ar2}$, —$SO_2NR^{Ar1}R^{Ar2}$ and —$SO_3R^{Ar2}$, where $E^1$ and $E^2$ are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl, and $R^{Ar1}$ and $R^{Ar2}$, independently of each other, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl. In particular, substituted hetaryl groups have one or more, for example 1, 2 or 3 substituent(s) selected from unsubstituted or substituted alkyl, unsubstituted or substituted cycloalkyl, unsubstituted or substituted aryl, fluorine, chlorine, bromine, hydroxyl, alkoxy, polyalkyleneoxy, mercapto, alkylthio, cyano, nitro, $NE^1E^2$, —$NR^{Ar1}COR^{Ar2}$, —$CONR^{Ar1}R^{Ar2}$, —$SO_2NR^{Ar1}R^{Ar2}$, and —$SO_3R^{Ar2}$, where $E^1$, $E^2$, $R^{Ar1}$ and $R^{Ar2}$ are as defined above.

Fused ring systems can comprise alicyclic, aliphatic heterocyclic, aromatic and heteroaromatic rings and combinations thereof, hydroaromatic joined by fusion. Fused ring systems comprise two, three or more (e.g. 4, 5, 6, 7 or 8) rings. Depending on the way in which the rings in fused ring systems are joined, a distinction is made between ortho-fusion, i.e. each ring shares at least one edge or two atoms with each adjacent ring, and peri-fusion in which a carbon atom belongs to more than two rings. Preferred fused ring systems are ortho-fused ring systems.

When # or * appear in a formula showing a substructure of a compound of the present invention, it denotes the attachment point in the remainder molecule.

The remarks made below as to preferred embodiments of the variables (substituents) of the compounds of formulae (I.a), (I.b) and (I.c) are valid on their own as well as preferably in combination with each other.

Compound of Formulae (I.a), (I.b) and (I.c)

The compounds of formulae (I.a), (I.b) and (I.c) used according to the invention are characterized by two cyano groups attached at the BODIPY core. These cyano groups significantly improve the photostability of the compounds used according to the present invention under practical irradiation conditions.

Preferred compounds according to the invention are compounds of formulae (I.a), (I.b) and (I.c), wherein $R^1$, $R^2$, $R^3$, $R^5$, $R^6$ and $R^7$, if present, independently of each other, are selected from hydrogen, $C_1$-$C_{10}$-alkyl or phenyl-$C_1$-$C_4$-alkyl, wherein the phenyl moiety in phenyl-$C_1$-$C_4$-alkyl is unsubstituted or substituted by 1, 2 or 3 identical or different radicals $R^9$. In this context, $R^9$ is preferably $C_1$-$C_4$-alkyl, $C_1$-$C_4$-alkoxy, CN, phenyl or phenoxy. Especially, $R^9$ is $C_1$-$C_4$-alkyl or $C_1$-$C_4$-alkoxy. $R^1$, $R^2$, $R^3$, $R^5$, $R^6$ and $R^7$, if present, independently of each other, are more preferably selected from $C_1$-$C_6$-alkyl or phenyl-$C_1$-$C_2$-alkyl, wherein the phenyl moiety in phenyl-$C_1$-$C_2$-alkyl is unsubstituted or substituted by 1, 2 or 3 radicals $R^9$, wherein $R^9$ is as defined above and especially has one of the meanings mentioned as preferred. Especially, $R^1$, $R^2$, $R^3$, $R^5$, $R^6$ and $R^7$, if present, independently of each other are selected from $C_1$-$C_4$-alkyl. Herein, in particular, $R^1$, $R^2$, $R^3$, $R^5$, $R^6$ and $R^7$, if present, independently of each other, are methyl or ethyl.

$R^{4a}$ and $R^{4b}$ of formulae (I.a), (I.b) and (I.c), independently of each other, are preferably selected from fluorine, chlorine, cyano, $C_1$-$C_6$-alkoxy or monohydroxy-$C_4$-$C_{10}$-alkyl. Examples of $C_1$-$C_6$-alkoxy are methoxy, ethoxy, n-propoxy, especially methoxy. Examples of monohydroxy-$C_4$-$C_{10}$-alkyl are 2-hydroxy-1,1-dimethylpropoxy, 2-hydroxy-1,2-dimethylpropoxy, 2-hydroxy-1,1,2-trimethylpropoxy, 2-hydroxy-1,1,2-trimethylpropoxy, 3-hydroxy-1-methylpropoxy, 3-hydroxy-1,1-dimethylpropoxy, especially 2-hydroxy-1,1,2-trimethylpropoxy. In a preferred embodiment, $R^{4a}$ and $R^{4b}$ have the same meaning. In particular, $R^{4a}$ and $R^{4b}$ are each fluorine.

Preferably, $R^{8a}$ of formula (I.a) is $C_1$-$C_{10}$-alkyl. More preferably, $R^{8a}$ is $C_1$-$C_4$-alkyl. Most preferably, $R^{8a}$ is methyl or ethyl.

Preferably, $R^{8b}$ of formula (I.b) is $C_1$-$C_{10}$-alkyl. More preferably, $R^{8b}$ is $C_1$-$C_4$-alkyl. Most preferably, $R^{8b}$ is methyl or ethyl.

Preferably $R^{8c}$ of formula (I.c) is $C_1$-$C_{10}$-alkyl, phenyl-$C_1$-$C_4$-alkyl or phenyl, wherein phenyl in the two last mentioned radicals is unsubstituted or substituted by k identical or different radicals $R^9$, wherein k is 1, 2 or 3. In this context, $R^9$ is preferably $C_1$-$C_4$-alkyl, $C_1$-$C_4$-alkoxy, CN, phenyl or phenoxy. Especially, $R^9$ is $C_1$-$C_4$-alkyl or $C_1$-$C_4$-alkoxy. More preferably, $R^{8c}$ is $C_1$-$C_4$-alkyl. Most preferably, $R^{8c}$ is methyl or ethyl. Likewise more preferably, $R^{8c}$ is phenyl which is unsubstituted or substituted by 1, 2 or 3 radicals $R^9$ selected from $C_1$-$C_4$-alkyl.

Examples of preferred compounds are the individual compounds compiled in the following tables A to C below.

Examples of preferred compounds of formula (I.a) are compiled in Table A below:

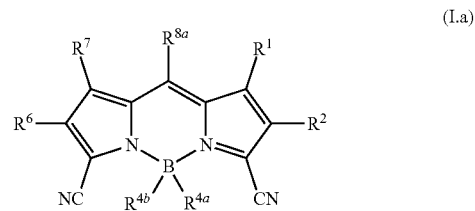

(I.a)

TABLE A

| Compound | $R^1$ | $R^2$ | $R^{4a}$ | $R^{4b}$ | $R^6$ | $R^7$ | $R^{8a}$ |
|---|---|---|---|---|---|---|---|
| I.a-1 | $CH_3$ | $CH_3$ | F | F | $CH_3$ | $CH_3$ | $CH_3$ |
| I.a-2 | $CH_3$ | $CH_3$ | Cl | Cl | $CH_3$ | $CH_3$ | $CH_3$ |
| I.a-3 | $CH_3$ | $CH_3$ | CN | CN | $CH_3$ | $CH_3$ | $CH_3$ |
| I.a-4 | $CH_3$ | $CH_3$ | $OCH_3$ | $OCH_3$ | $CH_3$ | $CH_3$ | $CH_3$ |
| I.a-5 | $CH_3$ | $CH_3$ | 2-htp | 2-htp | $CH_3$ | $CH_3$ | $CH_3$ |
| I.a-6 | $C_2H_5$ | $C_2H_5$ | F | F | $C_2H_5$ | $C_2H_5$ | $C_2H_5$ |
| I.a-7 | $C_2H_5$ | $C_2H_5$ | Cl | Cl | $C_2H_5$ | $C_2H_5$ | $C_2H_5$ |
| I.a-8 | $C_2H_5$ | $C_2H_5$ | CN | CN | $C_2H_5$ | $C_2H_5$ | $C_2H_5$ |
| I.a-9 | $C_2H_5$ | $C_2H_5$ | $OCH_3$ | $OCH_3$ | $C_2H_5$ | $C_2H_5$ | $C_2H_5$ |
| I.a-10 | $C_2H_5$ | $C_2H_5$ | 2-htp | 2-htp | $C_2H_5$ | $C_2H_5$ | $C_2H_5$ |
| I.a-11 | $CH_3$ | $C_2H_5$ | F | F | $C_2H_5$ | $CH_3$ | $CH_3$ |
| I.a-12 | $CH_3$ | $C_2H_5$ | Cl | Cl | $C_2H_5$ | $CH_3$ | $CH_3$ |
| I.a-13 | $CH_3$ | $C_2H_5$ | CN | CN | $C_2H_5$ | $CH_3$ | $CH_3$ |
| I.a-14 | $CH_3$ | $C_2H_5$ | $OCH_3$ | $OCH_3$ | $C_2H_5$ | $CH_3$ | $CH_3$ |
| I.a-15 | $CH_3$ | $C_2H_5$ | 2-htp | 2-htp | $C_2H_5$ | $CH_3$ | $CH_3$ |
| I.a-16 | $CH_3$ | H | F | F | H | $CH_3$ | $CH_3$ |
| I.a-17 | $CH_3$ | H | Cl | Cl | H | $CH_3$ | $CH_3$ |
| I.a-18 | $CH_3$ | H | CN | CN | H | $CH_3$ | $CH_3$ |
| I.a-19 | $CH_3$ | H | $OCH_3$ | $OCH_3$ | H | $CH_3$ | $CH_3$ |
| I.a-20 | $CH_3$ | H | 2-htp | 2-htp | H | $CH_3$ | $CH_3$ |

2-htp: 2-hydroxy-1,1,2-trimethylpropoxy

Examples of preferred compounds of formula (I.b) are compiled in Table B below:

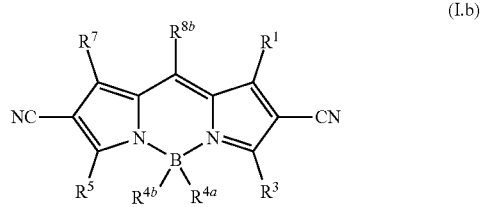

(I.b)

TABLE B

| Compound | $R^1$ | $R^3$ | $R^{4a}$ | $R^{4b}$ | $R^5$ | $R^7$ | $R^{8b}$ |
|---|---|---|---|---|---|---|---|
| I.b-1 | $CH_3$ | $CH_3$ | F | F | $CH_3$ | $CH_3$ | $CH_3$ |
| I.b-2 | $CH_3$ | $CH_3$ | Cl | Cl | $CH_3$ | $CH_3$ | $CH_3$ |
| I.b-3 | $CH_3$ | $CH_3$ | CN | CN | $CH_3$ | $CH_3$ | $CH_3$ |
| I.b-4 | $CH_3$ | $CH_3$ | $OCH_3$ | $OCH_3$ | $CH_3$ | $CH_3$ | $CH_3$ |
| I.b-5 | $CH_3$ | $CH_3$ | 2-htp | 2-htp | $CH_3$ | $CH_3$ | $CH_3$ |
| I.b-6 | $C_2H_5$ | $C_2H_5$ | F | F | $C_2H_5$ | $C_2H_5$ | $C_2H_5$ |
| I.b-7 | $C_2H_5$ | $C_2H_5$ | Cl | Cl | $C_2H_5$ | $C_2H_5$ | $C_2H_5$ |
| I.b-8 | $C_2H_5$ | $C_2H_5$ | CN | CN | $C_2H_5$ | $C_2H_5$ | $C_2H_5$ |
| I.b-9 | $C_2H_5$ | $C_2H_5$ | $OCH_3$ | $OCH_3$ | $C_2H_5$ | $C_2H_5$ | $C_2H_5$ |
| I.b-10 | $C_2H_5$ | $C_2H_5$ | 2-htp | 2-htp | $C_2H_5$ | $C_2H_5$ | $C_2H_5$ |

$R^{8c}$ is phenyl which is unsubstituted or substituted by 1, 2 or 3 radicals $R^9$ selected from $C_1$-$C_4$-alkyl.

TABLE B-continued

| Compound | $R^1$ | $R^3$ | $R^{4a}$ | $R^{4b}$ | $R^5$ | $R^7$ | $R^{8b}$ |
|---|---|---|---|---|---|---|---|
| I.b-11 | $CH_3$ | $C_2H_5$ | F | F | $C_2H_5$ | $CH_3$ | $CH_3$ |
| I.b-12 | $CH_3$ | $C_2H_5$ | Cl | Cl | $C_2H_5$ | $CH_3$ | $CH_3$ |
| I.b-13 | $CH_3$ | $C_2H_5$ | CN | CN | $C_2H_5$ | $CH_3$ | $CH_3$ |
| I.b-14 | $CH_3$ | $C_2H_5$ | $OCH_3$ | $OCH_3$ | $C_2H_5$ | $CH_3$ | $CH_3$ |
| I.b-15 | $CH_3$ | $C_2H_5$ | 2-htp | 2-htp | $C_2H_5$ | $CH_3$ | $CH_3$ |
| I.b-16 | $CH_3$ | H | F | F | H | $CH_3$ | $CH_3$ |
| I.b-17 | $CH_3$ | H | Cl | Cl | H | $CH_3$ | $CH_3$ |
| I.b-18 | $CH_3$ | H | CN | CN | H | $CH_3$ | $CH_3$ |
| I.b-19 | $CH_3$ | H | $OCH_3$ | $OCH_3$ | H | $CH_3$ | $CH_3$ |
| I.b-20 | $CH_3$ | H | 2-htp | 2-htp | H | $CH_3$ | $CH_3$ |

2-htp: 2-hydroxy-1,1,2-trimethylpropoxy

Amongst the compounds of formula (I.b), more preferred are the compounds (I.b-1), (I.b-6), (I.b-11) and (I.b-16).

Examples of preferred compounds of formula (I.c) are compiled in Table C below:

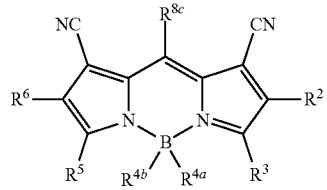

(I.c)

TABLE C

| Compound | $R^2$ | $R^3$ | $R^{4a}$ | $R^{4b}$ | $R^5$ | $R^6$ | $R^{8c}$ |
|---|---|---|---|---|---|---|---|
| I.c-1 | $CH_3$ | $CH_3$ | F | F | $CH_3$ | $CH_3$ | $CH_3$ |
| I.c-2 | $CH_3$ | $CH_3$ | Cl | Cl | $CH_3$ | $CH_3$ | $CH_3$ |
| I.c-3 | $CH_3$ | $CH_3$ | CN | CN | $CH_3$ | $CH_3$ | $CH_3$ |
| I.c-4 | $CH_3$ | $CH_3$ | $OCH_3$ | $OCH_3$ | $CH_3$ | $CH_3$ | $CH_3$ |
| I.c-5 | $CH_3$ | $CH_3$ | 2-htp | 2-htp | $CH_3$ | $CH_3$ | $CH_3$ |
| I.c-6 | $C_2H_5$ | $C_2H_5$ | F | F | $C_2H_5$ | $C_2H_5$ | $C_2H_5$ |
| I.c-7 | $C_2H_5$ | $C_2H_5$ | Cl | Cl | $C_2H_5$ | $C_2H_5$ | $C_2H_5$ |
| I.c-8 | $C_2H_5$ | $C_2H_5$ | CN | CN | $C_2H_5$ | $C_2H_5$ | $C_2H_5$ |
| I.c-9 | $C_2H_5$ | $C_2H_5$ | $OCH_3$ | $OCH_3$ | $C_2H_5$ | $C_2H_5$ | $C_2H_5$ |
| I.c-10 | $C_2H_5$ | $C_2H_5$ | 2-htp | 2-htp | $C_2H_5$ | $C_2H_5$ | $C_2H_5$ |
| I.c-11 | $C_6H_5$ | $CH_3$ | F | F | $CH_3$ | $C_6H_5$ | $CH_3$ |
| I.c-12 | $C_6H_5$ | $CH_3$ | Cl | Cl | $CH_3$ | $C_6H_5$ | $CH_3$ |
| I.c-13 | $C_6H_5$ | $CH_3$ | CN | CN | $CH_3$ | $C_6H_5$ | $CH_3$ |
| I.c-14 | $C_6H_5$ | $CH_3$ | $OCH_3$ | $OCH_3$ | $CH_3$ | $C_6H_5$ | $CH_3$ |
| I.c-15 | $C_6H_5$ | $CH_3$ | 2-htp | 2-htp | $CH_3$ | $C_6H_5$ | $CH_3$ |
| I.c-16 | $CH_3$ | $CH_3$ | F | F | $CH_3$ | $CH_3$ | $C_6H_5$ |
| I.c-17 | $CH_3$ | $CH_3$ | Cl | Cl | $CH_3$ | $CH_3$ | $C_6H_5$ |
| I.c-18 | $CH_3$ | $CH_3$ | CN | CN | $CH_3$ | $CH_3$ | $C_6H_5$ |
| I.c-19 | $CH_3$ | $CH_3$ | $OCH_3$ | $OCH_3$ | $CH_3$ | $CH_3$ | $C_6H_5$ |
| I.c-20 | $CH_3$ | $CH_3$ | 2-htp | 2-htp | $CH_3$ | $CH_3$ | $C_6H_5$ |
| I.c-21 | $CH_3$ | $CH_3$ | F | F | $CH_3$ | $CH_3$ | 4-$CH_3$—$C_6H_4$ |
| I.c-22 | $CH_3$ | $CH_3$ | Cl | Cl | $CH_3$ | $CH_3$ | 4-$CH_3$—$C_6H_4$ |
| I.c-23 | $CH_3$ | $CH_3$ | CN | CN | $CH_3$ | $CH_3$ | 4-$CH_3$—$C_6H_4$ |
| I.c-24 | $CH_3$ | $CH_3$ | $OCH_3$ | $OCH_3$ | $CH_3$ | $CH_3$ | 4-$CH_3$—$C_6H_4$ |
| I.c-25 | $CH_3$ | $CH_3$ | 2-htp | 2-htp | $CH_3$ | $CH_3$ | 4-$CH_3$—$C_6H_4$ |
| I.c-26 | $CH_3$ | $CH_3$ | F | F | $CH_3$ | $CH_3$ | $CH_2C_6H_5$ |
| I.c-27 | $CH_3$ | $CH_3$ | Cl | Cl | $CH_3$ | $CH_3$ | $CH_2C_6H_5$ |
| I.c-28 | $CH_3$ | $CH_3$ | CN | CN | $CH_3$ | $CH_3$ | $CH_2C_6H_5$ |
| I.c-29 | $CH_3$ | $CH_3$ | $OCH_3$ | $OCH_3$ | $CH_3$ | $CH_3$ | $CH_2C_6H_5$ |
| I.c-30 | $CH_3$ | $CH_3$ | 2-htp | 2-htp | $CH_3$ | $CH_3$ | $CH_2C_6H_5$ |

2-htp: 2-hydroxy-1,1,2-trimethylpropoxy

Amongst the compounds of formula (I.c), more preferred are the compounds (I.c-1), (I.c-6), (I.c-11), (I.c-16), (I.c-21) and (I.c-26).

In an embodiment of the invention, the organic fluorescent dye selected from a compound of formulae (I.a), (I.b), (I.c) or mixtures thereof is the only organic fluorescent dye with a center wavelength of emission from 490 nm to 545 nm in the color converter.

The compounds used according to the present invention can be prepared by using routine methods familiar to a skilled person. There are two distinct common methods to introduce cyano groups to the BODIPY scaffold. One method is to start from an activated carbonyl compound and cyanated pyrrols to afford a cyanated dipyrromethene followed by complexation with a boron source. Another method is to postfunctionalise a dihalogenated boron dipyrrin with cyanide. Not all compounds of formulae (I.a), (I.b) and (I.c) can be prepared via both methods.

In particular, the compounds of the formulae (I.a), (I.b) and (I.c) can be prepared according to the following schemes, wherein the variables, if not stated otherwise, are as defined above. Apart from that, a skilled person will easily find suitable reaction conditions for the synthesis depicted in the schemes below by routine. Further details can also be taken from the preparation examples contained herein.

Compounds of the formula (I.b), wherein $R^{4a}$ and $R^{4b}$ are each fluorine can be prepared as outlined in Scheme 1.

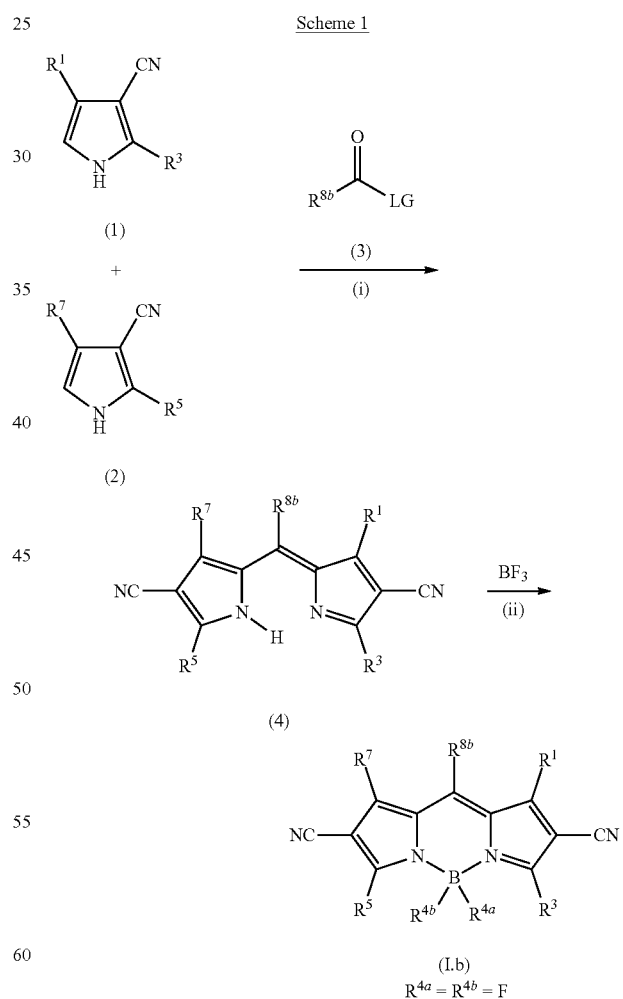

In Scheme 1, LG is a leaving group such as chloride, bromide or R'—C(=O)—O with R' being $C_1$-$C_8$-alkyl. The condensation of the activated carbonyl compound of formula (3) with a pyrrole of formula (1) and subsequently with a pyrrole of formula (2) in step (i) of Scheme 1 yields a dipyrromethene compound of formula (4). Without wishing to be bound to any theory, it is believed that the reaction of the activated carbonyl compound of formula (3) with the pyrrole of formula (1) affords a monoacylated pyrrole that then reacts with the pyrrole of formula (2). This monoacylated pyrrole is isolated in case the pyrrole of formula (1) is different from the pyrrole of formula (2). In step (ii) of Scheme 1, the compound of formula (4) readily complexes with a $BF_3$ source such as $BF_3$ etherate. Advantageously, the complexation is carried out in the presence of a base. Suitable bases are in particular secondary and tertiary amines, especially tertiary amines such as a tri($C_1$-$C_{10}$-alkyl)amine, in particular triethylamine or diisopropyl ethyl amine.

The compound of formula (1) can be prepared by a condensation reaction between an alpha amino ketone of formula (5) with an alpha cyano ketone of formula (6) as outlined in Scheme 2.

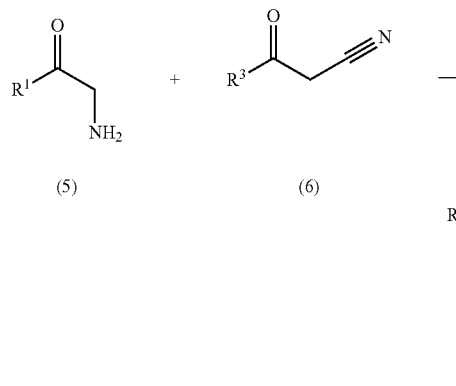

The compound of formula (2) can be prepared in an analogous manner as the compound of formula (1).

The compound of formula (5) can be prepared as outlined in Scheme 3 below starting from a 2-oxoaldehyde of formula (7). The condensation reaction of the 2-oxoaldehyde of formula (7) with hydroxylamine affords an 2-oxoaldoxime of formula (8). Subsequently, the compound of formula (8) is reduced to yield the amine of formula (5).

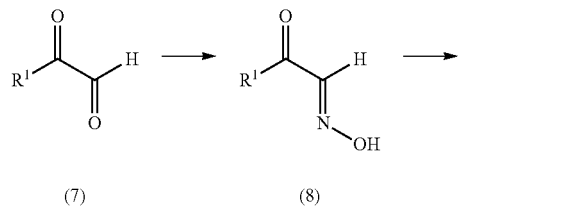

The compound of formula (6) can be prepared as outlined in Scheme 4 below by treating an ester of formula (9) with acetonitrile in the presence of a base.

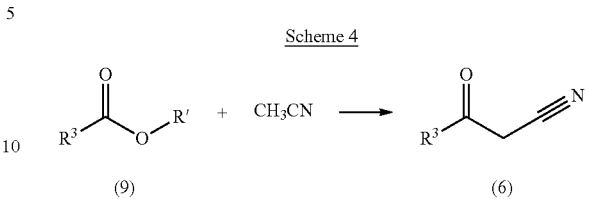

In Scheme 4, R' is $C_1$-$C_6$-alkyl, preferably $C_1$-$C_4$-alkyl.

Compounds of formula (I.c) can be prepared in a similar manner as compounds of formula (I.b) but starting from a 3-cyanopyrrole compound of formula (10), a 3-cyanopyrrole compound of formula (11) and a compound of formula (12) as depicted below in Scheme 5.

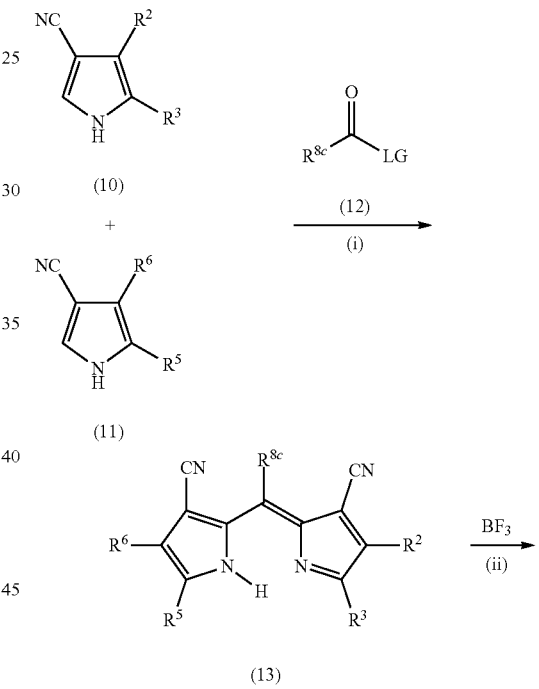

In Scheme 5, LG is a leaving group such as chloride, bromide or R'—C(=O)—O with R' being $C_1$-$C_6$-alkyl. The condensation reaction in step (i) of Scheme 5 is carried out in analogy to step (i) in Scheme 1. The complexation in step (ii) of Scheme 5 is carried out in analogy to step (ii) in Scheme 1.

The compound of formula (10) can be prepared as outlined below in Scheme 6. In step (i) of Scheme 6, the oxime of formula (14) is treated with 1,2-dichloroethane in the presence of a base, such as an alkalimetal or earth alkali metal hydroxide, e.g. KOH to give a pyrrole of a compound of formula (15). N-protection of the pyrrole of formula (15) in step (ii) of Scheme 6 to afford a N-protected pyrrole of formula (16) can be performed according to a method known per se, for example using a silylating reagent such as tert-butyldimethylsilyl chloride, triisopropylsilyl chloride or tert-butyldiphenylsilyl chloride. Bromination in step (iii) of Scheme 6, followed by nucleophilic substitution of bromine with a cyanide source in step (iv) and finally deprotection in step (v) of Scheme 6 gives the pyrrole compound of formula (10). The bromination in step (iii) of Scheme 6 can be carried out with bromine or N-bromosuccinimide. The bromination may be carried out in the presence of a base. The cyanide source in step (iv) of Scheme 6 may be copper(I) cyanide. The protection group PG can be removed in step (v) of Scheme 6 by a method known per se, for example a method described in T. Greene and P. Wuts, Protective Groups in Organic Synthesis (3$^{rd}$ ed.), John Wiley & Sons, NY (1999). For example, the silyl protection group can be removed by deprotecting agents selected from tetrabutyl ammonium bromide or tetrabutyl ammonium fluoride in the presence of solvent.

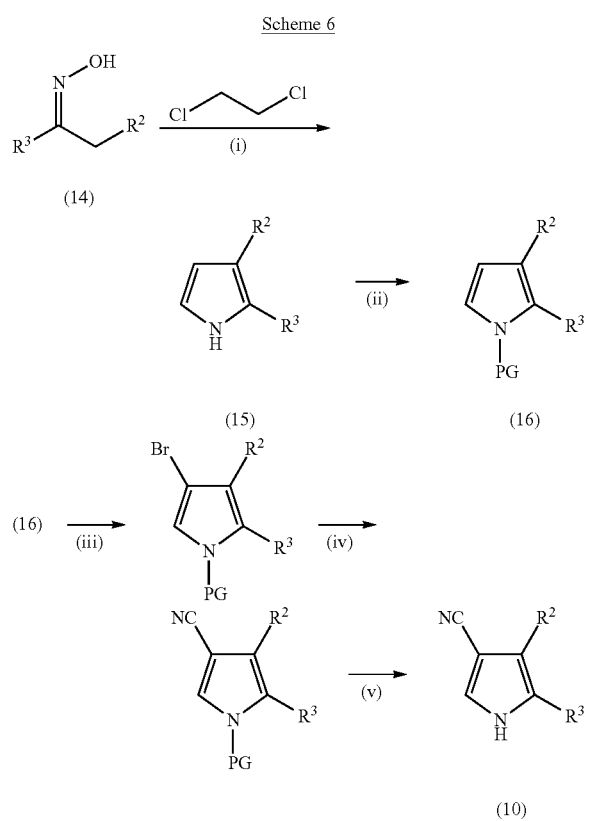

In Scheme 6, PG means a protection group, preferably a silyl protection group.

The compound of formula (11) can be prepared in analogy to the method for preparing the compound of formula (10) depicted in Scheme 6.

Alternatively, the compound of formula (I.b) can also be prepared by post functionalization of a dihalogenated boron dipyrrin of formula (17) as depicted in Scheme 7 below.

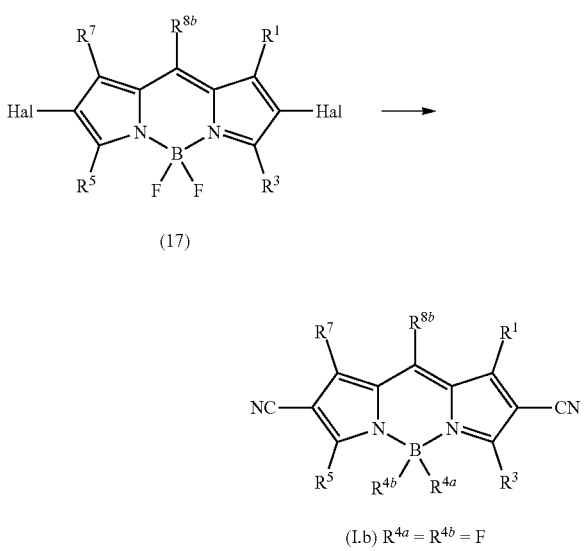

In Scheme 7, Hal is chlorine or bromine, preferably bromine. The cyanation of the compound of the formula (17) with the cyanide anion is carried out in the presence of a transition metal catalyst. A suitable cyanide source is zinc cyanide. Suitable transition metal catalysts are in particular palladium catalysts such as tetrakis(triphenylphosphine)palladium(0); bis[bis-(1,2-diphenylphosphino)ethane]palladium(0); bis(dibenzylideneacetone)palladium(0); tris(dibenzylideneacetone)dipalladium(0); bis(triphenylphosphine) palladium(II) chloride; bis(acetonitrile)palladium(II) chloride; [1,1'-bis(diphenylphosphino)ferrocene]-palladium (II) chloride/methylene chloride (1:1) complex; bis(bis-(1, 2-diphenylphosphino)butane]-palladium(II) chloride; palladium(II) acetate; palladium(II) chloride; and palladium(II) acetate/tri-o-tolylphosphine complex or mixtures of phosphines and Pd salts or phosphines and Pd-complexes e.g. dibenzylideneacetone-palladium and tri-tert-butylphosphine (or its tetrafluoroborate); tris(dibenzylideneacetone)dipalladium(0) and tri-tert-butylphosphine; palladium acetate and 1,2-bis(diphenylphosphino)ethane in the presence of tetramethylethylenediamine; or a polymer-bound Pd-triphenylphosphine catalyst system, e.g. tetrakistriphenylphosphinepalladium on polystyrene.

The reaction is usually carried out in a solvent. Suitable solvents are e.g. polar aprotic solvents, such as acetonitrile, nitrogen-containing heterocycles, N,N-disubstituted aliphatic carboxamides, preferably N,N-di($C_1$-$C_4$-alkyl)($C_1$-$C_4$)carboxamides) and N-alkyllactams such as dimethylformamide, diethylformamide, dimethylacetamide, dimethylbutyramide and N-methylpyrrolidone (NMP); nonpolar solvents such as ether, e.g. tetrahydrofuran or 1,4-dioxane, or aromatic solvents such as benzene, toluene or xylenes.

The compound of formula (17), wherein each Hal is bromine or each Hal is chlorine can be prepared as outlined in Scheme 8 below. The bromination of the compound of formula (18) may be carried out in analogy to step (iii) of Scheme 6. The compound of formula (17), wherein each Hal is chlorine can be prepared by treating the compound of formula (18) with N-chlorosuccinimide.

Scheme 8

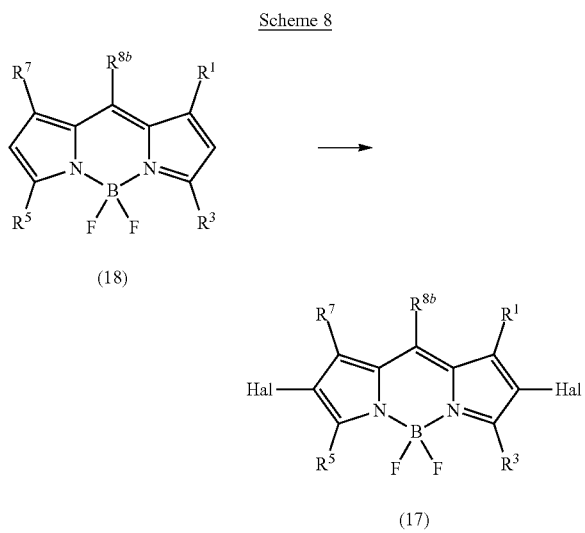

A compound of formula (I.a) can be prepared by post functionalization of a dihalogenated boron dipyrrin of formula (19) with a cyanation reagent such as trimethylsilyl cyanide in the presence of a Lewis acid such as tin tetrachloride as depicted in Scheme 9 below. The cyanation can be carried out in analogy to the method described in Biorg. Med. Chem. Lett. 18 (2008), 3112-3116.

Scheme 9

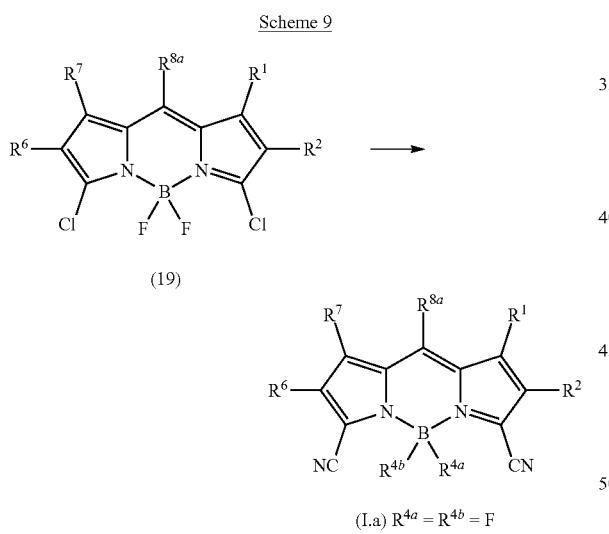

(I.a) $R^{4a} = R^{4b} = F$

Compounds of formula (19) can be prepared as outlined in Scheme 10. In step (i) of Scheme 10 the pyrroles of formulae (21) and (22) are reacted under acidic conditions with a hemiacetal of formula (20), wherein R* is $C_1$-$C_6$-alkyl to afford a dipyrromethane compound of formula (23). In step (ii) of Scheme 10, the dipyrromethane of formula (23) is treated with a chlorination agent such as N-chlorosuccinimide in tetrahydrofuran to give a dichloropyrromethane which carries in 3-,5-positions chlorine. Said compound, is subsequentially treated with an oxidizing agent such as 5,6-dicyano-1,4-benzoquinone to afford a dichloropyrromethene compound of formula (24) (step (iii) of Scheme 10). The complexation in step (iv) of Scheme 10 is carried out in analogy to step (ii) in Scheme 1.

Scheme 10

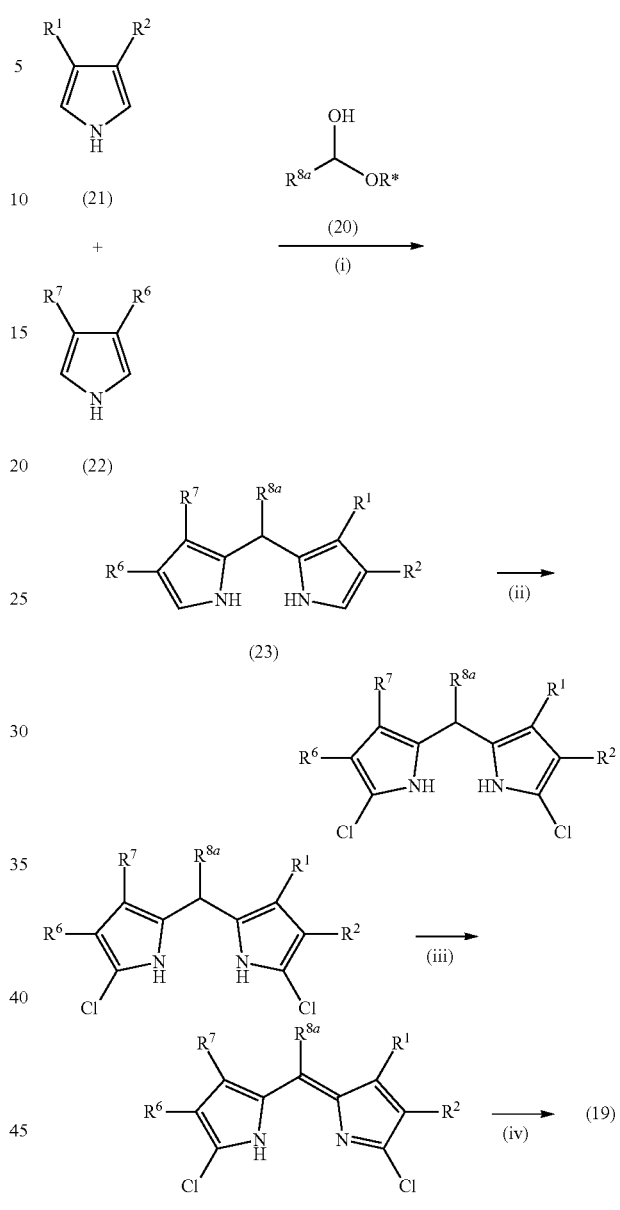

Compounds of formulae (I.a), (I.b) and (I.c), in which $R^{4a}$ and $R^{4b}$ are different from fluorine can be prepared by nucleophilic substitution of fluoride ions from boron:

Compounds of the formulae (I.a), (I.b) and (I.c), in which $R^{4a}$ and $R^{4b}$ are each chlorine can be prepared by treating compounds of the formulae (I.a), (I.b) and (I.c), in which $R^{4a}$ and $R^{4b}$ are each fluorine with boron trichloride in dichloromethane as described in Journal of Organic Chemistry, 2013, vol. 78(2), 757-761.

Compounds of the formulae (I.a), (I.b) and (I.c), in which $R^{4a}$ and $R^{4b}$ are each cyano can be prepared in a Lewis acid catalyzed nucleophil substitution reaction by treating compounds of the formulae (I.a), (I.b) and (I.c), in which $R^{4a}$ and $R^{4b}$ are each fluorine with a cyanation reagent such as trimethylsilyl cyanide in the presence of a Lewis acid such as boron trifluoride etherate or tin tetrachloride in analogy to the method described in Photochemical & Photobiological Sciences 2009, 8, 1006-1015 or Biorg. Med. Chem. Lett. 18 (2008), 3112-3116.

Compounds of the formulae (I.a), (I.b) and (I.c), in which $R^{4a}$ and $R^{4b}$ are each a radical $OR^{10}$ can be prepared by treating compounds of the formulae (I.a), (I.b) and (I.c), in which $R^{4a}$ and $R^{4b}$ are each fluorine with a metal alkoxide of the formula $MeOR^{10}$. Me is preferably an alkali metal. Usually, the reaction is carried out in a solvent. If $R^{10}$ is $C_1$-$C_{10}$-alkyl, the solvent ordinarily is an alkanol having from 1 to 10 carbon atoms. If $R^{10}$ is hydroxy-$C_1$-$C_{10}$-alkyl, the solvent ordinarily is an alkanediol having from 1 to 10 carbon atoms. Alternatively, compounds of the of the formulae (I.a), (I.b) and (I.c), in which $R^{4a}$ and $R^{4b}$ are each a radical $OR^{10}$ can be prepared by treating compounds of the formulae (I.a), (I.b) and (I.c), in which $R^{4a}$ and $R^{4b}$ are each fluorine with an alcohol of the formula $HOR^{10}$ in the presence of aluminium trichloride.

Compounds of the formulae (I.a), (I.b) and (I.c), in which $R^{4a}$ and $R^{4b}$ are each chlorine can also be prepared by complexation of the compound of formulae (4), (13) and (24), respectively, with boron trichloride.

A skilled person will readily appreciate that further compounds of formulae (I.a), (I.b) and (I.c) can be prepared using a method similar to the methods depicted above.

It may be advantageous to carry out the reactions described above in nitrogen or argon. Starting materials, if not commercially available, may be prepared by procedures selected from standard organic chemical techniques, techniques that are analogous to the synthesis of known, structurally similar compounds, or techniques that are analogous to the above described schemes or the procedures described in the synthetic examples section.

According to a preferred embodiment, the color converter additionally comprises at least one organic fluorescent dye B selected from
- (B1) an aryloxy-substituted perylene-3,4,9,10-tetracarboxylic acid diimide compound of the formula (III)

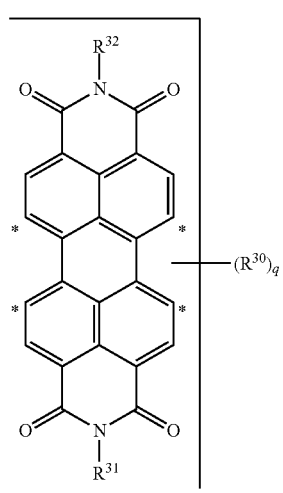

where
q is 1, 2, 3, or 4;
$R^{30}$ is aryloxy which is unsubstituted or mono- or polysubstituted by halogen, $C_1$-$C_{10}$-alkyl or $C_6$-$C_{10}$-aryl, where the $R^{30}$ radicals are at one or more of the positions indicated by *;

$R^{31}$ and $R^{32}$ are each independently $C_1$-$C_{10}$-alkyl, $C_3$-$C_8$-cycloalkyl, aryl, hetaryl, or aryl-$C_1$-$C_{10}$-alkylene, where the (het)aromatic ring in the three latter radicals is unsubstituted or mono- or polysubstituted by $C_1$-$C_{10}$-alkyl;
and mixtures thereof;
- (B2) a perylene-3,4,9,10-tetracarboxylic acid diimide compound of formula (IV)

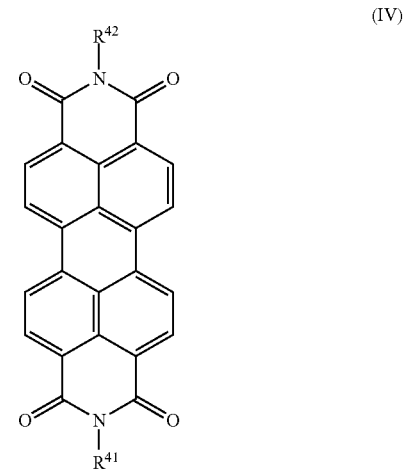

in which
$R^{41}$ and $R^{42}$ are each independently $C_1$-$C_{10}$-alkyl, $C_3$-$C_8$-cycloalkyl, aryl, hetaryl, or aryl-$C_1$-$C_{10}$-alkylene, where the (het)aromatic ring in the three latter radicals is unsubstituted or mono- or polysubstituted by $C_1$-$C_{10}$-alkyl;
- (B3) a perylene-3,4,9,10-tetracarboxylic acid diimide compound with rigid 2,2'-biphenoxy bridges of formula (V)

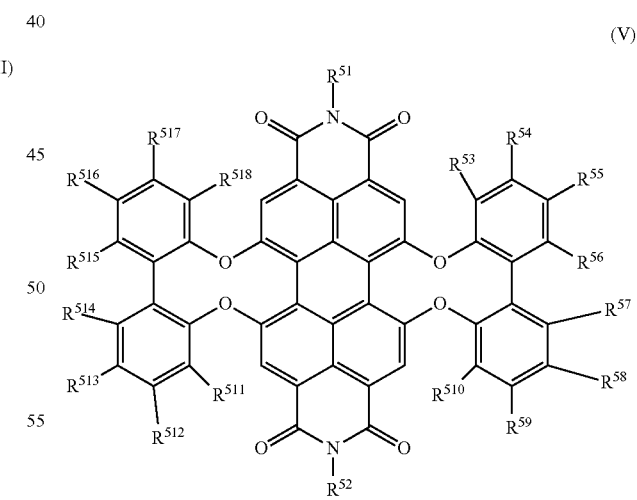

wherein
$R^{51}$ and $R^{52}$, independently of each other, are selected from hydrogen, in each case unsubstituted or substituted $C_1$-$C_3$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkyloxy, $C_6$-$C_{24}$-aryl or $C_6$-$C_{24}$-aryloxy;
$R^{53}$, $R^{54}$, $R^{55}$, $R^{56}$, $R^{57}$, $R^{58}$, $R^{59}$, $R^{510}$, $R^{511}$, $R^{512}$, $R^{513}$, $R^{514}$, $R^{515}$, $R^{516}$, $R^{517}$ and $R^{518}$ independently of each other, are selected from hydrogen, halogen, cyano, hydroxyl, mercapto, nitro, $-NE^{51}E^{52}$, $-NR^{Ar51}COR^{Ar52}$, $-CONR^{Ar51}R^{Ar52}$, $-SO_2NR^{Ar51}R^{Ar52}$, $-COOR^{Ar51}$, $-SO_3R^{Ar52}$, in each case unsubstituted or substituted $C_1$-$C_3$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkoxy, $C_6$-$C_{24}$-aryl, $C_6$-$C_{24}$-aryloxy or $C_6$-$C_{24}$-arylthio, where $R^{53}$ and $R^{54}$, $R^{54}$ and $R^{55}$, $R^{55}$ and $R^{56}$, $R^{56}$ and $R^{57}$, $R^{57}$ and $R^{58}$, $R^{58}$ and $R^{59}$, $R^{59}$ and $R^{510}$, $R^{511}$ and $R^{512}$, $R^{512}$ and $R^{513}$, $R^{513}$ and $R^{514}$, $R^{514}$ and $R^{515}$, $R^{515}$ and $R^{516}$, $R^{516}$ and $R^{517}$ and/or $R^{517}$ and $R^{518}$ together with the carbon atoms of the biphenylyl moiety to which they are bonded, may also form a further fused aromatic or non-aromatic ring system wherein the fused ring system is unsubstituted or substituted;

where $E^{51}$ and $E^{52}$, independently of each other, are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl;

$R^{Ar51}$ and $R^{Ar52}$, each independently of each other, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl;

or mixtures thereof.

Organic Fluorescent Dye (B1)

Suitable examples of compounds of formula (III) are for example the perylene derivatives specified in WO 2007/006717, especially at page 1, line 5 to page 22, line 6; in U.S. Pat. No. 4,845,223, especially col. 2, line 54 to col. 6, line 54; in WO 2014/122549, especially at page 3, line 20 to page 9, line 11; in EP 3072887 and in EP 16192617.5, especially at page 35, line 34 to page 37, line 29; in EP 17187765.7, especially at page 22, line 12 to page 24, line 3. The compounds of formula (III) are usually orange or red fluorescent dyes. Preferred are compounds of formula (III), wherein $R^{31}$ and $R^{32}$ are each independently selected from $C_1$-$C_{10}$-alkyl, 2,6-di($C_1$-$C_{10}$-alkyl)aryl and 2,4-di($C_1$-$C_{10}$-alkyl)aryl. More preferably, $R^{31}$ and $R^{32}$ are identical. Very particularly, $R^{31}$ and $R^{32}$ are each 2,6-diisopropylphenyl or 2,4-di-tert-butylphenyl. $R^{30}$ is preferably phenoxy, which is unsubstituted or substituted by 1 or 2 identical or different substituents selected from fluorine, chlorine, $C_1$-$C_{10}$-alkyl and phenyl. Preferably, q is 2, 3 or 4, in particular 2 or 4.

The compounds of formula (III) can be prepared in analogy to the methods described for example in WO 2007/006717, U.S. Pat. No. 4,845,223, EP 3072887 and WO 2014/122549.

Suitable organic fluorescent dyes (B1) are, for example, N,N'-bis(2,6-diisopropylphenyl)-1,6-di(2,6-diisopropylphenoxy)perylene-3,4:9,10-tetracarboximide, N,N'-bis(2,6-diisopropylphenyl)-1,7-di(2,6-diisopropylphenoxy)perylene-3,4:9,10-tetracarboximide, N,N'-bis(2,6-diisopropylphenyl)-1,6-di(p-tert-octylphenoxy)perylene-3,4:9,10-tetracarboximide, N,N'-bis(2,6-diisopropylphenyl)-1,7-di(p-tert-octylphenoxy)perylene-3,4:9,10-tetracarboximide, N,N' bis(2,6-diisopropyl¬phenyl)-1,6-diphenoxyperylene-3,4:9,10-tetracarboximide, N,N' bis(2,6-diisopropyl¬phenyl)-1,7-diphenoxyperylene-3,4:9,10-tetracarboximide, N,N'-bis(2,6-diisopropyl¬phenyl)-1,6-di(2,6-diphenylphenoxy)perylene-3,4;9,10-tetracarboximide, N,N' bis(2,6-diisopropyl¬phenyl)-1,7-di(2,6-diphenylphenoxy)perylene-3,4;9,10-tetracarboximide, N,N'-bis(2,6-diisopropylphenyl)-1,7-di(2,3-difluorophenoxy)perylene-3,4:9,10-tetracarboximide, N,N'-bis(2,6-diisopropylphenyl)-1,6,7,12-tetraphenoxyperylene-3,4:9,10-tetracarboximide, N,N'-bis(2,6-diisopropylphenyl)-1,6,7,12-tetra(2-phenylphenoxy)perylene-3,4:9,10-tetracarboximide, N,N'-bis(2,6-diisopropylphenyl)-1,6,7,12-tetra(2-isopropylphenoxy)perylene-3,4:9,10-tetracarboximide, N,N'-bis(2,6-diisopropylphenyl)-1,6,7,12-tetra(2-phenylphenoxy)perylene-3,4:9,10-tetracarboximide, N,N'-bis(2,6-diisopropylphenyl)-1,6,7,12-tetra(2,4-diphenylphenoxy)perylene-3,4:9,10-tetracarboximide; N,N'-bis(2,6-diisopropylphenyl)-1,6,7,12-tetra(3-fluorophenoxy)perylene-3,4:9,10-tetracarboximide, N,N'-bis(2,6-diisopropylphenyl)-1,6,7,12-tetra(3-chlorophenoxy)perylene-3,4:9,10-tetracarboximide, N,N'-bis(2,6-diisopropylphenyl)-1,6,7,12-tetra(2,3-difluorophenoxy)perylene-3,4:9,10-tetracarboximide, N,N'-bis(2,6-diisopropylphenyl)-1,6,7,12-tetra(2,5-difluorophenoxy)perylene-3,4:9,10-tetracarboximide, N,N'-bis(2,6-diisopropylphenyl)-1,6,7,12-tetra(2,6-difluorophenoxy)perylene-3,4:9,10-tetracarboximide, N,N'-bis(2,6-diisopropylphenyl)-1,6,7,12-tetra(2,3-dichlorophenoxy)perylene-3,4:9,10-tetracarboximide, N,N'-bis(2,6-diisopropylphenyl)-1,6,7,12-tetra(2,6-dichlorophenoxy)perylene-3,4:9,10-tetracarboximide, N,N'-bis(2,6-diisopropylphenyl)-1,6,7,12-tetra(2,5-dichlorophenoxy)perylene-3,4:9,10-tetracarboximide.

In particular, the organic fluorescent dye (B1) is selected from compounds of formulae (III-1), (III-2), (III-3) or (III-4).

(III-A)

-continued (III-2)

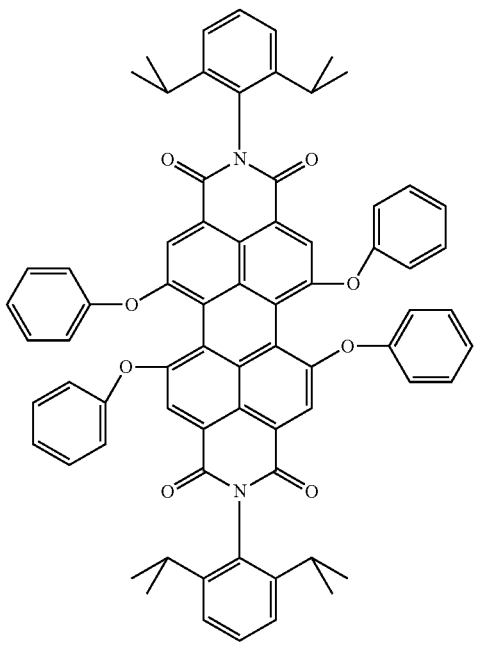

(III-3)

(III-4)

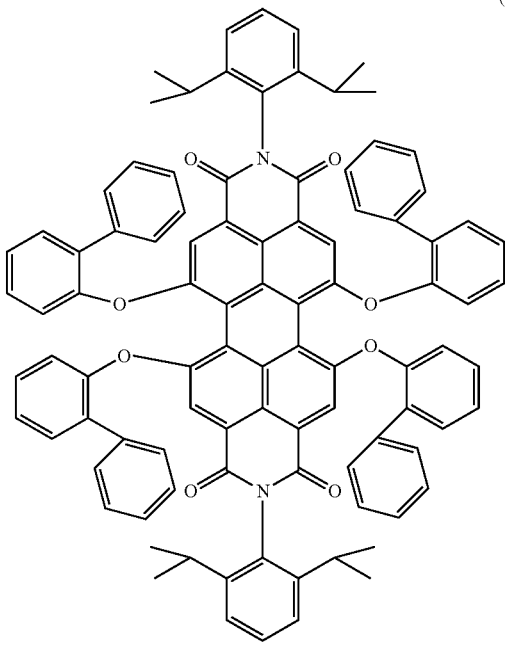

Organic Fluorescent Dye (B2)

Compounds of formula (IV) are well known in the art, e.g. from U.S. Pat. Nos. 4,379,934, 4,446,324 or EP 0657436. They can be prepared by conventional processes, for example by condensing perylene-3,4,9,10-tetracarboxylic acid or its dianhydride with amines. They are usually red fluorescent dyes. Preferably, in compounds of the formula (IV), $R^{41}$ and $R^{42}$ are a linear or branched $C_1$-$C_{18}$ alkyl radical, a $C_4$-$C_8$-cycloalkyl radical, phenyl or naphthyl wherein the aromatic ring in the two last mentioned radicals may be mono- or polysubstituted by linear or branched $C_1$-$C_{10}$-alkyl. Preferably, $R^{41}$ and $R^{42}$ have the same meaning. In one embodiment, $R^{41}$ and $R^{42}$ in formula (IV) represents compounds with what is called swallowtail substitution, as specified in WO 2009/037283 A1 at page 16 line 19 to page 25 line 8. In a preferred embodiment, $R^{41}$ and $R^{42}$, independently of each other, are a 1-alkylalkyl, for example 1-ethylpropyl, 1-propylbutyl, 1-butylpentyl, 1-pentylhexyl or 1-hexylheptyl. In another preferred embodiment, $R^{41}$ and $R^{42}$ are each 2,4-di(tert-butyl)phenyl 2,6-diisopropylphenyl or 2,6-di(tert-butyl)phenyl. A preferred compound of formula (IV) is N,N'-bis(2,6-diisopropylphenyl)-3,4,9,10-perylenetetracarboxylic diimide (CAS-number: 82953-57-9).

Organic Fluorescent Dye (B3)

Compounds of formula (V) are subject matter of WO 2017/121833. Compounds of formula (V) are usually red fluorescent dyes. Preference is given to compounds of formula (V), where $R^{51}$ and $R^{52}$ are, independently of each other, selected from phenyl which is unsubstituted or substituted by 1, 2 or 3 $C_1$-$C_6$-alkyl; and $R^{53}$, $R^{54}$, $R^{55}$, $R^{56}$, $R^{57}$, $R^{58}$, $R^{59}$, $R^{510}$, $R^{511}$, $R^{512}$, $R^{513}$, $R^{514}$, $R^{515}$, $R^{516}$, $R^{517}$ and $R^{518}$ are each hydrogen. The compound of formula (V) as defined above is preferably the compound of formula (V.1)

(V.1)

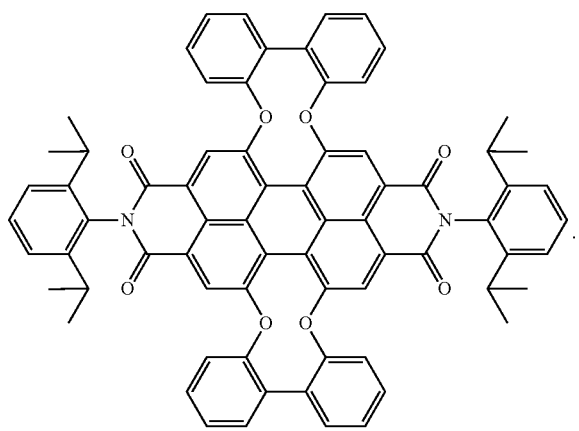

According to the invention, the color converters comprises a polymeric matrix material. Preferred polymers which serves as a matrix for the compounds of formulae (I.a), (I.b), and/or (I.c) are selected from a polystyrene, polycarbonate, polyacrylate, polymethacrylate, polyvinylpyrrolidone, polyvinyl acetate, polyvinyl chloride, polybutene, silicone, epoxy resin, vinyl ester resin, polyvinyl alcohol, poly(ethylene vinylalcohol)-copolymer, polyacrylonitrile, polyvinylidene chloride, polystyrene acrylonitrile, polybutylene terephthalate, polyethylene terephthalate, 2,5-furandicarboxylate polyester, polyvinyl butyrate, polyamide, polyoxymethylene, polyimide, polyetherimide or mixtures thereof.

In an embodiment of the invention, suitable polymeric matrix materials are optically transparent.

In another embodiment, suitable polymeric matrix materials are optically opaque.

The term "silicone" is also known as term "(poly)siloxane".

Especially, the polymeric matrix material consists essentially or completely of polystyrene, polycarbonate, polyethylene terephthalate or polyethylene furanoate.

Polystyrene is understood here to mean, inter alia, all homo- or copolymers which result from polymerization of styrene and/or derivatives of styrene. Derivatives of styrene are, for example, alkylstyrenes such as alpha-methylstyrene, ortho-, meta-, para-methylstyrene, para-butylstyrene, especially para-tert-butylstyrene, alkoxystyrene such as para-methoxystyrene, para-butoxystyrene, para-tert-butoxystyrene. In general, suitable polystyrenes have a mean molar mass Mn of 10 000 to 1 000 000 g/mol (determined by GPC), preferably 20 000 to 750 000 g/mol, more preferably 30 000 to 500 000 g/mol.

In a preferred embodiment, the matrix of the color converter consists essentially or completely of a homopolymer of styrene or styrene derivatives. More particularly, the polymeric matrix material completely consists of polystyrene.

In a further preferred embodiments of the invention, the polymeric matrix material consists essentially or completely of a styrene copolymer, which are likewise regarded as polystyrene in the context of this application. Styrene copolymers may comprise, as further constituents, for example, butadiene, acrylonitrile, maleic anhydride, vinylcarbazole or esters of acrylic, methacrylic or itaconic acid as monomers. Suitable styrene copolymers generally comprise at least 20% by weight of styrene, preferably at least 40% and more preferably at least 60% by weight of styrene. In another embodiment, they comprise at least 90% by weight of styrene.

Preferred styrene copolymers are styrene-acrylonitrile copolymers (SAN) and acrylonitrile-butadiene-styrene copolymers (ABS), styrene-1,1'-diphenylethene copolymers, acrylic ester-styrene-acrylonitrile copolymers (ASA), methyl methacrylate-acrylonitrile-butadiene-styrene copolymers (MABS). A further preferred polymer is alpha-methylstyrene-acrylonitrile copolymer (AMSAN). The styrene homo- or copolymers can be prepared, for example, by free-radical polymerization, cationic polymerization, anionic polymerization or under the influence of organometallic catalysts (for example Ziegler-Natta catalysis). This can lead to isotactic, syndiotactic or atactic polystyrene or copolymers. They are preferably prepared by free-radical polymerization. The polymerization can be performed as a suspension polymerization, emulsion polymerization, solution polymerization or bulk polymerization. The preparation of suitable polystyrenes is described, for example, in Oscar Nuyken, Polystyrenes and Other Aromatic Polyvinyl Compounds, in Kricheldorf, Nuyken, Swift, New York 2005, p. 73-150 and references cited therein; and in Elias, Macromolecules, Weinheim 2007, p. 269-275.

In another preferred embodiment, the polymeric matrix material consists essentially or completely of polyethylene terephthalate. Polyethylene terephthalate is obtainable by condensation of ethylene glycol with terephthalic acid or by an ester exchange reaction between dimethyl terephthalate and ethylene glycol. Preferably, the polymer completely consists of polyethylene terephthalate.

Likewise more particularly, the polymeric matrix material consists essentially or completely of polycarbonate. More preferably, the polymeric matrix material completely consists of polycarbonate. Polycarbonates are polyesters of carbonic acid with aromatic or aliphatic dihydroxyl compounds. Preferred dihydroxyl compounds are, for example, methylenediphenylenedihydroxyl compounds, for example bisphenol A. One means of preparing polycarbonates is the reaction of suitable dihydroxyl compounds with phosgene in an interfacial polymerization. Another means is the reaction with diesters of carbonic acid such as diphenyl carbonate in a condensation polymerization. The preparation of suitable polycarbonates is described, for example, in Elias, Macromolecules, Weinheim 2007, p. 343-347.

Likewise more particularly, the polymeric matrix material consists essentially or completely of 2,5-furandicarboxylate polyester. 2,5-Furandicarboxylate polyesters are obtainable by reacting (i) at least one diol selected from the group consisting of an aliphatic $C_2$-$C_{20}$-diol and a cycloaliphatic $C_3$-$C_{20}$-diol, with (ii) 2,5-furandicarboxylic acid and/or an ester forming derivative thereof and (iii) optionally at least one further dicarboxylic acid selected from the group consisting of 1,2-cyclohexanedicarboxylic acid, 1,4-cyclohexanedicarboxylic acid, 3,4-furandicarboxylic acid, terephthalic acid and 2,6-naphthalic acid and/or an ester forming derivative thereof.

Suitable aliphatic $C_2$-$C_{20}$-diols are preferably linear or branched $C_2$-$C_{15}$-alkanediols, especially linear or branched $C_2$-$C_{10}$-alkanediols such as ethane-1,2-diol (ethylene glycol), propane-1,2-diol, propane-1,3-diol (propylene glycol), butane-1,3-diol, butane-1,4-diol (butylene glycol), 2-methyl-1,3-propanediol, pentane-1,5-diol, 2,2-dimethyl-1,3-propanediol (neopentyl glycol), hexane-1,6-diol, heptane-1,7-diol, octane-1,8-diol, nonane-1,9-diol, decane-1,10-diol, etc. Suitable cycloaliphatic $C_3$-$C_{20}$-diols are preferably $C_3$-$C_{10}$-cycloalkylenediols, such as 1,2-cyclopentanediol, 1,3-cyclopentanediol, 1,2-cyclohexanediol, 1,4-cyclohexanediol, 1,2-cycloheptanediol or 1,4-cycloheptanediol. Other suitable cycloaliphatic $C_3$-$C_{20}$-diols include 1,3-cyclohexane dimethanol and 1,4-cyclohexane dimethanol, or 2,2,4,4-tetramethyl-1,3-cyclobutanediol, or combinations thereof. Particularly preferred diols are $C_2$-$C_6$-alkanediols, in particular ethane-1,2-diol, propane-1,2-diol, propane-1,3-diol, butane-1,3-diol, butane-1,4-diol, pentane-1,5-diol, 2,2-dimethyl-1,3-propanediol and mixtures thereof. More particularly preferred are ethane-1,2-diol and propane-1,3-diol, especially ethane-1,2-diol.

More particularly preferred are also biologically derived ("bio-derived") $C_2$-$C_{10}$-alkanediols, especially $C_2$-$C_6$-alkanediols such as ethane-1,2-diol and propane-1,3-diol. Bio-based ethane-1,2-diol may be obtained from a lignocellulosic biomass source by the conversion of the carbohydrates therein contained. Methods for preparing $C_2$-$C_{10}$-alkanediols from biomass are known in the art, for example from US 2011/0306804.

Preferably, the diol component (i) is made up exclusively of one diol mentioned as preferred, especially ethane-1,2-diol. The diol component (i) may also comprise two, three or more than three different diols. If two, three or more than three different diols are used, preference is given to those mentioned above as being preferred. In this case, based on the total weight of component (i), ethane-1,2-diol is preferably the major component.

Ester forming derivatives of 2,5-furandicarboxylic acids are especially $C_1$-$C_{10}$-dialkyl esters of 2,5-furandicarboxylic acid. Particularly preferred diesters are $C_1$-$C_6$-dialkyl esters of 2,5-furandicarboxylic acid, especially the dimethyl ester and diethyl ester. Component (ii) may also comprise two, three or more than three different diesters of 2,5-furandicarboxylic acid. 2,5-Furandicarboxylic acid can be produced from bio-based sugars. Routes for the preparation of 2,5-furandicarboxylic acid using air oxidation of 2,5-disubstituted furans such as 5-hydroxymethylfurfural with catalysts comprising Co, Mn and/or Ce were reported recently in WO 2010/132740, WO 2011/043660, WO 2011/043661, US 2011/0282020, US 2014/0336349 and WO 2015/137804. Routes for the preparation of dialkyl ester of 2,5-furandicarboxylic acid are also described for example in WO 2011/043661.

Preferably, the polymer is made up exclusively of (i) one diol selected from the group consisting of an aliphatic $C_2$-$C_{20}$-diol and a cycloaliphatic $C_3$-$C_{20}$-diol and (ii) a 2,5-furandicarboxylic acid or of diester(s) of 2,5-furandicarboxylic acid.

Preferably, the 2,5-furandicarboxylate polyester is selected from the group consisting of poly(ethylene-2,5-furandicarboxylate), poly(propylene-2,5-furandicarboxylate), poly(ethylene-co-propylene-2,5-furandicarboxylate), poly(butylene-2,5-furandicarboxylate), poly(pentylene-2,5-furandicarboxylate), poly(neopentylene-2,5-furandicarboxylate) and mixtures thereof. In particular, the polymeric matrix material for use in the color converter according to the invention can consist of or can consist essentially of from poly(ethylene-2,5-furandicarboxylate), poly(trimethylene-2,5-furandicarboxylate) and poly(butylene-2,5-furandicarboxylate). Especially, the polymeric matrix material for use in the color converter according to the invention consists of poly(ethylene-2,5-furandicarboxylate). In a further specific embodiment, the polymeric matrix material of the color converter comprises a mixture (blend) of different 2,5-furandicarboxylate polyesters as defined above, for example, a blend of poly(ethylene-2,5-furandicarboxylate) and poly(propylene-2,5-furandicarboxylate). Poly(propylene-2,5-furandicarboxylate) is also referred to as poly(trimethylene 2,5-furandicarboxylate); poly(butylene-2,5-furandicarboxylate) is also referred to as poly (tetramethylene 2,5-furan-dicarboxylate), poly(pentylene-2,5-furandicarboxylate) is also referred to as poly (pentamethylene 2,5-furan-dicarboxylate).

Likewise suitable are 2,5-furandicarboxylate polyesters obtainable by reacting at least one diol component (i) as defined above, component (ii) as defined above and at least one further diacid or diester component (iii) selected from the group consisting of 1,2-cyclohexanedicarboxylic acid, 1,4-cyclohexanedicarboxylic acid, 3,4-furandicarboxylic acid, terephthalic acid and 2,6-naphthalic acid and/or an ester forming derivative thereof. Ester forming derivative of 1,2-cyclohexanedicarboxylic acid, 1,4-cyclohexanedicarboxylic acid, 3,4-furandicarboxylic acid, terephthalic acid and 2,6-naphthalic acid are especially the $C_1$-$C_{10}$-dialkyl ester. Particularly preferred esters are $C_1$-$C_6$-dialkyl ester, especially the dimethyl ester and diethyl ester. When using a combination of component (ii) and component (iii), component (ii) is the major component based on the total weight of component (ii) and (iii). Examples are poly(ethylene-2,5-furandicarboxylate-co-1,2-cyclohexanedicarboxylate), poly(ethylene-2,5-furandicarboxylate-co-1,4-cyclohexanedicarboxylate), poly(ethylene-2,5-furandicarboxylate-co-terephthalate), poly(ethylene-2,5-furandicarboxylate-co-2,6-naphthalate) or poly(ethylene-2,5-furandicarboxylate-co-3,4-furandicarboxylate), preferably poly(ethylene-2,5-furandicarboxylate-co-terephthalate), poly(ethylene-2,5-furandicarboxylate-co-2,6-naphthalate) or poly(ethylene-2,5-furandicarboxylate-co-3,4-furandicarboxylate.

The 2,5-furandicarboxylate polyester (A) can be prepared as described in U.S. Pat. No. 2,551,731.

An example for a polymethacrylate is polymethylmethacrylate (PMMA).

In particular, for use in lighting applications, the polymeric matrix material consists of polystyrene.

Likewise in particular, for use in lighting applications, the polymeric matrix material consists of polycarbonate.

Likewise in particular, for use in lighting applications, the polymeric matrix material consists of polyethylene terephthalate.

Likewise in particular, for use in lighting applications, the polymeric matrix material consists of polyethylene furanoate.

In a preferred embodiment of the invention, the color converters comprises at least one light scattering agent. With regard to suitable and in particular preferred light scattering agents, reference is made to what is said below.

In particular, for use in display applications, the polymeric matrix material is polystyrene or a polystyrene based resin such as the reaction product of a copolymer of styrene, alpha-methylstyrene and acrylic acid, or a copolymer of methyl methacrylate and acrylic acid with 3,4-epoxycyclohexylmethyl (meth)acrylate, or a mixture thereof.

Likewise in particular, for use in display applications, the polymeric matrix material consists of an homo- or copolymeric acrylate and methacrylate, respectively, especially polyacrylate, polymethyl methacrylate or polymethacrylate.

Likewise in particular, for use in display applications, the polymeric matrix material consists of polycarbonate.

Likewise in particular, for use in display applications, the polymeric matrix material consists of polyethylene terephthalate.

Especially for use in display applications, the polymeric matrix material consists of a vinyl ester resin. Vinyl ester resins also known as epoxy acrylate resins, are understood here to mean unsaturated resins made from the reaction of unsaturated carboxylic acids (ordinarily (meth)acrylic acid) with an epoxy resin. Ordinarily, vinyl ester resins have an epoxy resin backbone with high molecular weight and the vinyl esters have terminal unsaturation. Example of commercial product is the acrylate resin Ripoxy® SPC-2000, available from Showa Denko K.K, Japan.

The term "(meth)acrylic acid" used is meant to refer to the acrylic acid as well as to the corresponding methacrylic acid.

Likewise especially for use in display devices, the polymeric matrix material comprises a reaction product of a polymerizable (curable) composition. Preferably, the polymeric matrix material consists of the reaction product of a curable resin composition. The curable resin composition preferably is a photosensitive resist composition comprising at least one binder, at least one reactive monomer, at least one photoinitiator and/or photoacid-generator. Preferably, the photosensitive resist composition additionally comprises at least one additive selected from a thermal radical initiator, an organic solvent, a dispersant, a surfactant, a light scattering agent or mixtures thereof.

Examples of suitable binders include unsaturated polyester; vinyl ester resins (epoxy acrylate resins); novolac resins; polyvinyl phenol resins; carboxyl-group containing urethane resins, or a mixture thereof. Examples are, for example, disclosed in WO 2008/101841, page 18, line 28 to page 25, line 21 or US 2015/0183955, paragraph [0100] to paragraph [0101]. Suitable binders are also polyimides, polyetherimides, epoxy resins, silicones and the like.

A preferred binder is an acrylic resin having carboxylic acid function as a pendant group. Examples are, for example, disclosed in WO 2010/108835, page 4, line 11 to page 11, line 5. Example of commercial product, for example, is Ripoxy®SPC-1000, provided by Showa Denko, K.K., Japan.

The amount of the binder present in the curable composition ranges from 5 to 95%, preferably 10 to 90% by weight based on the total amount of the solid contents in the photosensitive resist composition.

Examples of suitable reactive monomers include aromatic vinyl compounds such as styrene, alpha-methylstyrene, unsaturated carboxylates such as methyl (meth)acrylate, unsaturated aminoalkyl carboxylate, unsaturated glycidyl carboxylates, unsaturated amides and unsaturated imides, macromonomers having a mono(meth)acryloyl group at the terminal of a polymer molecular chain and polysiloxanes and mixtures thereof. Examples are, for example, described in US 2015/0183955, paragraph [0102].

Examples of suitable reactive monomers include also any acrylate-type monomer. Examples are, for example, those described in WO 2010/108835, page 11, line 13 to page 14, line 13. Preferred monomers include multifunctional (meth) acrylate monomers or oligomers such as dipropyleneglycol diacrylate, 1,6-hexanediol diacrylate, trimethylolpropane triacrylate, pentaerythritol tetraacrylate, dipentaerythritol pentaacrylate, dipentaerythritol hexaacrylate, di-trimethylolpropane tetraacrylate, pentaerythritol triacrylate, tris(2-hydroxy ethyl) isocyanurate triacrylate and mixtures thereof.

The amount of the reactive monomer present in the curable composition ranges from 5 to 70%, preferably 5 to 50%, more preferably 7 to 30% by weight, based on the total amount of the solid contents in the radically photosensitive resist composition.

The use of a photoinitiator is not critical. The potoinitiator is a compound which generates radicals which initiates curing processes upon being irradiated with light. The photoinitiator ordinarily is selected from the group consisting of benzophenones, aromatic alpha-hydroxyketones, benzilketals, aromatic alpha-aminoketones, phenylglyoxalic acid esters, mono-acylphosphinoxides, bis-acylphosphinoxides, tris-acylphosphinoxides, oximesters derived from aromatic ketones and/or oximesters of the carbazol type. Examples are, for example, described in WO 2010/108835, page 15, line 6 to page 17, line 13 or WO 2010/081749, page 7, line 11 to page 10, line 3. One kind of photoinitiator may be solely used or two or more kinds may be used in combination.

In one embodiment, the photoinitiator is 1-[4-(phenylthio) phenyl]-,2-(O-benzyloxime) (IRGACURE OXE01®, CAS Number: 253585-83-0; available from BASF SE).

The total amount of the photoinitiator preferably is from 0.01-10% by weight, more preferably 0.05-8% by weight and most preferably 0.5 to 5% by weight, based on the total amount of the solid contents in the photosensitive resist composition.

In some embodiments, the photosensitive resist compositions disclosed herein may further comprise at least photoacid generator. A photoacid generator is a compound which generates an acid upon being irradiated with light, and various photoacid generators are commercially available. Suitable example of photoacid generators are organic onium salts, such as sulfonium, iodonium, selenium, ammonium, and phosphonium cations, and anions.

In some embodiments, the photosensitive resist composition disclosed herein may further include a thermal radical initiator like peroxides or hydroxylamine esters, as described for example in WO 2010/108835, page 17, line 15 to page 35, line 20.

In some embodiments, the photosensitive resist composition disclosed herein may further include at least one solvent. Examples of suitable solvents are ethylene glycol monomethyl ether acetate, propylene glycol monomethyl ether acetate, propylene glycol monoethyl ether acetate, diethylene glycol dimethyl ether, cyclohexanone, 2-heptanone, 3-heptanone, ethyl 2-hydroxypropionate, 3-methyl-3-methoxybutyl propionate, ethyl 3-methoxypropionate, methyl 3-ethoxypropionate, ethyl 3-ethoxypropionate, n-butyl acetate, isobutyl acetate, n-amyl acetate, isoamyl acetate, n-butyl propionate, ethyl butyrate, isopropyl butyrate, n-butyl butyrate, and ethylpyruvic acid and combinations thereof.

The amount of solvent, if present, is from 1 to 80%, based on the total weight of the photosensitive resist composition.

In some embodiments, the photosensitive resist composition disclosed herein may further include at least one dispersant and may further include at least one surfactant. A suitable surfactant is, for example, a cationic, anionic, non-ionic or amphoteric surfactant, or a silicone-based or fluorine-based surfactant. Examples of suitable surfactants include polyoxyethylene alkyl ethers such as polyoxyethylene lauryl ether, polyoxyethylene stearyl ether and polyoxyethylene oleyl ether; polyoxyethylene alkylphenyl ethers such as polyoxyethylene octylphenyl ether and polyoxyethylene nonylphenyl ether; polyethylene glycol diesters such as polyethylene glycol dilaurate and polyethylene glycol distearate; sorbitan fatty acid esters; fatty acid modified polyesters; tertiary amine modified polyurethanes; polyethylene imines; and the like.

Examples of suitable dispersants are polymeric dispersants. Examples are polycarboxylates such as high molecular polyacrylates; unsaturated polyamides; (partial) amine salts, ammonium salts and alkyl amine salts of polycarboxylic acids; polysiloxanes; long-chain polyaminoamide phosphates; hydroxyl group-containing polycarboxylates; and modified products thereof; amides formed by reacting polyesters having a free carboxylic acid group with poly(lower alkylene imines) and salts thereof; and the like. In one embodiment, the dispersant is EFKA® 4300, an acrylic block copolymer, available from BASF SE, Germany.

In a preferred embodiment, the preparation of the polymers has been carried out in the absence of oxygen. Preferably, the monomers during the polymerization comprised a total of not more than 1000 ppm of oxygen, more preferably not more than 100 ppm and especially preferably not more than 10 ppm.

The polymeric matrix material may comprise, as further constituents, additives such as flame retardants, antioxidants, light stabilizers, UV absorbers, free-radical scavengers, antistats. Stabilizers of this kind are known to those skilled in the art.

Suitable antioxidants or free-radical scavengers are, for example, phenols, especially sterically hindered phenols such as butylhydroxyanisole (BHA) or butylhydroxytoluene (BHT), or sterically hindered amines (HALS). Stabilizers of this kind are sold, for example, by BASF under the Irganox® trade name. In some cases, antioxidants and free-radical scavengers can be supplemented by secondary stabilizers such as phosphites or phosphonites, as sold, for example, by BASF under the Irgafos® trade name.

Suitable UV absorbers are, for example, benzotriazoles such as 2-(2-hydroxyphenyl)-2H-benzotriazole (BTZ), triazines such as (2-hydroxyphenyl)-s-triazine (HPT), hydroxybenzophenones (BP) or oxalanilides. UV absorbers of this kind are sold, for example, by BASF under the Uvinul® trade name.

In a preferred embodiment of the invention, the polymeric matrix material does not comprise any antioxidants or free-radical scavengers.

In an embodiment of the invention, the polymeric matrix material comprises a light scattering agent. Suitable light scattering agents are inorganic white pigments, for example titanium dioxide, barium sulfate, lithopone, zinc oxide, zinc sulfide, calcium carbonate with a mean particle size to DIN 13320 of 0.01 to 10 µm, preferably 0.1 to 1 µm, more preferably 0.15 to 0.4 µm. These light scattering agents are included typically in an amount of 0.01 to 2.0% by weight, preferably 0.05 to 0.5% by weight, more preferably 0.1 to 0.4% by weight, based in each case on the polymer matrix comprising scattering bodies.

Examples of suitable organic light scattering agents include those based on poly(acrylates); poly (alkyl methacrylates), for example poly(methyl methacrylate) (PMMA); poly (tetrafluoroethylene) (PTFE); silicone-based scattering agents, for example hydrolyzed poly(alkyl trialkoxysilanes), and mixtures thereof. The size of these light scattering agents (average diameter-weight average) is usually in the range from 0.5 to 50 µm, preferably 1 to 10 µm. These light scattering agents are typically included in an amount of 1 to 10% by weight, based in each case on the polymer of the layer comprising scattering bodies. Useful light scattering agents are for example a mixture of 3-5% by weight of PMMA based scattering agent and 1.5 to 2% by weight of silicone based scattering agent.

Also suitable are light-scattering compositions which contain polymeric particles based on vinyl acrylate with a core/shell morphology in combination with $TiO_2$ as described in EP-A 634 445.

According to a preferred embodiment, the color converter additionally comprises at least one light scattering agent.

The polymers mentioned above serve as a matrix material for the compounds of formulae (I.a), (I.b), (I.c) or mixtures thereof and, if present, organic fluorescent dyes B described herein above or inorganic fluorescent material described herein after. In a preferred embodiment, the color converters comprise, at least one fluorescent dye of the formulae (I.a), (I.b), (I.c) or mixtures thereof and at least one organic fluorescent dye B.

The concentration of the fluorescent compound selected from a compound of formulae (I.a), (I.b), (I.c) or mixtures thereof in the polymeric matrix material depends on factors including absorption intensity at the excitation wavelength of the compound of the formulae (I.a), (I.b) and (I.c) and the thickness of the layer formed. If the layer is thin, the concentration of the at least one compound of the formulae (I.a), (I.b), (I.c) or mixtures thereof is generally higher than in the case of a thick layer. The total concentration of the compound(s) of the formulae (I.a), (I.b), (I.c) or mixtures thereof in the color conversion layer according to the present invention is usually in the range from 0.0005 to 8% by weight, preferably 0.001 to 5% by weight, more preferably 0.001 to 1% by weight, based on the total polymer weight of the polymeric matrix material.

Specially, for use in general lighting applications, the concentration of the green-emitting compound of the formulae (I.a), (I.b), (I.c) or mixtures thereof typically in the color converter is in the range from 0.001 to 0.8% by weight, preferably 0.002 to 0.6% by weight, more preferably 0.003 to 0.5% by weight, based on the total polymer content of the polymeric matrix material.

Typically, for use in general lighting applications, if at least one dye B is present, the total amount of dye B is in the range from 0.0001 to 0.5% by weight, preferably 0.001 to 0.1% by weight, based on the amount of polymer used. The ratio of compound of formulae (I.a), (I.b), (I.c) or mixtures thereof to the total amount of dye (B) present in the color converter is typically in the range from 1:1 to 20:1, preferably 2:1 to 15:1, more preferably 2:1 to 10:1, such as 2:1 to 6:1. A skilled person will readily appreciate that the ratio of the dyes depends on the chosen light source and the desired correlated color temperature. For a desired CCT, the ratio of compound of formulae (I.a), (I.b), (I.c) or mixtures thereof to dye B is much greater, if the light is generated by a blue LED with a center wavelength of emission between 400 nm and 480 nm in comparison to the ratio of the compound of formulae (I.a), (I.b), (I.c) or mixtures thereof to dye B, if the light is generated by a white LED having a CCT between 3 000 to 20 000 K.

Specially, for use in display applications, the concentration of the green-emitting compound of formulae (I.a), (I.b), (I.c) and mixtures thereof in the color converter, is preferably 0.005 to 5% by weight, more preferably 0.01 to 0.5% by weight, based on the total polymer weight of the polymeric matrix material.

In a specific embodiment, for use in display devices, the color converter comprises at least one dye B. In some embodiments, the compound of formulae (I.a), (I.b), (I.c) or mixtures thereof and the fluorescent dye B are present in various layers of the color converter. The compound of formulae (I.a), (I.b), (I.c) or mixtures thereof needs to be present in relatively higher content than the at least one dye B. According to this embodiment of the present invention, the total amount of the at least one fluorescent dye B typically is 0.001 to 2% by weight, preferably 0.001 to 0.8%, more preferably 0.002 to 0.5% by weight, based on the total amount of polymer used in the polymeric matrix material.

According to a further embodiment, the color converter according to the present invention may optionally or alternatively comprise as further fluorescent material at least one inorganic fluorescent material. The at least one inorganic fluorescent material is preferably selected from the group consisting of garnets, silicates, sulfides, nitrides and oxynitrides.

Suitable examples of garnets, silicates, sulfides, nitrides and oxynitrides are compiled in table I below:

TABLE I

| Class | Compounds | Excitation Peak [nm] | Emission Peak [nm] | Reference |
|---|---|---|---|---|
| Garnets | YAG:Ce ($Y_3Al_5O_{12}$:Ce) | 460-470 | 550 | U.S. Pat. No. 5,998,925 |
| | (Y, Gd, Tb, Lu)$_3Al_5O_{12}$:Ce | | | |
| | TAG:Ce ($Tb_3Al_5O_{12}$:Ce) | 460-470 | 575 | U.S. Pat. No. 6,669,866, U.S. Pat. No. 6,812,500, U.S. Pat. No. 6,576,930, U.S. Pat. No. 6,245,259, U.S. Pat. No. 6,765,237 |
| Silicates | Eu-doped Silicates $A_2Si(OD)_4$:Eu with A = Sr, Ba, Ca, Mg, Zn and D = F, Cl, S, N, Br | <460 | 510 to 610 | U.S. Pat. No. 7,311,858, U.S. Pat. No. 7,267,787 |
| | (SrBaCa)$_2SiO_4$:Eu | | | |
| | $Sr_3SiO_5$ | | | U.S. Pat. No. 6,809,347, |
| | $Ba_2MgSi_2O_7$:$Eu^{2+}$; | | | U.S. Pat. No. 6,943,380 |
| | $Ba_2SiO_4$:$Eu^{2+}$ | | | U.S. Pat. No. 6,429,583 |
| | (Ca, Ce)$_3$(Sc, Mg)$_2Si_3O_{12}$ | | | WO 02/11214 |
| Sulfides | (Ca, Sr)S:Eu | <460 | 615-660 | |
| Nitrides | (CaAlSiN$_3$:Eu$^2$) | 455 | red | |
| | (Sr, Ca)AlSiN$_3$:$Eu^{2+}$ | | orange | WO2005052087 |
| Oxy-nitrides | SiAlON:Ce | 300-580 | 490 | |
| | β-SiAlON:Eu | | 540 | |
| | Ca-alpha-SiAlON:Eu | | 585-595 | |
| | ($Ba_3Si_6O_{12}N_2$:Eu) | | | |
| | General formula $Ca_xEu_y(Si, Al)_{12}(O, N)_{16}$ | | | |

According to a further embodiment, the inventive color converter comprises at least one quantum dot. Quantum dots are nanocrystals of a semiconductor material having a diameter of about 20 nm or less. The quantum dot may include one of a Si-based nanocrystal, a group II-VI compound semiconductor nanocrystal, a group III-V compound semiconductor nanocrystal, a group IV-VI compound nanocrystal and a mixture thereof. The group II-VI compound semiconductor nanocrystal may include one selected from a group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe and HgZnSTe. The group III-V compound semiconductor nanocrystal may include one selected from a group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. The IV-VI compound semiconductor nano crystal may be SnTe.

To synthesize a nanocrystal in form of a quantum dot, quantum dots may be prepared by vapor deposition such as metal organic chemical vapor deposition or molecular beam epitaxy, or by a wet chemical process in which a crystal is grown by adding one or more precursors into an organic solvent.

In a more preferred embodiment of the invention, the inventive color converter does not comprise quantum dots. Likewise, in a more preferred embodiment of the invention, the inventive color converter does not comprise any inorganic fluorescent material.

In one embodiment of the invention, inventive color converters have a laminate structure. They may either have a monolayer structure or a multilayer structure, generally composed of a plurality of polymer layers comprising one or more fluorescent dyes and/or light scattering bodies. If the color converter has a multilayer structure, one layer comprises the fluorescent dye according to the invention and another layer comprises at least one fluorescent material encompassed by the present invention.

In one embodiment, the at least one fluorescent dye selected from a compound of formulae (I.a), (I.b), (I.c) or mixtures thereof is present in the layer of the color converter facing the LED. In another embodiment, the at least one fluorescent dye selected from a compound of formulae (I.a), (I.b), (I.c) or mixtures thereof is present in the layer of the color converter not facing the LED.

If the inventive color converters comprise at least one organic fluorescent dye B, it is possible in one embodiment of the invention for a plurality of fluorescent dyes to be present alongside one another in one layer. In another embodiment, the various fluorescent dyes are present in various layers.

In a specific embodiment, at least one of the layers or matrices comprising organic fluorescent dyes comprises light scattering agents for light.

In a special embodiment, the color converter has a multi-layer structure, preferably a two-layer structure, wherein each layer comprises at least one organic fluorescent dye. In this embodiment, one of the layers or more than one but not all of the layers or all of the layers comprise a light scattering agent, preferably $TiO_2$.

In one embodiment, the color converters consist of a plurality of polymer layers which have been laminated together to form a composite and wherein the various fluorescent dyes and/or scattering agents may be present in different polymer layers.

In a further embodiment, at least one polymer layer of the color converter has been mechanically reinforced with glass fibers.

Suitable color converters may be in any desired geometric arrangement. The color converters may, for example, be in the form of films, sheets or plaques. Equally, the matrix containing organic fluorescent dyes may be in droplet form or hemispherical form or in the form of lenses with convex and/or concave, flat or spherical surfaces.

For use in general lighting applications, the thickness of the color converter according to the present invention is 2 micrometer (µm) to 5 millimetres such as 0.2 to 5 millimeters thick, or 0.3 to 3 mm or 0.4 to 1 mm.

For use in a display application, the color converter usually has a thickness of 1 µm to 1000 µm.

If the color converter consists of one layer or they have a laminate structure, the individual layer(s), in a preferred embodiment, is continuous and does not have any holes or interruptions.

Inventive color converters may optionally comprise further constituents, such as a backing layer.

Backing layers serve to impart mechanical stability to the color converter. The type of material for the backing layers is not crucial, provided that it is transparent and has the desired mechanical strength. Suitable materials for backing layers are, for example, glass or transparent rigid organic polymers, such as polycarbonate, polystyrene or polymethacrylates or polymethyl methacrylates or polyethylene terephthalate.

Backing layers generally have a thickness of 0.1 mm to 10 mm, preferably 0.2 mm to 5 mm, more preferably 0.3 mm to 2 mm.

In one embodiment of the invention, inventive color converters have at least one barrier layer against oxygen and/or water, as disclosed in WO 2012/152812. The barrier layer may be provided on both sides of the color conversion layer or the color conversion layer is surrounded on all sides by at least one barrier layer. Examples of suitable barrier materials for barrier layers are, for example, glass, quartz, metal oxides, $SiO_2$, a multilayer system composed of alternating layers of $Al_2O_3$ and $SiO_2$ layers, titanium nitride, $SiO_2$/metal oxide multilayer materials, polyvinyl alcohol, polyacrylonitrile, polyvinylidene chloride (PVDC), liquid crystal polymers (LCP), polystyrene-acrylonitrile (SAN), polybutylene terephthalate (PBT), polybutylene naphthalate (PBN), polyethylene terephthalate (PET), polyethylene naphthalate (PEN), polyvinyl chloride (PVC), polyamides, polyoxymethylenes, polyimides, polyetherimides, epoxy resins, polymers which derive from ethylene-vinyl acetate (EVA) and polymers which derive from ethylene-vinyl alcohol (EVOH).

A preferred material for barrier layers is glass or a multilayer system composed of alternating layers of $Al_2O_3$ and $SiO_2$ layers. Preferably, suitable barrier layers have low permeability for oxygen. More preferably, suitable barrier layers have low permeability for oxygen and water. In general, barrier layers have a thickness of 0.01 µm to 5 mm, preferably 0.1 µm to 1000 µm and more preferably 1 µm to 100 µm. Barrier layers of glass preferably have a thickness of 0.01 to 5000 µm and more preferably of 0.1 to 1000 µm.

In another embodiment of the present invention, the color converter does not comprise a barrier layer having a low permeability to oxygen.

Inventive color converters can be produced by different processes. In one embodiment, the process for producing inventive color converters comprises the dissolution of the at least one polymer and of the at least one organic fluorescent dye in a solvent and, if desired, addition of a scattering agent and, if desired, further additives as defined above, coating of the obtained mixture, e.g. by doctor blading technique and subsequent removal of the solvent. In another embodiment, the process for production of inventive color converters comprises the extrusion of the at least one organic fluorescent dye with the at least one polymer and, if desired, scattering agent and, if desired, further additives as defined above. In particular, the color converter is formed by extrusion, printing, coating or molding.

The color converter may be a free-standing film but may also be applied on a substrate layer. In the context of the present invention, a free-standing film is a film a part of which is not in contact with a support material such as a substrate. Support layers serve to impart mechanical stability to the color converter. The type of material of the support layer is not crucial, provided that it is transparent and has the desired mechanical strength. Representative substrate layers are glass, ceramic or a film of plastic such as cellulose acetate, polyethylene terephthalate, polyolefin such as polyethylene and polypropylene, polymethacrylate, polymethyl methacrylate, aliphatic polyester, polyamide, aramid, polyimide, polyphenylene sulfide, polystyrene, polycarbonate and silicone. The substrate layer generally has a thickness of 5 µm to 3000 µm.

Inventive color converters are especially suitable for the conversion of blue light to white light. More especially, they are suitable for conversion of light generated by a blue LED with a center wavelength of emission between 400 nm and 480 nm to provide white light. Suitable blue LEDs are, for example, those based on gallium nitride (GaN) or indium gallium nitride (InGaN). They are commercially available. Suitable blue LEDs are also mini-LEDs and micro-LEDs emitting blue light.

Inventive color converters are also especially suitable for conversion of light generated by a cool white LED having a correlated color temperature between 3 000 K and 20 000 K to provide white light having a lower correlated color temperature. With regard to suitable white LEDs, reference is made to what is said herein above. White LEDs with a CCT between 3 000 K to 20 000 K are also commercially available.

In particular, the color converter according to the invention allows to provide white light at a CCT below 5 000 K, especially equal to or less than 4 500 K or equal to or less than 4 000 K or equal to or less than 3 500 K, with high luminous efficacy, e.g. a luminous efficacy of greater than 230 lumens per watt. Moreover, the color converter according to the invention allows to provide white light below 5 000 K, especially equal to or less than 4 500 K, more especially equal to or less than 4 000 K or equal to or less than 3 500 K with a high average color rendering index CRI Ra of equal to or greater than 90.

Likewise possible is their use for conversion of light produced by mercury lamps or by organic light-emitting diodes (OLEDs).

A further aspect of the present invention relates to a lighting device (illumination device) comprising
 (i) at least one light source; and
 (ii) at least one color converter as defined herein above. wherein the at least one color converter is in a remote arrangement from the at least one light source.

Preferably, the at least one light source is an LED selected from the group consisting of a blue LED with a center wavelength of emission from 400 nm to 480 nm and a white LED having a correlated color temperature between 3 000 K and 20 000 K In a preferred embodiment, inventive lighting devices comprise several LEDs. In one embodiment, inventive lighting devices comprise several LEDs, all of which are blue. In another embodiment, inventive lighting devices comprise several LEDs, at least one LED being blue and at least one LED not being blue, but rather emitting light in another color.

In general, the type of LED used is not crucial for the inventive lighting devices. In a preferred embodiment, the power density of the blue LED light impinging the surface of the converter plate is usually less than 200 mW/cm$^2$, preferably less than 120 mW/cm$^2$, more preferably less than 80 mW/cm$^2$. The use of LEDs of higher power densities, such as 150 or 200 mW/cm$^2$, is likewise possible.

The color converter may, for example, be arranged concentrically around the LED or have a planar geometry. It may take the form, for example, of a plaque, sheet or film, be in droplet form or take the form of a casting.

Inventive color converters for use in lighting devices are used in a remote phosphor setup. In this case, the color converter is spatially separated from the LED. In general, the distance between LED and color converter is usually larger than 0.1 mm, such as 0.2 mm or more, and in some embodiments equal to or larger than 0.1 to 10 cm such as 0.3 to 5 cm or 0.5 to 3 cm. Between color converter and LED may be different media such as air, noble gases, nitrogen or other gases or mixtures thereof. Inventive lighting devices are suitable for lighting in interiors, outdoors, of offices, of vehicles, in torches, games consoles, streetlights, traffic signs.

Inventive lighting devices exhibit excellent optical performances with a high luminous efficacy. They exhibit warm-tone white light at a CCT below 4000 K, especially below 3500 K, with high average color rendering index of greater 90, preferably at least 92 and especially at least 95; a high R9 value of greater than 60, preferably at least 70 and especially at least 75; together with a high luminous efficacy greater 230 lumen/watt.

The inventive color converters are additionally suitable for applications as a light-collecting system (fluorescence collector) in photovoltaics and in fluorescence conversion solar cells.

Owing to their short fluorescence decay time, usually in the range from 0.1 to 9 ns, the compounds of formulae (I.a), (I.b) and (I.c) are also of particular interest for use in color converters for data transmission in light fidelity applications comprising a transmitter for transmitting data and for emitting electromagnetic radiation in the visible range.

Accordingly, the present invention also relates to a transmitter for transmitting data and for emitting electromagnetic radiation in the visible spectral range, said transmitter comprising:
 a radiation source for generating and emitting first electromagnetic radiation; and
 a modulator being adapted to modulate the first electromagnetic radiation depending on the data to be transmitted generating modulated first electromagnetic radiation,
 characterized in that the transmitter further comprises
 a color converter for converting at least a part of the modulated first electromagnetic radiation into modulated second electromagnetic radiation, said modulated second electromagnetic radiation being different from the modulated first electromagnetic radiation,
wherein the color converter comprises the organic fluorescent dye selected from a compound of formulae (I.a), (I.b), (I.c) or mixtures thereof as defined in above and a polymer matrix.

Many different radiation sources may be used by the transmitter of the present invention. However, according to a preferred embodiment of the present invention, the radiation source is a plurality of LEDs. Furthermore, a laser diode may be used as radiation source. Preferably, the radiation source of the transmitter of the present invention is selected from the group consisting of a blue LED, a RGB LED system, an organic LED such as a white organic LED or a blue organic LED and a cool white LED.

As regards the color converter used in the transmitter, reference is made to what is said herein above. In particular, for use in the transmitter, the distance between the radiation source and the color converter in the range from 0.01 to 10 cm.

Owing to their narrow-band emission in the green spectral range (wavelength range from 490 to 560 nm, especially 490 to 540 nm), compounds of formulae (I.a), (I.b) and (I.c) are of particular interest for use in display devices such as non-emissive displays and self-emissive displays. Their use significantly increases the color gamut of displays.

Thus, the present invention further relates to a backlight unit for liquid crystal displays (LCDs), comprising
 (i) at least one of light source; and
 (ii) at least one color converter as above;
wherein the at least one color converter is in a remote phosphor arrangement from the at least one light source.

The light source in a standard LCD backlight unit (BLU) usually is a plurality of LEDs. Preferably, the LEDs are blue LEDs having a center wavelength of emission in the wavelength range from 400 nm to 480 nm. Suitable blue LEDs are, for example, those based on gallium nitride (GaN) or indium gallium nitride (InGaN). Likewise preferably, the LEDs are white LEDs. Commercially white LEDs typically consists of a LED chip which emits blue light and a coating of yellow, green and/or red phosphors, especially a yellow coating with Ce:YAG. These WLEDs usually have a correlated color temperature between 6000 and 12000 K, preferably between 6500 and 11000 K. In particular, the light emitted from the white LED comprises wavelengths in the range from 400 to 700 nm.

The backlight unit can be an edge-lit backlight or a full-array backlight. The edge-lit backlight differs from the full-array backlight in the placement of the light sources. In an edge-lit configuration, the LEDs are assembled at the edge(s) of a rectangular light guide plate, and the light from LEDs undergoes total internal reflections at the inner surface of the light guide plate and finally get extracted through top surface of the light guide plate. The color converter faces the top side of the light guide plate. In full-array backlights, the color converter is arranged above an array of light sources in a remote phosphor arrangement.

According to the invention, the backlight unit comprises at least one color converter comprising the organic fluorescent dye selected from a compound of formulae (I.a), (I.b), (I.c) or mixtures thereof. The color converter may include further organic fluorescent dyes, especially at least one fluorescent dye B. The further dye(s) may also be excited by the at least one light source. The use of at least one further dye, especially a dye B, is particularly advantageous.

The backlight unit may further include a reflector disposed under a light guide, a lower diffuser disposed on the light guide, a brightness enhancement film and/or a diffuser film.

According to an embodiment of the invention, the color converter does not comprise any light scattering agent.

According to a preferred embodiment of the invention, the color converter comprises inorganic or organic light scattering agents. Suitable inorganic and organic light scattering agents are those mentioned above, especially those mentioned as being preferred. Light scattering agents used in color converters for display applications usually have a diameter in the range from 5 to 500 nm.

The color converter for use in a backlight unit usually has a thickness of 2 micrometer to 1000 micrometres, preferably 5 to 500 µm and more preferably 10 to 350 µm, e.g. 50-300 micrometers. According to the invention, the color converter is physically separated from the light source, i.e. the color converter is in a remote phosphor arrangement from the at least one light source. As regards inventive color converters for use in backlight units, the distance between LED light source and color converter may range from 0.01 to 20 mm, e.g. 0.01 to 10 mm or 0.01 to 5 mm or 0.05 to 3.5 mm.

The present invention further relates to a liquid crystal display device comprising
(i) a liquid crystal panel comprising a thin film transistor (TFT) array, a liquid crystal layer, and a color filter array comprising red, green and blue color filters;
(ii) at least one of light source; and
(iii) at least one color converter as defined above.

The light source usually is a plurality of light-emitting diodes. Suitable light sources are white light-emitting diodes or blue light emitting diodes as defined above. The distance between light source and color converter may range from 0.01 to 20 mm, e.g. 0.01 to 10 mm or 0.01 to 5 mm or 0.05 to 3.5 mm. The color converter usually has a thickness of 2 to 1000 µm, preferably 5 to 500 µm and more preferably 10 to 350 µm, e.g. 50-300 µm.

In one embodiment of the invention the color converter is arranged below the liquid crystal panel, i.e., the at least one color converter and the at least one light source are part of the backlight unit as defined above. According to this embodiment, the polymeric matrix material of the color converter is preferably polystyrene or a polystyrene based resin such as the reaction product of a copolymer of styrene, alpha-methylstyrene and acrylic acid; or the polymeric matrix material of the color converter is preferably a homo- or copolymeric acrylate and methacrylate, respectively, especially polyacrylate, polymethyl methacrylate or polymethacrylate. In particular, the polymer matrix consists of polycarbonate or consists of polyethylene terephthalate. Specially, the color converter also includes at least one further organic fluorescent dye, especially an organic fluorescent dye B as defined herein above. The color converter may also comprise light scattering agents as defined above.

In a further embodiment, the color converter is disposed in the color filter array. In this embodiment, the polymer matrix of the color converter is preferably an epoxy resin or a vinyl ester resin or a photosensitive photoresist composition as described herein above. In this embodiment, the color converter may include further organic fluorescent dyes, especially at least one fluorescent dye B. The further dye(s) may also be excited by the at least one light source. The use of at least one further dye, especially a dye of formula B, is in particular advantageous. The color converter may also comprise light scattering agents as defined above.

According to these embodiments, the light emitted by the at least one light source passes through the liquid crystal layer, and then the color filter array. When the color converter is part of the color filter array, it may be positioned between the liquid crystal layer and the red, green, and blue color filters or may be contained in the color filter.

The color filter array comprises a plurality of red, green and blue color filters, a red filter for red pixel; a green filter for green pixel and a blue filter for blue pixel. Each of the three color filters is independently operated, and the color of a single pixel is represented by one of the three colors or by a combination of at least two of the three colors. The color filter array usually comprises a light blocking member for defining a matrix of pixel areas. The light blocking member is also referred to as black matrix. The black matrix blocks light that is extraneous to the display that would otherwise emerge on the viewing side of substrate, and thereby reduce the overall contrast.

Color filter arrays can be fabricated by patterning a photosensitive photoresist composition described herein above or by printing techniques. In the patterning method, the patterning is effected by exposing the photosensitive resist composition comprising colorants for the color filters, the at least one organic fluorescent dye selected from a compound of formulae (I.a), (I.b), (I.c) or mixtures thereof, further organic fluorescent dyes different from compound of formula I, if present, to light and developing, and the patterning is repeated in sequence in the required times. The skilled person will appreciate that the compound of formulae (I.a), (I.b), (I.c) and organic fluorescent dye(s) different from compound of formulae (I.a), (I.b), (I.c), if present, are present in different resist compositions.

The organic fluorescent dye(s) different from compound of formulae (I.a), (I.b), (I.c), if present, is preferably selected from the organic fluorescent dye B or mixtures thereof mentioned above. The further dye(s) may also be excited by the at least one light source.

The liquid crystal display panel comprises a color filter array, a thin-film transistor (TFT) array opposite to the color filter substrate and a liquid crystal layer.

No matter, whether the liquid crystal display is configured with full array or edge-lit LED light source, the light passes through the liquid crystal layer and the color filter array sequentially.

The liquid crystal layer comprises a plurality of liquid crystal molecules. The liquid crystal display device further comprises a pair of polarizers.

The liquid crystal display panel can be a transmissive display panel, a reflective display panel or a transflective display panel.

The liquid crystal display device described above is either a passive matrix one or an active matrix one. The active matrix liquid crystal display comprises an active drive element such as thin film transistor (TFT) or diode in each pixel element.

The active matrix LCD device can be operated according to the twisted-nematic (TN), in plane switching (IPS), vertical alignment (VA) or multi-domain vertical alignment (MVA) technology.

Due to the inventive color converter, less light needs to be filtered out compared to LED backlights of prior art. The color converter used according to the invention provides narrow peaks in the green spectral range which allows to provide a LCD with a larger color gamut with more natural, vivid colors than known from prior art.

The liquid crystal display device can be in use as computer monitors, televisions, tablet computers, notebook computers, projectors, smartphones, electronic picture frames, a GPS display, electronic signs, industrial equipment displays, medical device displays, and many other visual display.

A further aspect of the present invention relates to a self-emissive display device comprising
(i) at least one light source selected from a white organic light emitting diode, a blue organic light emitting diode, a mini-LED, or a micro-LED;
(ii) at least one color converter as defined above; and
(iii) optional a color filter array comprising red, green and blue color filters.

According to an embodiment of the invention, the light source is a plurality of organic light emitting diodes (OLEDs). An OLED generally includes at least three layers: a cathode layer, a light-emitting layer disposed on the cathode layer, and an anode layer disposed on the light-emitting layer. OLEDs may further comprise functional layers such as an electron transport layer (ETL), a hole transport layer (HTL), an electron barrier layer (EBL) and a hole barrier layer (HBL). According to a specific embodiment, the light source is a white organic light emitting diode. The use of white OLEDs in combination with a color converter according to the invention provides a simpler manufacturing process than an OLED having separately patterned red, green, and blue emitters. Especially suitable are white OLEDs with a pin architecture, i.e., an OLED with a p-doped hole transport layer, an intrinsically conductive emission zone and an n-doped electron transport layer. Examples are phosphorescent white pin OLEDS and fluorescent white pin OLEDs.

White OLEDs (WOLEDs) can have a thin-film multilayer structure, where the simultaneous emission from light from two or more separate emitting layers with different emission colors results in white light. The emitting layers may have a complementary color relationship, i.e. a blue and a yellow green emitter layer, or they emit the three primary colors of light, namely blue, red and green. Likewise, green, yellow and red phosphorent layers can be incorporated in a blue fluorescent layer. The emissive layers can be horizontally or vertically stacked. For example, a yellow phosphorescent pin-OLED can be stacked on top of a blue fluorescent pin-OLED. Also suitable are WOLEDs with a single emissive layer structure, the layer consisting of a blue emitter doped with different dyes or blending two or more polymers. The WOLED can have a planar bottom-emitting, planar top-emitting, non-planar bottom-emitting, or non-planar top-emitting device structure.

The WOLEDs usually have a correlated color temperature between 3000 K to 12000 K, e.g. between 6000 to 12000 K, or 6500 to 11000 K. In particular, the white light emitted by the WOLED comprises wavelengths in the range from 400 to 700 nm to generate a desired emission spectrum.

According to another preferred embodiment, the light source is a plurality of blue organic light emitting diode, especially a blue OLED with a center wavelength of emission between 400 to 480 nm. According to another preferred embodiment, the light source is a plurality of micro LEDs or mini-LEDs emitting blue light. In an embodiment the micro LED device comprise a quantum well layer within a p-n diode. Usually, the micro LED emits light with a center wavelength of 400 to 480 nm.

The polymeric matrix material of the color converter is preferably an epoxy resin or a vinyl ester resin or a photosensitive photoresist composition as described herein above. The color converter may also comprise light scattering agents.

The color converter may also comprise organic fluorescent dye(s) different from the at least one organic fluorescent dye selected from the compound of formulae (I.a), (I.b), (I.c) or mixtures thereof, if present, is preferably selected from the organic fluorescent dye B or mixtures thereof mentioned above. The further dye(s) may also be excited by the at least one light source.

The color converter for use in a self-emissive display usually has a thickness of 1-20 μm.

The color converter can be a free-standing film, can be in direct contact with the OLED or can be disposed in the color filter array, if present. As used herein, "direct contact" means that there are no intervening layers or air gaps.

According to the driving method of the OLED, OLED panels can be classified into passive matrix organic light emitting diode (PMOLED) panels and active matrix organic light emitting diode (AMOLED) panels. Especially, in some embodiments of the invention, the display is an AMOLED display.

OLED displays can be made by using thermal evaporation and fine-metal masks, by photolithography or by printing techniques, especially inkjet printing techniques.

The self-emissive display device may comprises a color filter array comprising red, green and blue color filters. Optionally, the color filter array also comprises white pixels. The display device may further comprises a black matrix disposed at a boundary between the color filter layers.

Color filter arrays, if present, can be fabricated by patterning a photosensitive photoresist composition described herein above or by printing techniques. In the patterning method, the patterning is effected by exposing the photosensitive resist composition comprising colorants for the color filters, the at least one organic fluorescent dye selected from the compound of formulae (I.a), (I.b), (I.c) or mixtures thereof, further organic fluorescent dyes different from this at least one organic fluorescent dye, if present, to light and developing, and the patterning is repeated in sequence in the required times. The skilled person will appreciate that the at least one organic fluorescent dye selected from the compound of formulae (I.a), (I.b), (I.c) or mixtures thereof and organic fluorescent dye(s) different from said at least one organic fluorescent dye, if present, are present in different resist compositions.

Additionally, in some embodiments, the display may be provided in conjunction with a touch-sensitive element.

The display comprising as light source at least one white OLED, blue OLED or blue micro-LED can be formed on a glass, plastic or silicon substrate.

The OLED display has a faster response, lighter weight, lesser viewing angle restrictions and greater contrast compared with a liquid crystal display. It is especially suitable as display of an electronic paper, an OLED panel, a smart phone, a notebook computer, a tablet, a television set, a digital picture frame or a GPS device.

Micro LED displays are especially suitable for wearable devices such as smart watches and augmented reality glasses and smart phones. They are also especially suitable for heads-up displays, large screens televisions or smart phones.

The self-emissive device can be patterned using any patterning techniques, such as shadow masking and photolithography/resist processes. The self-emissive device can also be patterned using printing techniques, especially inkjet printing.

In a further aspect, the present invention relates to a device selected from a stationary visual display device; mobile visual display device comprising the color converter as defined above. Stationary visual display units are, for example, visual display units of computers, televisions, visual display units in printers, kitchen appliances and advertising panels, illuminations and information panels. Mobile visual display units are, for example, visual display units in smart phones, laptops, tablet PCs, digital cameras, mp-3 players, vehicles, and destination displays on buses and trains.

In a further aspect the present invention relates to a television device comprising the display device as defined above.

Photolithographic techniques involve a large number of production steps, and are much more complex than printing methods. In addition, photolithographic techniques are typically much more expensive than printing techniques.

Accordingly, it is an object of the present invention to provide an ink formulation suitable for printing films containing at least one organic fluorescent dye selected from a compound of formulae (I.a), (I.b), (I.c) or mixtures thereof.

Thus, a further aspect of the present invention relates to an ink formulation comprising
(i) at least one organic fluorescent dye selected from a compound of formulae (I.a), (I.b), (I.c) or mixtures thereof as defined above;
(ii) at least one photo-curable or thermally curable binder;
(iii) optionally at least one component selected from a photoinitiator, a photoacid-generator, a reactive monomer, a thermal radical initiator or mixtures thereof; and
(iv) optionally at least one additive selected from an organic fluorescent colorant different from a compound of formulae (I.a), (I.b) and (I.c), an organic solvent, a dispersant, a surfactant, a light scattering agent, or a mixture thereof.

The ink formulation may be used for printing the at least one organic fluorescent dye selected from a compound of formulae (I.a), (I.b), (I.c) or mixtures thereof containing layer of a display device.

According to the invention, the binder includes at least one polymer component. The polymer component usually includes a polyether (meth)acrylates, polyester (meth)acrylates, epoxy (meth)acrylates, urethane (meth)acrylates.

The ink formulation according to the invention may include a reactive monomer that contains one, two, three, four, five, six or more than six olefinic double bonds.

Examples of reactive monomers having one olefinic double bond include mono(meth)acrylates. Mono(meth)acrylates include (meth)acrylic acid alkyl ester whose alkyl radical has 1 to 20 carbon atoms such as methyl (meth)acrylate and ethyl (meth)acrylate or; cyclic trimethylolpropane formal (meth)acrylate; alkoxylated tetrahydrofurfuryl (meth)acrylate; phenoxyalkyl (meth)acrylates, such as 2-phenoxyethyl (meth)acrylate and phenoxymethyl (meth)acrylate; 2-(2-ethoxyethoxy) ethyl (meth)acrylate, isobornyl (meth)acrylate.

Examples of reactive monomers having two olefinic double bonds include di(meth)acrylates. Suitable di(meth)acrylates in question may also be those which are ethoxylated, propoxylated, or mixtures of ethoxylated and propoxylated. Examples of di(meth)acrylates include ethylene glycol di(meth)acrylate, diethylene glycol di(meth)acrylate, polyethylene glycol di(meth)acrylate having a number average molecular weight in the range from about 200 to about 500 g/mol, propylene glycol di(meth)acrylate, dipropylene glycol di(meth)acrylate, tripropylene glycol di(meth)acrylate, polypropyleneglycol di(meth)acrylate having a number average molecular weight in the range from about 200 to about 500 g/mol, 1,3-butanediol di(meth)acrylate, neopentyl glycol di(meth)acrylate, neopentyl glycol ethoxylate di(meth)acrylate, neopentyl glycol propoxylate(2) di(meth)acrylate, dipentaerythritol di(meth)acrylate, 1,6-hexanediol di(meth)acrylate, 1,12-dodecanediol di(meth)acrylate, bisphenol-A di(meth)acrylate, bisphenol-A ethoxylate di(meth)acrylate.

Examples of reactive monomers having three, four, five or six or more olefinic double bonds include tri(meth)acrylate, tetra(meth)acrylate, penta(meth)acrylate and higher functionality (meth)acrylate. Suitable reactive monomers include trimethylolpropane tri(meth)acrylate, dipentaerythritol triacrylate, pentaerythritol triacrylate, pentaerythritol tetraacrylate, dipentaerythritol tetraacrylate, dipentaerythritol pentaacrylate, dipentaerythritol hexaacrylate, or acrylic acid esters of alkoxylated alcohols, e.g. glycerol ethoxylate triacrylate, glycerol propoxylate triacrylate, propoxylated glycerol triacrylate.

The ink formulation may comprise at least one (customary) photoinitiator to initiate the polymerization process. The printing ink formulation may comprise a (customary) photoacid-generator. The printing ink formulation may comprise a (customary) thermal radical initiator.

The ink formulation may comprise at least one further additive selected from an organic fluorescent colorant different from a compound of formulae (I.a), (I.b), (I.c), an organic solvent, a dispersant, a surfactant, a light scattering agent, or mixtures thereof. These additives may be included in the printing ink formulation in any effective amount, as desired. Suitable solvents to adjust the viscosity and/or surface tension of the ink formulation are in particular organic solvents such as esters, ethers, diols, glycols and aromatic hydrocarbons. A wide variety of organic and inorganic dyes and pigments that are different from a compound of formulae (I.a), (I.b), (I.c) and mixtures thereof, can be used alone or in combination. The organic fluorescent colorant different from a compound of formula (I.a), (I.b) or (I.c) is especially selected from the fluorescent dye B or mixtures thereof as defined above. The printing ink formulation may include a light scattering agent dispersed in the polymer component. As to the light scattering agent, reference is made to what is said above.

The polymerization of the printing ink formulation can be triggered by heat, electron beam radiation, UV radiation or LED radiation. Curing by electron beams, UV exposure, radiation form a LED or heat may take place under an oxygen-containing atmosphere or, specifically, under inert gas. Depending on the ink formulation to be cured, curing can be carried out solely by radiation, however, thermal curing before, during or after the radiation may be advantageous.

In some embodiments, the binder is the main component in the ink formulation.

The ink formulation may comprise
(i) from 0.1 to 40% by weight of at least one organic fluorescent dye selected from a compound of formulae (I.a), (I.b), (I.c) or mixtures thereof as defined above;
(ii) from 30 to 90% by weight of at least one photo-curable or thermally curable binder system;
(iii) from 0 to 60% by weight of at least one component selected from a photoinitiator and/or photoacid-generator, a reactive monomer, a thermal radical initiator or mixtures thereof; and
(iv) from 0 to 40% by weight of optionally at least one further additive selected from an organic fluorescent colorant different from a compound of formulae (I.a), (I.b), (I.c), an organic solvent, a dispersant, a surfactant, a light scattering agent, or mixtures thereof.

The printing ink formulation may be prepared in a customary manner by mixing the individual components.

The printing ink formulation according to the invention is especially suitable for screen printing or inkjet printing.

The printing ink formulation is preferably used in the manufacture of a liquid crystal display device or a self-emissive device.

The invention is illustrated in detail by the examples described hereinafter. At the same time, the examples should not be regarded as a restriction of the invention. In particular, the fluorescent compounds of formula I and the curable organopolysiloxane composition of the invention will be further described in more detail with reference to practical examples. The preparation of the compounds according to the invention is illustrated by examples; however, the subject matter of the present invention is not limited to the examples given.

EXAMPLES

I. Preparation

Example 1: Preparation

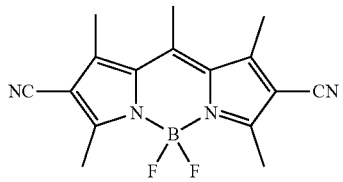

Route a)

1.1 Preparation of

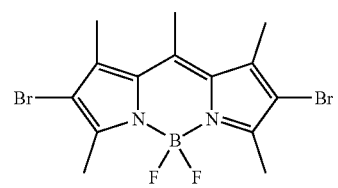

A mixture of 100 mL of chlorobenzene, 5.0 g (19.1 mmol) of 4,4-difluoro-1,3,5,7-pentamethyl-4-bora-3a,4a-diaza-s-indacene (CAS 121207-31-6, available from TCI) and 16.5 g (5.5 mL) of bromine were stirred for three hours at room temperature. After that bromine was blown off and the product was precipitated by addition of 100 mL of methanol, filtered, washed with methanol and dried, 4.2 g (53%) of a red solid were obtained with a purity of 95% (HPLC).

Rf(toluene)=0.82.

1.2 Preparation of

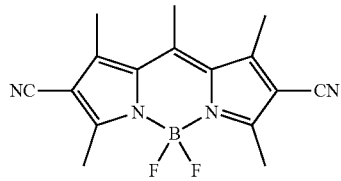

A mixture of 40 mL of N-methylpyrrolidon (NMP, 1.0 g (2.4 mmol) of the dibromo-compound from example 1.1), 0.84 g (7.1 mmol) of zinc cyanide, 0.88 g of (1.0 mmol) tris-(dibenzylidenacetone)-dipalladium and 1.68 mL (2.0 mmol) of a 1.0 M tri-tert.-butylphosphine solution in toluene was heated to 100° C. for 2.5 hours. The mixture was cooled to room temperature, filtered and washed with NMP until the filtrate was almost colorless. The filtrate was diluted with water and extracted with methyl-tert.-butylether, the combined organic phases were concentrated under vacuum and the residue purified by column chromatography on silica using toluene/ethylacetate 20:1 two times. 2.0 mg of the title compound were obtained.

Rf (toluene:ethylacetate=20:1)=0.57

Route b)

1.3 Preparation of 2-oxopropanal oxime

A mixture of 80 mL of tetrahydrofuran (THF), 6.15 mL (2.88 g, 0.04 mol) of a 40% solution of methylglyoxal in water and 2.78 g (0.04 mol) of hydroxylamine hydrochloride was stirred at room temperature for 24 hours. The mixture was used without further isolation and purification in the next step.

Rf (cyclohexane:acetone 1:1)=0.7

1.4 Preparation of 1-aminopropan-2-one

To the solution from example 1.3 were added 70 mL of water and 23.8 g (0.2 mol) of metallic tin. To this suspension were added 19.0 g of concentrated hydrochloric acid within 3 hours. The reaction mixture was kept below 42° C. The residual tin was filtered off. To the filtrate were added about 50 mL of 20% NaOH, until it was slightly basic (pH=9). A salt precipitated which was filtered off. The obtained mixture was taken in the next step without further isolation and purification.

1.5 Preparation of 2,4-dimethyl-1H-pyrrole-3-carbonitrile

To the obtained mixture from example 1.4 were added 3.5 g (0.04 mol) of 3-oxobutanenitrile. The mixture was stirred at 45-50° C. overnight at pH=9. The reaction was cooled to room temperature, extracted three times with 200 mL of dichloromethane and the solvent was evaporated under reduced pressure. The residue was subjected to column chromatography using toluene/ethylacetate 10:1. 0.32 g (26% all steps) of a white solid were obtained.

Rf (toluene:ethyl acetate=10:1)=0.39

1.6 Preparation of

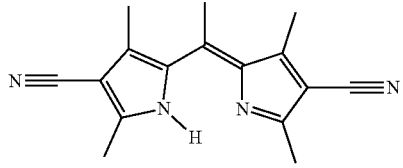 [SMILES: CC1=N/C(=C(/C)c2[nH]c(C)c(C#N)c2C)C(C)=C1C#N]

0.22 g (1.8 mmol) of the compound from example 1.5 was dissolved in 3 mL of dichloroethane. 0.52 g (6.6 mmol) of acetyl chloride were added and the reaction mixture heated to reflux (78° C.) for three hours. Another 1.0 g (13.2 mmol) of acetyl chloride were added and the mixture was refluxed for an additional hour. The reaction mixture was cooled to room temperature and 30 mL of petroleum ether were added. The suspension was stirred for one hour and filtered. The obtained black residue (220 mg) was used in the next step without further purification.

1.7 Preparation of

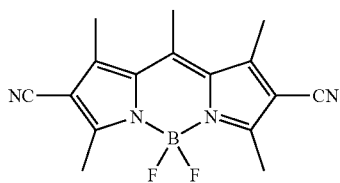

Under nitrogen a mixture of 220 mg (0.8 mmol) of the dark solid from example 1.6 were suspended in 400 mL of toluene and 0.71 g (7 mmol) of triethylamine were added. To this mixture were added 1.38 g (9.7 mmol) of boron trifluoride etherate and the mixture stirred for one hour at 80° C. The reaction mixture was cooled to room temperature, the solution was extracted with water twice and subjected to column chromatography using dichloromethane as eluent. 17 mg (6.6%) of a red solid with green fluorescence in solution was obtained.
Rf (dichloromethane)=0.6

Example 2

Preparation of 4,5-dimethyl-1-triisopropylsilyl-pyrrole-3-carbonitrile

2.1 Preparation of 2,3-dimethyl-1H-pyrrole 10 g (0.114 mol) of 2-butanon oxime were dissolved in 170 mL of dimethylsulfoxide. 34.50 g (0.455 mol) of 85% powdered KOH were added. The mixture was heated to 110° C. To this mixture were added a solution of 18.75 g (0.19 mol) of dichloroethane dissolved in 20 mL of dimethylsulfoxide within 30 minutes between 110 and 120° C. The reaction mixture was afterwards cooled to 105° C. and stirred at this temperature for one hour and then cooled to room temperature. The mixture was added into ice water, $NH_4Cl$ solution was added and the mixture was extracted with methyl tert-butyl ether. The combined organics were dried with $MgSO_4$ and the solvent was evaporated under reduced pressure. The residue was subjected to column chromatography. 2.90 g (26%) of an oil was isolated. Rf (cyclohexane:dichloromethane 1:2)=0.69

2.2 Preparation of (2,3-dimethylpyrrol-1-yl)-triisopropyl-silane 1.21 g of NaH (30 mmol) were dissolved in 40 mL of dimethylformamide (DMF) and cooled to 0° C. A solution of 2.9 g of the compound from example 2.1 dissolved in 10 mL of DMF was added dropwise within 20 minutes. 20 mL of DMF were added and the reaction mixture stirred for one hour at room temperature. Afterwards the mixture was cooled to 0° C. Within 30 minutes a solution of 5.29 g (27 mmol) of triisopropylsilylchloride were added upon cooling to 0-4° C. The mixture was stirred for 90 minutes. 2 mL of isopropanol were added to the reaction mixture in order to destroy remaining NaH. The mixture was poured into water and extracted with methyl tert-butyl ether. The combined organic phases were dried with $MgSO_4$ and the solvent evaporated under reduced pressure. The residue was subjected to column chromatography using cyclohexane dichloromethane as eluent. 4.34 g (63%) of a colorless oil were obtained. Rf (cyclohexane:dichloromethane 1:2)=0.96

2.3 Preparation of (4-bromo-2,3-dimethyl-pyrrol-1-yl)-triisopropyl-silane 2.6 g (9.88 mmol) of the compound from example 2.2 was dissolved in 25 mL of THF and cooled to −78° C. 1.75 g of N-bromosuccinimide were added in 5 portions within one hour. The mixture was stirred at this temperature for one hour. 25 mL of pentane were added and the reaction mixture filtered over neutral $Al_2O_3$. 3.26 g (95%) of dark oil were isolated. Rf (cyclohexane)=0.48

2.4 Preparation of 4,5-dimethyl-1-triisopropylsilyl-pyrrole-3-carbonitrile

Under argon, to a mixture of 4.10 g (12.4 mmol) of the compound from example 2.3, 2.19 g (18.6 mmol) of Zn(CN)$_2$, 568 mg (0.62 mmol) of trisdibenzylideneacetonedipalladium and 40 mL of dioxane were added 2.4 mL (2.4 mmol) of 1M solution of tri-tert-butylphosphine in toluene. The mixture was heated to reflux (98° C.) for five hours. The same amount of Zn(CN)$_2$, trisdibenzylideneacetonedipalladium and tri-tert-butylphosphine was added and the mixture further refluxed for 22 hours. Another 1.1 g of Zn(CN)$_2$, 284 mg of trisdibenzylideneacetonedipalladium and 1.2 mL of tri-tert-butylphosphine were added and the mixture was refluxed for additional five hours. The reaction mixture was cooled to room temperature and poured into 80 mL of water. 10 mL of brine were added and the product was repeatedly extracted with ethyl acetate. The combined organic phases were dried with $MgSO_4$ and the solvents were evaporated under reduced pressure. The residue was subjected to column chromatography using dichloromethane and cyclohexane as eluent. 1.92 g (56%) of an oil were isolated. Rf (dicholormethane:cyclohexane 2:1)=0.53

2.5 Preparation of 4,5-dimethyl-1H-pyrrole-3-carbonitrile 1.94 g (6.9 mmol) of the compound from example 2.4 was dissolved in 20 mL of THF. A solution of 6.9 mL (6.9 mmol) of 1M solution of tetrabutylammonium fluoride in THF was added at room temperature. The mixture was stirred for 15 minutes at room temperature. Afterwards 20 mL of methyl tert-butyl ether were added and the solution was washed twice with 30 mL of water and 10 mL of brine. The organic phase was dried with $MgSO_4$ and the solvents were evaporated under reduced pressure. The residue was suspended in 10 mL of pentane, filtered and washed three times with 1 mL of pentane. 0.69 g (83%) of a colorless oil were isolated. Rf (dicholormethane:cyclohexane 2:1)=0.18

II. Photostability

Production of the Color Converters for Testing of the Dyes:

The fluorescent dye of example 1 was used to produce a color converter. For this purpose, the compound was incorporated as described hereinafter into a matrix composed of polycarbonate (PC, Macrolon® 2808 from Bayer).

About 2.5 g of polymer and 0.05% by weight of the dye were dissolved in about 5 mL of methylene chloride, and 0.2% by weight of $TiO_2$ (Kronos 2233) was dispersed therein. The solution/dispersion obtained was coated onto a glass surface using a doctor blade with a wet film thickness of 400 μm. After the solvent had dried off, the film was detached from the glass and dried in a vacuum drying cabinet at 50° C. overnight. Two circular film pieces having a diameter of 15 mm were punched out of each film of thickness 67 μm, and these served as analysis samples.

Fluorescence quantum yields (FQY) of the analysis samples were measured with the C9920-02 quantum yield measuring system (from Hamamatsu). This was done by illuminating each of the samples with light of 445 to 455 nm in an integration sphere (Ulbricht sphere). By comparison with the reference measurement in the Ulbricht sphere without sample, the unabsorbed fraction of the excitation light and the fluorescent light emitted by the sample are determined by means of a CCD spectrometer. Integration of the intensities over the spectrum of the unabsorbed excitation light or over that of the emitted fluorescent light gives the degree of absorption or fluorescence intensity or fluorescence quantum yield of each sample.

Results of Fluorescent Quantum Yield Measurements:

Compound of Example 1

PC-film: Emission λmax: 532 nm; emission, FWHM: 43 nm;
FQY: 89%.

The T80 value of the compound of example 1 and of comparative compound C1 (which is commercially available from Sigma-Aldrich)

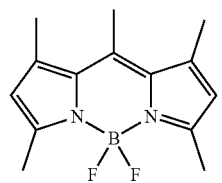

(C1)

in a PC-film were determined. T80 is the decay of fluorescence (product abs*QY) to 80% of its initial value, while illuminating with 110 mW/cm² of blue light (450 nm). To this end, PC-polymer-films doped with $TiO_2$ and fluorescent dye were prepared as described above. The results are summarized in table II.

TABLE II

| Lifetime (days) upon irradiation (T80) | |
|---|---|
| Compound | T80 (PC-film) |
| Compound of example 1 (PC film: 0.05% by weight of compound of example 1; 0.2% by weight of $TiO_2$, thickness of the film: 65 μm) | 33 days |
| C1 PC film: 0.05% by weight of compound of C1; 0.2% by weight of $TiO_2$, thickness of the film: 65 μm | <1 day |

As can be seen from table II, the compound of example 1 used according to the present invention has a substantial longer lifetime under the irradiation conditions than a structurally similar non-cyanated compound C1.

The invention claimed is:

1. A color converter, comprising:
a polymeric matrix material; and
an organic fluorescent dye comprising a compound of formula, (I.b)

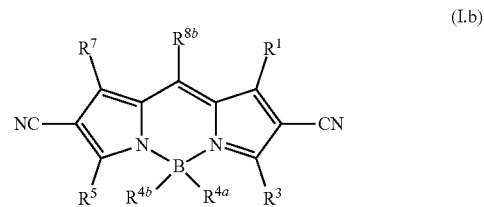

wherein
$R^1$, $R^3$, $R^5$, and $R^7$, are independently H, $C_1$-$C_{20}$-alkyl, or $C_6$-$C_{14}$-aryl-$C_1$-$C_{10}$-alkylene, the aryl moiety in $C_6$-$C_{14}$-aryl-$C_1$-$C_{10}$-alkylene being optionally substituted by k independent substituents $R^9$,
$R^{4a}$ and $R^{4b}$ are independently fluorine, chlorine, cyano, or $OR^{10}$,
$R^{8b}$ is $C_1$-$C_{20}$-alkyl,
k is 1, 2, 3, 4, 5, or 6;
$R^9$ is $C_1$-$C_{10}$-alkyl, $C_1$-$C_{10}$-alkoxy, CN, halogen, phenyl, or phenoxy, and
$R^{10}$ is $C_1$-$C_{10}$-alkyl or hydroxy-$C_1$-$C_{10}$-alkyl.

2. The converter of claim 1, wherein $R^{4a}$ and $R^{4b}$ are each fluorine.

3. The converter of claim 1, wherein $R^{8b}$ is $C_1$-$C_4$-alkyl.

4. The converter of claim 1, wherein $R^1$, $R^2$, $R^3$, $R^5$, $R^6$, and $R^7$, are independently $C_1$-$C_4$-alkyl.

5. The converter of claim 1, further comprising:
an organic fluorescent dye B comprising
(B1) an aryloxy-substituted perylene-3,4,9,10-tetracarboxylic acid diimide compound of formula (III)

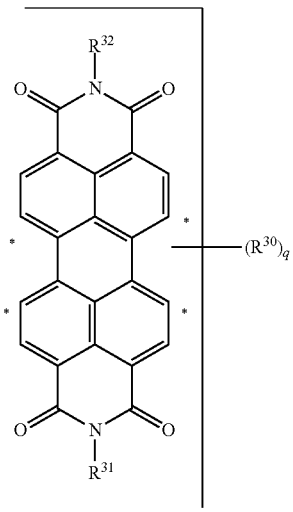

(III)

wherein
q is 1 to 4,
$R^{30}$ is aryloxy optionally substituted by halogen, $C_1$-$C_{10}$-alkyl, or $C_6$-$C_{10}$-aryl, the $R^{30}$ radicals being at one or more of the positions indicated by *,
$R^{31}$ and $R^{32}$ are independently $C_1$-$C_{30}$-alkyl, $C_3$-$C_8$-cycloalkyl, aryl, hetaryl, or aryl-$C_1$-$C_{10}$-alkylene, the (het)aromatic ring being optionally substituted by $C_1$-$C_{10}$-alkyl;
(B2) a perylene-3,4,9,10-tetracarboxylic acid diimide compound of formula (IV)

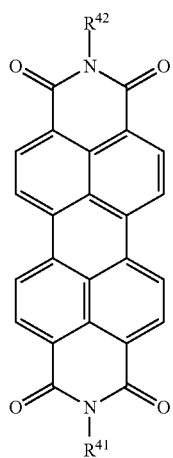

(IV)

wherein
$R^{41}$ and $R^{42}$ are independently $C_1$-$C_{30}$-alkyl, $C_3$-$C_8$-cycloalkyl, aryl, hetaryl, or aryl-$C_1$-$C_{10}$-alkylene, the (het)aromatic ring being optionally substituted by $C_1$-$C_{10}$-alkyl;
(B3) a perylene-3,4,9,10-tetracarboxylic acid diimide compound comprising rigid 2,2'-biphenoxy bridges of formula (V)

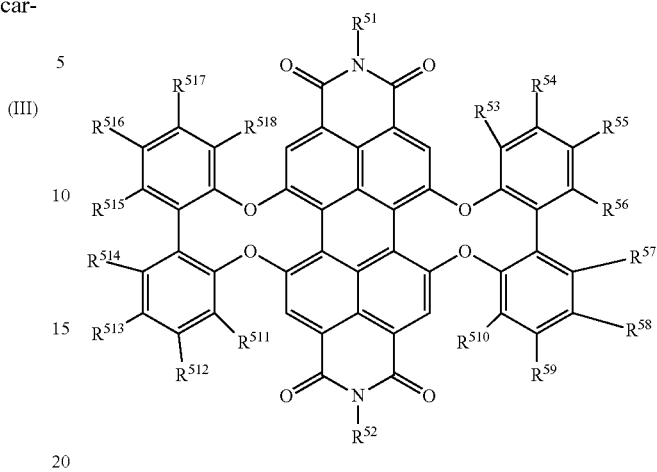

(V)

wherein
$R^{51}$ and $R^{52}$ are independently H, or optionally substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkyloxy, $C_6$-$C_{24}$-aryl, or $C_6$-$C_{24}$-aryloxy,
$R^{53}$, $R^{54}$, $R^{55}$, $R^{56}$, $R^{57}$, $R^{58}$, $R^{59}$, $R^{510}$, $R^{511}$, $R^{512}$, $R^{513}$, $R^{514}$, $R^{515}$, $R^{516}$, $R^{517}$, and $R^{518}$ are independently H, halogen, cyano, hydroxyl, mercapto, nitro, —$NE^{51}E^{52}$, —$NR^{Ar51}COR^{Ar52}$, —$CONR^{Ar51}R^{Ar52}$, —$SO_2NR^{Ar51}R^{Ar52}$, —$COOR^{Ar51}$, —$SO_3R^{Ar52}$, in each case optionally substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkoxy, $C_6$-$C_{24}$-aryl, $C_6$-$C_{24}$-aryloxy, or $C_6$-$C_{24}$-arylthio, $R^{53}$ and $R^{54}$, $R^{54}$ and $R^{55}$, $R^{55}$ and $R^{56}$, $R^{56}$ and $R^{57}$, $R^{57}$ and $R^{58}$, $R^{58}$ and $R^{59}$, $R^{59}$ and $R^{510}$, $R^{511}$ and $R^{512}$, $R^{512}$ and $R^{513}$, $R^{513}$ and $R^{514}$, $R^{514}$ and $R^{515}$, $R^{515}$ and $R^{516}$, $R^{516}$ and $R^{517}$, and/or $R^{517}$ and $R^{518}$ together with the carbon atoms of the biphenylyl moiety to which they are bonded, optionally forming a further fused, optionally substituted ring system,
$E^{51}$ and $E^{52}$ are independently H, $C_1$-$C_{18}$-alkyl, $C_2$-$C_{18}$-alkenyl, $C_2$-$C_{18}$-alkynyl, $C_3$-$C_{20}$-cycloalkyl, or $C_6$-$C_{10}$-aryl,
$R^{Ar51}$ and $R^{Ar52}$ are independently H, $C_1$-$C_{18}$-alkyl, $C_3$-$C_{20}$-cycloalkyl, heterocyclyl, $C_6$-$C_{20}$-aryl, or heteroaryl;
or mixtures of two or more of any of these.

6. The converter of claim 1, wherein the polymeric matrix material comprises polystyrene, polycarbonate, polyacrylate, polymethacrylate, polyvinylpyrrolidone, polyvinyl acetate, polyvinyl chloride, polybutene, silicone, epoxy resin, vinyl ester resin, polyvinyl alcohol, poly(ethylene vinylalcohol)-copolymer, polyacrylonitrile, polyvinylidene chloride, polystyrene acrylonitrile, polybutylene terephthalate, polyethylene terephthalate, 2,5-furandicarboxylate polyester, polyvinyl butyrate, polyamide, polyoxymethylene, polyimide, and/or polyetherimide.

7. The converter of claim 1, further comprising:
a light scattering agent.

8. The converter of claim 1, wherein the polymeric matrix material is a reaction product of a photosensitive resist composition comprising a binder, reactive monomer, photoinitiator and/or photoacid-generator.

9. The converter of claim 8, wherein the photosensitive resist composition comprises a thermal radical initiator, an organic solvent, a dispersant, a surfactant, and/or a light scattering agent.

10. A backlight unit configured for a liquid crystal display, comprising:
(i) a light source; and
(ii) the converter of claim 1,
wherein the converter is in a remote phosphor arrangement from the light source.

11. A liquid crystal display device, comprising
(i) a liquid crystal panel comprising a thin film transistor (TFT) array, a liquid crystal layer, and a color filter array comprising red, green, and blue color filters;
(ii) a light source; and
(iii) the converter of claim 1.

12. A self-emissive display device, comprising
(i) a light source comprising a white organic light emitting diode, a blue organic light emitting diode, a mini-LED, and/or a micro-LED;
(ii) the converter of claim 1; and
(iii) optionally, a color filter array comprising red, green, and blue color filters.

13. An ink formulation, comprising
(i) an organic fluorescent dye comprising a compound of formulae (I.a), (I.b), and/or (I.c)

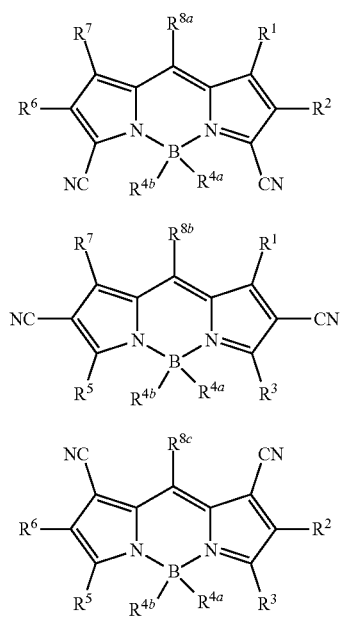

wherein
$R^1$, $R^2$, $R^3$, $R^5$, $R^6$, and $R^7$, are independently H, $C_1$-$C_{20}$-alkyl, or $C_6$-$C_{14}$-aryl-$C_1$-$C_{10}$-alkylene, the aryl moiety in $C_6$-$C_{14}$-aryl-$C_1$-$C_{10}$-alkylene being optionally substituted by k independent substituents $R^9$,
$R^{4a}$ and $R^{4b}$ are independently fluorine, chlorine, cyano, or $OR^{10}$,
$R^{8a}$ is $C_1$-$C_{20}$-alkyl,
$R^{8b}$ is $C_1$-$C_{20}$-alkyl, and
$R^{8c}$ is $C_1$-$C_{20}$-alkyl, $C_6$-$C_{10}$-aryl, or $C_6$-$C_{10}$-aryl-$C_1$-$C_{10}$-alkylene, aryl moieties being optionally substituted by k independent substituents $R^9$,
k is 1, 2, 3, 4, 5, or 6;
$R^9$ is $C_1$-$C_{10}$-alkyl, $C_1$-$C_{10}$-alkoxy, CN, halogen, phenyl, or phenoxy, and
$R^{10}$ is $C_1$-$C_{10}$-alkyl or hydroxy-$C_1$-$C_{10}$-alkyl;
(ii) a photo-curable or thermally curable binder;
(iii) optionally, a photoinitiator, a photoacid-generator, a reactive monomer, and/or a thermal radical initiator; and
(iv) optionally, a further organic fluorescent colorant different from the compound of formulae (I.a), (I.b), (I.c), an organic solvent, a dispersant, a surfactant, and/or a light scattering agent.

14. A method of making a liquid crystal display device or a self-emissive display device, the method comprising:
using the ink of claim 13.

15. A method of illumination, comprising:
irradiating the converter of claim 1 with light generated by a blue LED with a center wavelength of emission between 400 nm and 480 nm.

16. An illumination device, comprising:
a light source; and
the converter of claim 1,
wherein the converter is in a remote phosphor arrangement from the light source.

17. A television device, comprising the display device of claim 11.

18. A method of illumination comprising:
irradiating the color converter of claim 1 with light generated by a white LED having a correlated color temperature between 3 000 K and 20 000 K.

19. A method of data transmission comprising:
irradiating the color converter of claim 1 with data.

* * * * *